United States Patent [19]
Yuki et al.

[11] Patent Number: 5,739,544
[45] Date of Patent: *Apr. 14, 1998

[54] QUANTIZATION FUNCTIONAL DEVICE UTILIZING A RESONANCE TUNNELING EFFECT AND METHOD FOR PRODUCING THE SAME

[75] Inventors: Koichiro Yuki, Neyagawa; Yoshihiko Hirai, Osaka; Kiyoshi Morimoto, Neyagawa; Masaaki Niwa, Hirakata; Juro Yasui, Toyonaka; Kenji Okada, Suita; Masaharu Udagawa, Tokyo; Kiyoyuki Morita, Yawata, all of Japan

[73] Assignee: Matsushita Electric Industrial Co., Ltd., Osaka, Japan

[*] Notice: The term of this patent shall not extend beyond the expiration date of Pat. No. 5,486,706.

[21] Appl. No.: 571,112

[22] Filed: Dec. 12, 1995

Related U.S. Application Data

[60] Continuation-in-part of Ser. No. 421,530, Apr. 13, 1995, Pat. No. 5,514,614, which is a division of Ser. No. 249,541, May 26, 1994, Pat. No. 5,486,706.

[30] Foreign Application Priority Data

| May 26, 1993 | [JP] | Japan | 5-123732 |
| Oct. 7, 1993 | [JP] | Japan | 5-251565 |
| Dec. 22, 1993 | [JP] | Japan | 5-325076 |
| Mar. 24, 1994 | [JP] | Japan | 6-53972 |
| Dec. 12, 1994 | [JP] | Japan | 6-307411 |

[51] Int. Cl.$^6$ .................. H01L 29/78; H01L 29/88; H01L 29/04
[52] U.S. Cl. .................. 257/25; 257/22; 257/23; 257/24; 257/192
[58] Field of Search .................. 257/22, 23, 24, 257/25, 192

[56] References Cited

U.S. PATENT DOCUMENTS

| 3,121,177 | 2/1964 | Davis. | |
| 3,171,762 | 3/1965 | Rutz. | |
| 5,093,699 | 3/1992 | Weichold et al. | |
| 5,234,848 | 8/1993 | Seabaugh. | |
| 5,336,904 | 8/1994 | Kusunoki | 257/25 |

FOREIGN PATENT DOCUMENTS

| 0002625 | 1/1981 | Japan | 437/904 |
| 5-235378 | 9/1993 | Japan. | |

OTHER PUBLICATIONS

K. Ismail et al., "Electron Resonant Tunneling in Si/SiGe Double Barrier Diodes", *Appl. Phys. Lett.* 59(8), pp. 973–975 (Aug. 1991).

M. Hirose et al., "Resonant Tunneling Through Si/SiO$_2$ Double Barriers" *Japanese Journal of Applied Physics*, vol. 16, pp. 561–564 (1977).

J.C. Hensel, et al., "Transistor Action in Si/CoSi$_2$,Si Heterostructures", *Appl. Phys. Lett.*, vol. 47(2), pp.151–153, (Jul. 1985).

R. Esaki et al., "Super Lattice Hetero Structure Device", pp. 397–435 (Sep. 1988).

K. Saki et al., "Resonant Tunneling Through SiO$_2$/Si/SiO$_2$ Double Barriers", *Extended Abstracts (The 52nd Autumn Meeting, 1991)*;The Japan Society of Applied Physics, No. 2, pp. 653, 10a–B–3.

TBM Technical Disclosure Bulletin, vol. 34, No. 4A Sep. 1991, pp. 251–252.

*Primary Examiner*—Jerome Jackson
*Attorney, Agent, or Firm*—Ratner & Prestia

[57] ABSTRACT

By etching, a first groove and a second groove are formed in a silicon substrate. Surfaces of the side walls of these grooves have a surface orientation of (111). The first and second grooves sandwich a silicon thin plate therebetween, which is formed as a part of the silicon substrate. The silicon thin plate is sufficiently thin so as to act as a quantum well. Further, a pair of silicon oxide films acting as tunneling barriers are formed on the surfaces of the side walls of the silicon thin plate, thus forming a double barrier structure. In addition, a pair of polysilicon electrodes are formed and sandwich the double barrier structure. As a result, the structure of a resonance tunneling diode, which utilizes the resonance tunneling effect, is provided. Adding a third electrode to the above structure provides a resonance tunneling transistor.

18 Claims, 42 Drawing Sheets

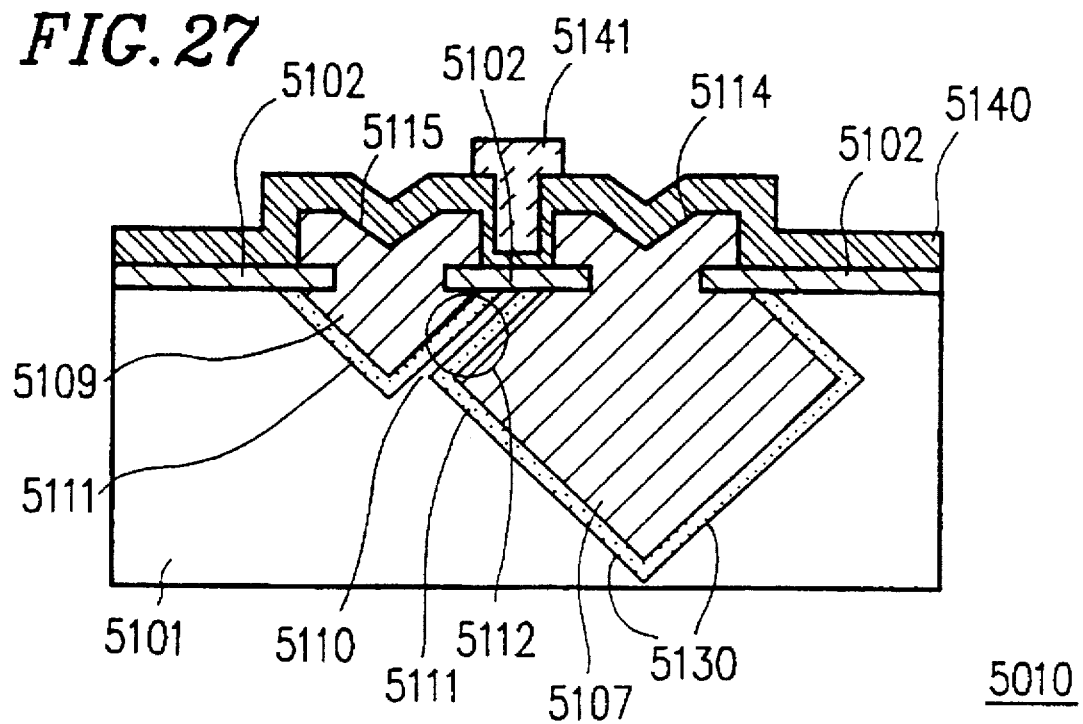

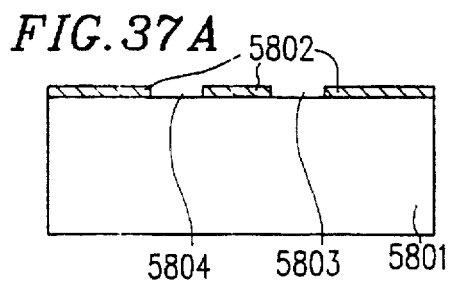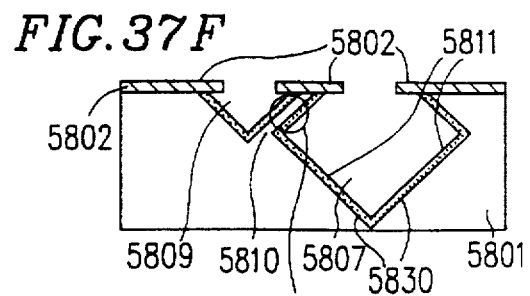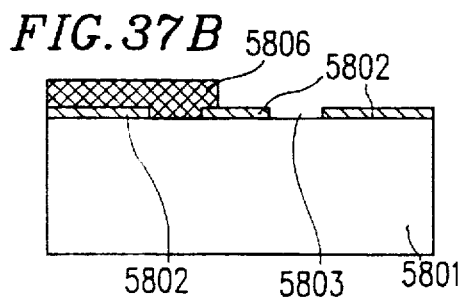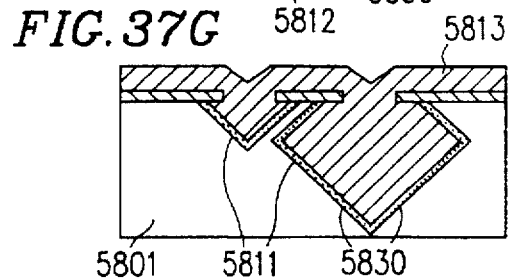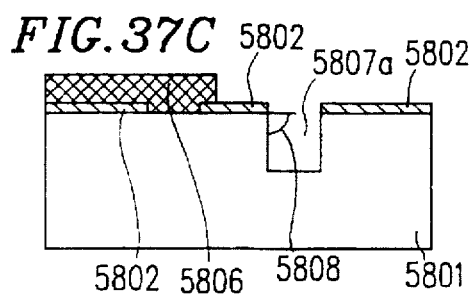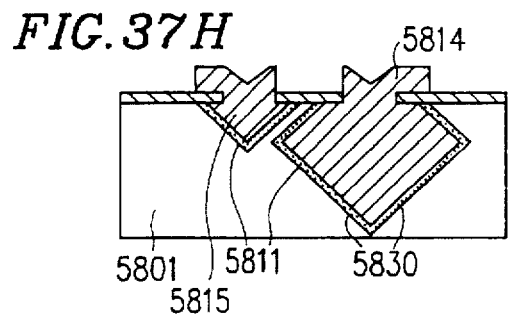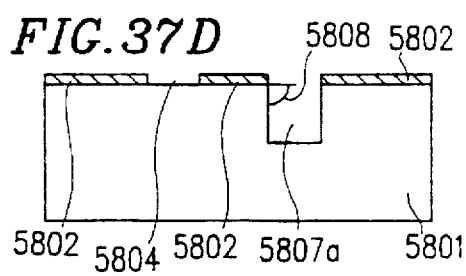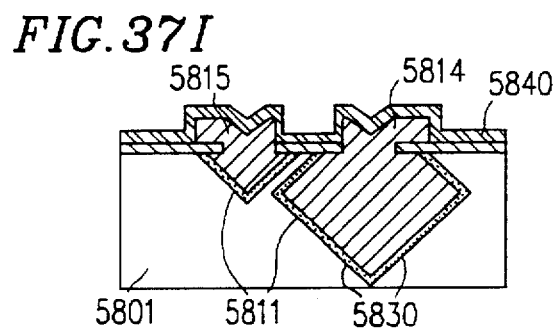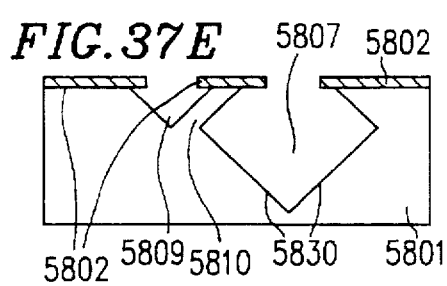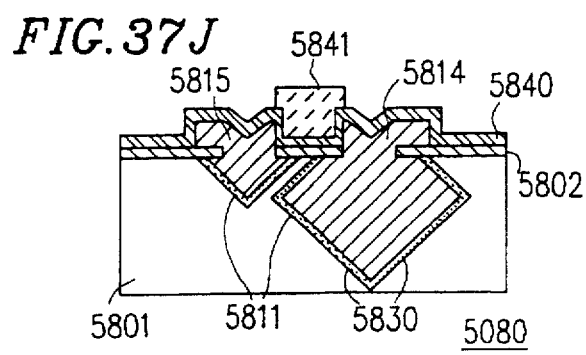

5,739,544

QUANTIZATION FUNCTIONAL DEVICE UTILIZING A RESONANCE TUNNELING EFFECT AND METHOD FOR PRODUCING THE SAME

CROSS-REFERENCE TO RELATED APPLICATION

This application is a continuation-in-part of U.S. patent application Ser. No. 08/421,530, filed on Apr. 13, 1995, now U.S. Pat. No. 5,514,614 issued on May 7, 1996, which is a divisional of U.S. patent application Ser. No. 08/249,541, filed on May 26, 1994, now U.S. Pat. No. 5,486,706 issued on Jan. 23, 1996.

BACKGROUND OF THE INVENTION

1. Field of the Invention

The present invention relates to a quantization functional device utilizing a resonance tunneling effect and a method for producing the same. In particular, the present invention relates to a resonance tunneling diode, a method for producing the same, a hot electron transistor or a resonance tunneling transistor, and a method for producing the same.

2. Description of the Related Art

Recently, quantization functional devices utilizing a quantum effect have been actively studied. One type of quantization functional device which has been proposed for practical use is a device utilizing the resonance tunneling effect of electrons, for example, a resonance tunneling diode.

Such a device requires a double barrier structure in which a quantum well having a size approximately identical with the scattering length of the electrons and tunnel barriers sandwiching the quantum well are provided. One type of such a double barrier structure utilizes a semiconductor heterojunction, which is generally realized by way of crystal growth of thin films, each formed of a compound semiconductor material and having several atom layers (see, for example, Reona Ezaki and Hiroyuki Sakaki, *Super-lattice Hetero Structure Device*, published by Kogyo Chosakai, pp.397 to 435 (1988)).

Another type of double barrier structure which has been proposed uses silicon materials, and is produced by forming a silicon oxide film and a polysilicon film on a silicon substrate (see, for example, Saki et al., *Resonant Tunneling Through SiO$_2$/Si/SiO$_2$ Double Barriers*, Extended Abstracts of the 52nd Autumn Meeting of the Japan Society of Applied Physics, No. 2, pp.653, 10a-B-3, 1991).

Briefly referring to FIGS. 1A through 1D, a conventional resonance tunneling diode utilizing compound semiconductor materials is produced in the following manner.

Compound semiconductor materials are laminated by MBE (molecular beam epitaxy).

As illustrated in FIG. 1A, on a first Si-doped GaAs layer 11, a first AlGaAs layer 12 is grown in a thickness of 2.3 nm. Then, on the first AlGaAs layer 12, a GaAs layer 13 (FIG. 1B) having a thickness of 7.0 nm, a second AlGaAs layer 14 (FIG. 1C) having a thickness of 2.3 nm, and a second Si-doped GaAs layer 15 (FIG. 1D) are sequentially laminated. As a result, a resonance tunneling diode having a double barrier structure including the first AlGaAs layer 12/the GaAs layer 13/the second AlGaAs layer 14 is produced.

With reference to FIGS. 2A through 2E, another conventional resonance tunneling diode utilizing silicon materials is formed in the following manner.

An n-type silicon substrate 21 as illustrated in FIG. 2A is prepared. By dry oxidation at a temperature of 1000° C., a first silicon oxide film 22 is formed at a thickness of 3 to 4 nm on the silicon substrate 21 (FIG. 2B). On the silicon oxide film 22, a polysilicon layer 23 is formed at a thickness of 8 to 12 nm by LPCVD (low pressure chemical vapor deposition) (FIG. 2C). By dry oxidation at a temperature of 1000° C., a second silicon oxide film 24 is formed at a thickness of 3 to 4 nm on the polysilicon layer 23 (FIG. 2D). By depositing aluminum in a vacuum, an aluminum electrode 25 is formed on the second silicon oxide film 24 (FIG. 2E). In this manner, a resonance tunneling diode having a double barrier structure including the first silicon oxide film 22/the polysilicon layer 23/the second silicon oxide film 24 is produced.

Another type of quantization functional device utilizing a resonance tunneling effect is a resonance tunneling transistor or a hot electron transistor. In a hot electron transistor, another electrode for directly controlling the level of voltage applied to the quantum well is provided. Thus, the electrodes at the two ends of the double barrier structure respectively act as a collector and an emitter, and the quantum well acts as a base. In such a configuration, hot electrons from the emitter pass through the base, which is a thin layer, and reach the collector. The hot electron transistor uses, for example, CoSi$_2$/CaF$_2$ or the like as described in J. C. Hensel et al., Appl. Phys. Lett., vol.47, pp.151 (1985).

The above-described conventional quantization functional devices have the following problems.

In devices using compound semiconductor materials, electrons are not sufficiently confined in the quantum well due to a low height of the tunnel barrier (1.5 eV or less). As a result, even if the electrons in the quantum well are not in a resonance state, some of the electrons pass through the double barrier structure. Accordingly, the V-I characteristic of the device does not have a high P/V ratio (ratio of the peak current relative to the valley current).

In devices using silicon materials, it is difficult to form a quantum well having satisfactory crystallinity. This deteriorates the negative resistance characteristics of the devices.

Production of conventional hot electron transistors requires new facilities and technologies for handing materials such as CoSi$_2$ and CaF$_2$, in addition to the existing facilities and technologies for mainly handling silicon materials. In order to mass produce the hot electron transistors, problems concerning production efficiency and production cost need to be solved.

SUMMARY OF THE INVENTION

One aspect of the present invention relates to a quantization functional device, including: a silicon thin plate having a plurality of side walls each having a surface orientation of (111), a distance between the plurality of side walls being sufficiently thin so as to allow the silicon thin plate to act as a quantum well; a pair of tunneling barriers respectively provided on surfaces of the side walls of the silicon thin plate; a first electrode and a second electrode sandwiching the pair of tunneling barriers; and a third electrode extending from a peripheral portion of an end surface of the silicon thin plate to a peripheral portion of at least one of the first and second electrodes.

Another aspect of the present invention relates to a method for producing a quantization functional device, including the steps of: forming an etching protection film on a silicon substrate having a surface orientation of (001); forming a first opening and a second opening in the etching protection film in one of a parallel direction and a perpendicular direction to a <110> crystal orientation of the silicon substrate, the first opening and the second opening being parallel to each other; covering the second opening with an etchant resistive material; forming a first groove in the silicon substrate at a position corresponding to the first opening by etching; removing the etchant resistive material; performing crystalline anisotropic etching to form the first groove into a shape having a substantially diamond-shaped cross section and a surface having a surface orientation of (111), and to form a second groove having a V-shaped cross section and a surface having a surface orientation of (111) in the silicon substrate at a position corresponding to the second opening, thereby forming a silicon thin plate sandwiched between the first groove and the second groove, surfaces of the silicon thin plate having a surface orientation of (111), and a distance between the surfaces of the silicon thin plate being sufficiently thin to allow the silicon thin plate to act as a quantum well; forming a pair of tunneling barriers on the surfaces of the silicon thin plate; forming a polysilicon layer on a surface of the silicon substrate so as to fill the first groove and the second groove, and doping an impurity having an identical conductivity with the conductivity of the silicon substrate into the polysilicon layer at a high density; patterning the polysilicon layer into a first electrode and a second electrode sandwiching the pair of tunneling barriers; forming an insulating layer on the first electrode, the second electrode and the etching protection film; and depositing polysilicon or metal on the insulating layer and patterning the deposited polysilicon or metal to form a third electrode.

According to another aspect of the invention, a method for producing a quantization functional device includes the steps of: forming an etching protection film on a silicon substrate having a surface orientation of (001); forming a first opening and a second opening in the etching protection film in one of a parallel direction and a perpendicular direction to a <110> crystal orientation of the silicon substrate, the first opening and the second opening being parallel to each other; covering the second opening with an etchant resistive material; forming a first groove in the silicon substrate at a position corresponding to the first opening by etching; removing the etchant resistive material; covering the first opening with a second etchant resistive material; forming a second groove in the silicon substrate at a position corresponding to the second opening by etching; removing the second etchant resistive material; performing crystalline anisotropic etching to form each of the first groove and the second groove into a shape having a substantially diamond-shaped cross section and a surface having a surface orientation of (111), thereby forming a silicon thin plate sandwiched between the first groove and the second groove, surfaces of the silicon thin plate having a surface orientation of (111), and a distance between the surfaces of the silicon thin plate being sufficiently thin to allow the silicon thin plate to act as a quantum well; forming a pair of tunneling barriers on the surfaces of the silicon thin plate; forming a polysilicon layer on a surface of the silicon substrate so as to fill the first groove and the second groove, and doping an impurity having an identical conductivity with the conductivity of the silicon substrate into the polysilicon layer at a high density; patterning the polysilicon layer into a first electrode and a second electrode sandwiching the pair of tunneling barriers; forming an insulating layer on the first electrode, the second electrode and the etching protection film; and depositing polysilicon or metal on the insulating layer and patterning the deposited polysilicon or metal to form a third electrode.

According to still another aspect of the invention, a method for producing a quantization functional device includes the steps of: forming an etching protection film on a silicon substrate having a surface orientation of (001); forming a first opening in the etching protection film in one of a parallel direction and a perpendicular direction to a <110> crystal orientation of the silicon substrate; forming a first groove in the silicon substrate at a position corresponding to the first opening by etching; performing crystalline anisotropic etching to form the first groove into a shape having a substantially diamond-shaped cross section and a surface having a surface orientation of (111); forming a tunneling barrier on the surface of the first groove; forming a second opening in the etching protection film parallel to the first opening; performing crystalline anisotropic etching to form a second groove having a cross section of a predetermined shape and a surface having a surface orientation of (111) in the silicon substrate at a position corresponding to the second opening, thereby forming a silicon thin plate sandwiched between the first groove and the second groove, surfaces of the silicon thin plate having a surface orientation of (111), and a distance between the surfaces of the silicon thin plate being sufficiently thin to allow the silicon thin plate to act as a quantum well; forming a tunneling barrier on the surface of the second groove while increasing the thickness of the tunneling barrier formed on the surface of the first groove; forming a polysilicon layer on a surface of the silicon substrate so as to fill the first groove and the second groove, and doping an impurity having an identical conductivity with the conductivity of the silicon substrate into the polysilicon layer at a high density; patterning the polysilicon layer into a first electrode and a second electrode sandwiching the pair of tunneling barriers; forming an insulating layer on the first electrode, the second electrode and the etching protection film; and depositing polysilicon or metal on the insulating layer and patterning the deposited polysilicon or metal to form a third electrode.

According to still another aspect of the invention, a method for producing a quantization functional device includes the steps of: forming an etching protection film on a silicon-on-insulator substrate having a surface orientation of (110); patterning the etching protection film into a rectangular shape in one of a parallel direction and a perpendicular direction to a <112> crystal orientation of the silicon-on-insulator substrate; performing crystalline anisotropic etching to etch away an exposed surface of the silicon-on-insulator substrate up to an insulating layer of the silicon-on-insulator substrate by using the patterned etching protection layer as a mask, thereby forming a silicon thin plate, surfaces of the silicon thin plate having a surface orientation of (111), and a distance between the surfaces of the silicon thin plate being sufficiently thin to allow the silicon thin plate to act as a quantum well; forming a pair of tunneling barriers on the surfaces of the silicon thin plate; forming a polysilicon layer on a surface of the silicon-on-insulator substrate including the silicon thin plate, and doping an impurity having an identical conductivity with the conductivity of the silicon-on-insulator substrate into the polysilicon layer at a high density; patterning the polysilicon layer into a first electrode and a second electrode sandwiching the pair of tunneling barriers; forming an insulating layer on the first electrode, the second electrode and the etching protection film; and depositing polysilicon or metal on the insulating layer and patterning the deposited polysilicon or metal to form a third electrode.

According to still another aspect of the invention, a method for producing a quantization functional device includes the steps of: forming an etching protection film on a silicon-on-insulator substrate having a surface orientation of (001); patterning the etching protection film into a rectangular shape in one of a parallel direction and a perpendicular direction to a <110> crystal orientation of the silicon-on-insulator substrate; forming a resist mask to cover an exposed surface of the silicon-on-insulator substrate in one side of the patterned etching protection layer; etching, by using the patterned etching protection layer and the resist mask as a mask, the exposed surface of the silicon-on-insulator substrate which is not covered with the mask up to an insulating layer of the silicon-on-insulator substrate; removing the resist mask; performing crystalline anisotropic etching to etch the rest of the exposed surface of the silicon-on-insulator substrate up to the insulating layer of the silicon-on-insulator substrate by using the patterned etching protection layer as a mask, thereby forming a silicon thin plate, surfaces of the silicon thin plate having a surface orientation of (111), and a distance between the surfaces of the silicon thin plate being sufficiently thin to allow the silicon thin plate to act as a quantum well; forming a pair of tunneling barriers on the surfaces of the silicon microscopic structure; forming a polysilicon layer on a surface of the silicon-on-insulator substrate including the silicon thin plate, and doping an impurity having an identical conductivity with the conductivity of the silicon-on-insulator substrate into the polysilicon layer at a high density; patterning the polysilicon layer into a first electrode and a second electrode sandwiching the pair of tunneling barriers; forming an insulating layer on the first electrode, the second electrode and the etching protection film; and depositing polysilicon or metal on the insulating layer and patterning the deposited polysilicon or metal to form a third electrode.

According to still another aspect of the invention, a method for producing an integrated circuit includes the steps of: forming an etching protection film on a silicon-on-insulator substrate having a surface orientation of (001); patterning the etching protection film into a rectangular shape in one of a parallel direction and a perpendicular direction to a <110> crystal orientation of the silicon-on-insulator substrate; etching an exposed surface of the silicon-on-insulator substrate, on one side of the patterned etching protection layer the silicon-on-insulator substrate being etched up to an insulating layer of the silicon-on-insulator substrate, and on the other side up to a predetermined depth between the insulator layer and the surface of the silicon-on-insulator substrate; performing crystalline anisotropic etching to etch the rest of the exposed surface of the silicon-on-insulator substrate up to the insulating layer of the silicon-on-insulator substrate by using the patterned etching protection layer as a mask, thereby forming a silicon thin plate, surfaces of the silicon thin plate having a surface orientation of (111), and a distance between the surfaces of the silicon thin plate being sufficiently thin to allow the silicon thin plate to act as a quantum well; forming a pair of tunneling barriers on the surfaces of the silicon thin plate; forming a polysilicon layer on a surface of the silicon-on-insulator substrate including the silicon thin plate, and doping an impurity having an identical conductivity with the conductivity of the silicon-on-insulator substrate into the polysilicon layer at a high density; patterning the polysilicon layer into a first electrode and a second electrode sandwiching the pair of tunneling barriers; forming an insulating layer on the first electrode, the second electrode and the etching protection film; and depositing polysilicon or metal on the insulating layer and patterning the deposited polysilicon or metal to form a third electrode.

Thus, the invention described herein makes possible the advantages of providing a quantization functional device utilizing a resonance tunneling effect and a method for producing the same, and specifically providing (1) a resonance tunneling diode having a double barrier structure made of silicon materials including large tunnel barriers and a quantum well having a sufficiently high crystallinity to exhibit improved operating characteristics, and a method for producing the same; and (2) a hot electron transistor (resonance tunneling transistor) having a double barrier structure which can be produced by the conventional semiconductor technologies for handling silicon materials, and a method for producing the same.

These and other advantages of the present invention will become apparent to those skilled in the art upon reading and understanding the following detailed description with reference to the accompanying figures.

BRIEF DESCRIPTION OF THE DRAWINGS

FIG. 27 is a cross sectional view of a resonance tunneling transistor in a fourteenth example according to the present invention;

FIGS. 37A through 37J are cross sectional views illustrating the steps of producing a resonance tunneling transistor in a twenty-first example according to the present invention;

DESCRIPTION OF THE PREFERRED EMBODIMENTS

Hereinafter, the present invention will be described by way of illustrative examples with reference to the accompanying drawings.

Example 1

Figure 1A:
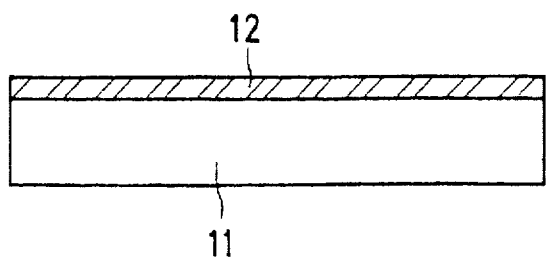
FIGS. 1A through 1D are cross sectional views illustrating an example of the steps of producing a conventional resonance tunneling diode using compound semiconductor materials.
Figure 1B:
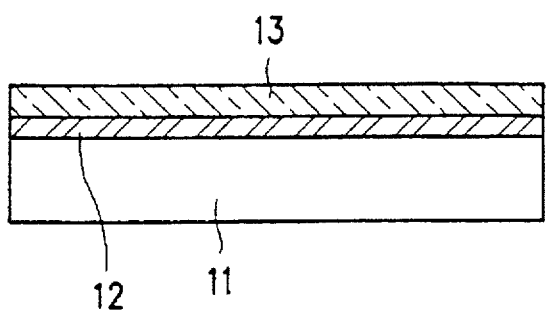
Figure 1C:
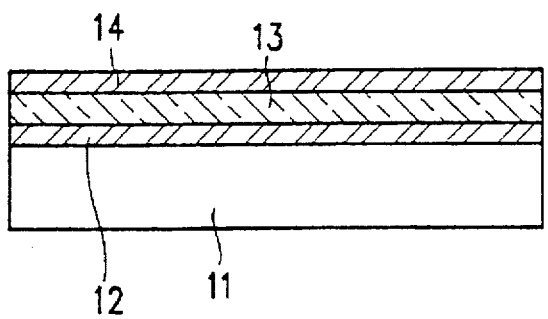
Figure 1D:
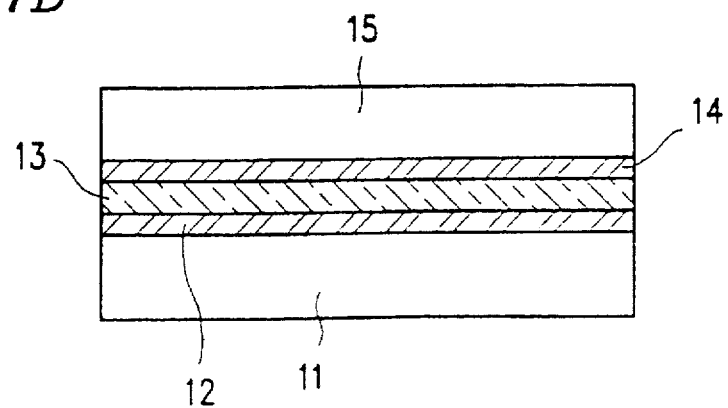
Figure 2A:
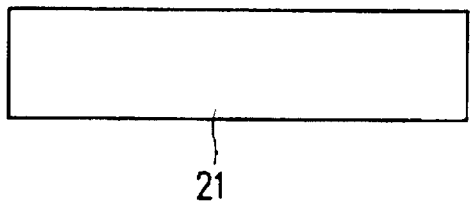
FIGS. 2A through 2E are cross sectional views illustrating an example of the steps of producing a conventional resonance tunneling diode using silicon materials.
Figure 2B:
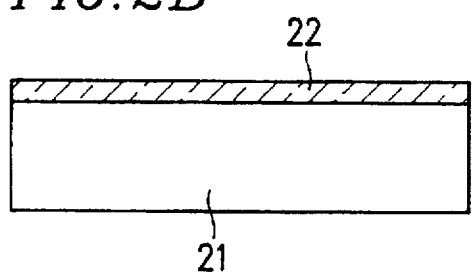
Figure 2E:
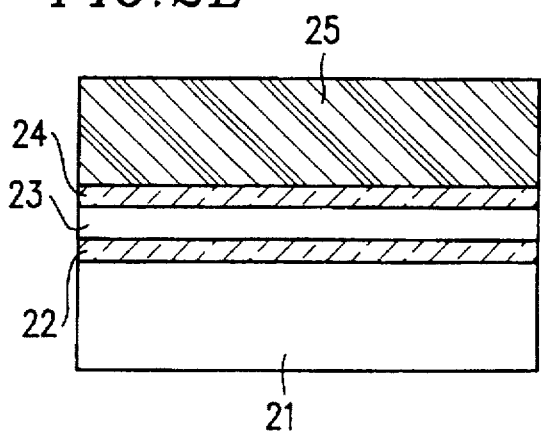
Figure 2C:
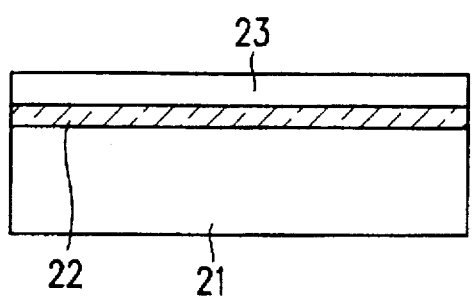
Figure 2D:
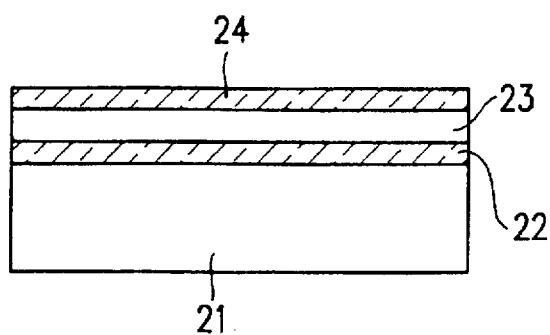
Figure 3:
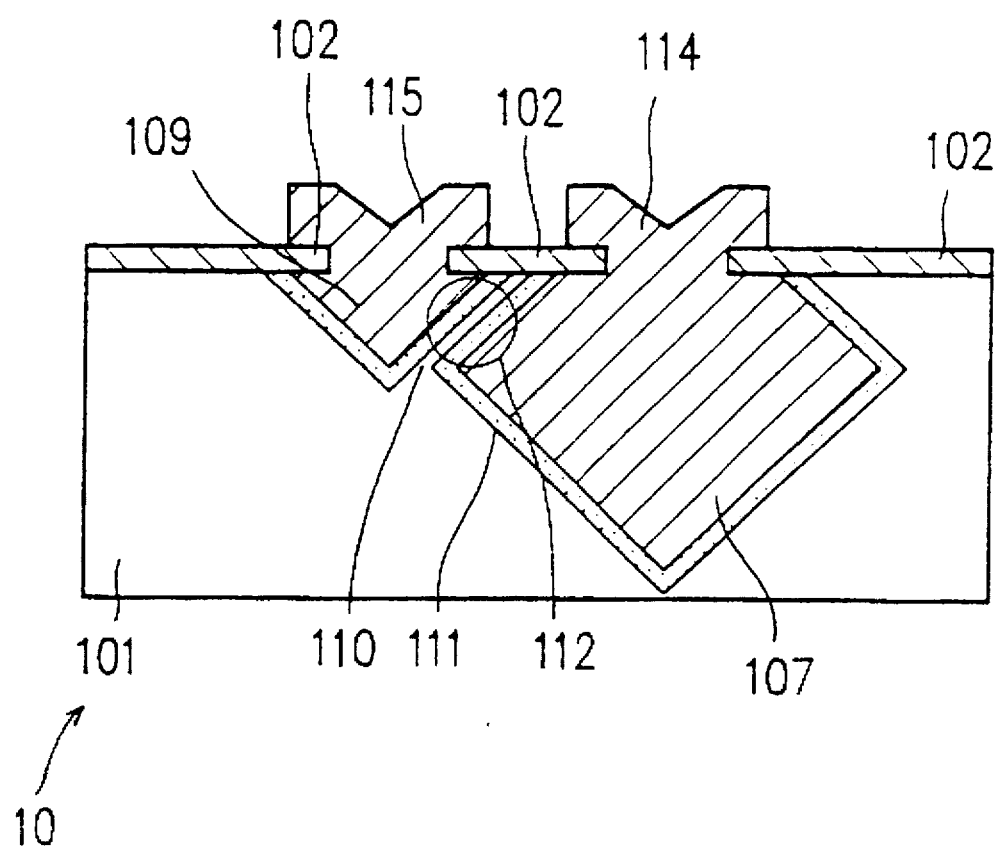
FIG. 3 is a cross sectional view of a resonance tunneling diode in a first example according to the present invention.

With reference to FIGS. 3 and 4A through 4I, a resonance tunneling diode in a first example according to the present invention will be described. FIG. 3 is a cross sectional view of a resonance tunneling diode 10 in accordance with the first example. FIGS. 4A through 4I are cross sectional views illustrating the steps of producing the resonance tunneling diode 10.

As illustrated in FIG. 3, the resonance tunneling diode 10 includes a silicon substrate 101 having a surface orientation of (001) (hereinafter, referred to as the (001) silicon substrate). The (001) silicon substrate 101 has a first groove 107 having a substantially diamond-shaped cross section and a second groove 109 having a V-shaped cross section. The first and the second grooves 107 and 109 are formed by anisotropic etching, and are parallel or perpendicular to the <110> crystal orientation of the (001) silicon substrate 101. The first and the second grooves 107 and 109 respectively have maximum depths of 1450 nm and 770 nm.

The first and the second grooves 107 and 109 sandwich a silicon thin plate 110 therebetween. The silicon thin plate 110 has an entirely uniform thickness of 20 to 50 nm, preferably of 20 nm so that a quantum effect is generated in the silicon thin plate 110 to allow the silicon thin plate 110 to act as a quantum well. The silicon thin plate 110 is formed during the anisotropic etching for forming the first and the second grooves 107 and 109 by partially leaving single crystal-line silicon forming the (001) silicon substrate 101 in a small thickness. The surface of the silicon thin plate 110 has a surface orientation of (111).

Surfaces of the first and the second grooves 107 and 109 including the areas acting as surfaces of the silicon thin plate 110 have a surface orientation of (111). On the surfaces of the first and the second grooves 107 and 109, silicon oxide films 111 are provided with a uniform thickness. The silicon oxide films 111 each have a thickness of 2 nm to 4 nm, preferably of 3 nm.

On a surface of the (001) silicon substrate 101 including an area acting as a surface of the silicon thin plate 110, an etching protection film 102 is provided. The etching protection film 102 is formed of a thermal oxide film and has a thickness of 100 nm. The etching protection film 102 overhangs at the ends of the first and the second grooves 107 and 109.

The first groove 107 is filled with a first electrode 114, and the second groove 109 is filled with a second electrode 115. The first and the second electrodes 114 and 115 are formed of polysilicon including an n-type impurity doped thereto at a high density. As the n-type impurity, phosphorus (P) or arsenic (As), or the like which is generally used in the field of semiconductor can be used. In this example, as described later with reference to FIGS. 4A through 4H, the first and the second electrodes 114 and 115 are formed of polysilicon including phosphorus doped thereto by thermal diffusion at a density of $1 \times 10^{19}$ cm$^{-3}$ or more.

The first and the second electrodes 114 and 115 entirely cover the silicon oxide films 111 provided on the first and the second grooves 107 and 109. The first and the second electrodes 114 and 115 are partially projected above the etching protection film 102.

A double barrier structure 112 for generating a resonance tunneling effect includes lamination of the silicon thin plate 110 and the silicon oxide films 111. The silicon thin plate 110 acts as a quantum well, and the silicon oxide films 111 provided on the silicon thin plate 110 act as tunneling barriers of the double barrier structure 112. In summary, the resonance tunneling diode 10 includes the double barrier structure 112, and the first and the second electrodes 114 and 115 sandwiching the double barrier structure 112.

In the resonance tunneling diode 10 having the above-described configuration, the silicon thin plate 110 acting as the quantum well is a part of the (001) silicon substrate 101. Accordingly, the crystallinity of the silicon thin plate 110 is as high as that of the (001) silicon substrate 101. Since high quality oxide films 111 are used as the tunneling barriers, the potential barrier is high. Furthermore, since the interface between the silicon thin plate 110 and the silicon oxide films 111 has a surface orientation of (111), which is smooth in the atomic order, a range of voltages for generating a resonance tunneling effect is very narrow, and thus a satisfactory resonance tunneling effect of electrons is obtained. The use of silicon which is convenient for mass production and is inexpensive contributes to reduction in the production cost and enhancement in the production efficiency.

With reference to FIGS. 4A through 4I, a production method of the resonance tunneling diode 10 in this example will be described.

Figure 4A:
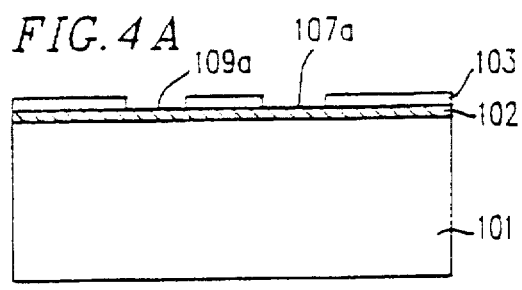
FIGS. 4A through 4I are cross sectional views illustrating the steps of producing the resonance tunneling diode in accordance with the first example.

As illustrated in FIG. 4A, the etching protection film 102 is formed in a thickness of 100 nm by thermal oxidation at a temperature of 900° C. for 54.5 minutes on the (001) silicon substrate 101 formed of an n-type silicon. On the etching protection film 102, a resist pattern 103 having a first opening 107a and a second opening 109a is formed by photolithography. The first and the second openings 107a and 109a are parallel to each other, and both are rectangular with a width of 500 nm. The first and the second openings 107a and 109a have an interval of 800 nm therebetween. The first and the second openings 107a and 109a are provided for forming the first and the second grooves 107 and 109. The first and the second openings 107a and 109a are located so that the sides thereof in the normal to the plane of the paper in FIG. 3 are parallel or perpendicular to the <110> crystal orientation of the (001) silicon substrate 101 with an error of ±1 degree.

The etching protection film 102 is treated with reactive ion etching (RIE) using the resist pattern 103 as a mask, and $O_2$ and $CF_4$ as etching gases to extend the first opening 107a and the second opening 109a into the etching protection film 102. The resist pattern 103 is removed after RIE to obtain the configuration shown in FIG. 4B.

Figure 4F:
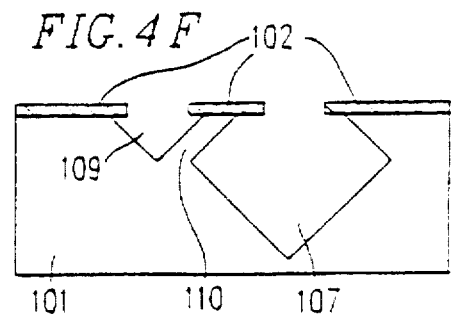
Figure 4B:
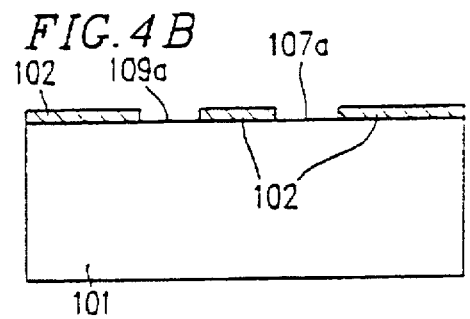
Figure 4G:
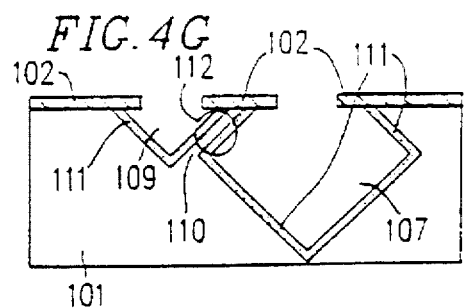
Figure 4C:
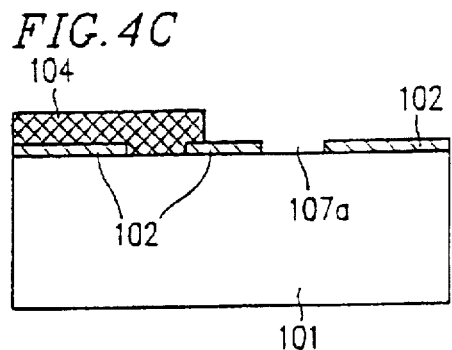

As shown in FIG. 4C, a resist mask 104 formed of an etchant resistive material is formed on the (001) silicon substrate 101, covering the second opening 109a. Dry etching is performed using the etching protection film 102 and the resist mask 104 as masks, and $SiCl_4$, $CH_2F_2$, $SF_6$, and $O_2$ as etching gases to form a groove 107b in positional correspondence with the first opening 107a as illustrated in FIG. 4D. The groove 107b has a depth of 900 nm. The resist mask 104 is removed to obtain the configuration shown in FIG. 4E. The groove 107b is formed so that a depression angle 108 made by the surface of the (001) silicon substrate 101 and a side wall of the groove 107b is 90 degrees or more. In FIG. 4E, the depression angle 108 is 90 degrees.

Then, the (001) silicon substrate 101 is treated with crystalline anisotropic etching (wet chemical etching) using a mixture liquid of ethylene diamine ($NH_2(CH)_2NH_2$), pyrocatechol ($C_6H_4(OH)_2$) and pure water as an etchant. The etching rate of the crystalline anisotropic etching using the above-described etchant is lower with respect to the (111) plane than with respect to the (001) plane and the (110) plane by approximately two digits. Accordingly, etching is performed non-uniformly from the side walls and a bottom face of the groove 107b and an area of the surface of the (001) silicon substrate 101 corresponding to the second opening 109a. As a result, the groove 107b is formed into the first groove 107 having a substantially diamond-shaped cross section, and the second groove 109 having a V-shaped cross section is formed in positional correspondence with the second opening 109a in the (001) silicon substrate 101.

The mole ratio of the ethylene diamine, pyrocatechol and pure water mixture liquid is, for example, 43.8:4.2:52. In this case, if the temperature of the mixture liquid is set to be 80° C., the etching rate of the (111) plane is approximately 7 nm/min.

During the etching process, by controlling the etching rate and the etching time, the silicon thin plate 110 having a thickness of 20 to 50 nm and acting as the quantum well is formed between the first groove 107 and the second groove 109 as shown in FIG. 4F. In this example, the etching rate and the etching time are set so that the thickness of the silicon thin plate 110 will be 20 nm.

The crystalline anisotropic etching provides the following advantages: (1) the surfaces of the silicon thin plate 110 obtained by the etching is flat; (2) the high crystallinity of the (001) silicon substrate 101 is maintained in the silicon thin plate 110; and (3) since the silicon thin plate 110 is formed utilizing the difference in the etching rate depending on the crystal-line orientation, the thickness thereof is uniform and the damage by etching thereto is significantly reduced.

The etching protection film 102 on the (001) silicon substrate 101 is not etched. Accordingly, the etching protection film 102 overhangs at the ends of the first and the second grooves 107 and 109. Therefore, the silicon thin plate 110 having a thickness of 20 to 50 nm is superposed by the etching protection film 102 having a width of 800 nm corresponding to the width of the interval between the first opening 107a and the second opening 109a.

Then, the (001) silicon substrate 101 is thermally oxidized in an oxygen atmosphere at a temperature of 900° C. By such oxidation, the thickness of the etching protection film 102 is increased, and the silicon oxide films 111 are formed having a thickness of 2 to 4 nm on the surfaces of the first and the second grooves 107 and 109 including the surfaces of the silicon thin plate 110 as is shown in FIG. 4G. As a result, the double barrier structure 112 including the silicon thin plate 110 and the silicon oxide films 111 sandwiching the silicon thin film 110 is formed. The thickness of the silicon oxide films 111 can be adjusted by controlling the oxidation time. In this example, oxidation conditions are set so that the thickness will be 3 nm.

Then, the first electrode 114 and the second electrode 115 are formed so as to sandwich the double barrier structure 112 in the following manner.

Figure 4H:
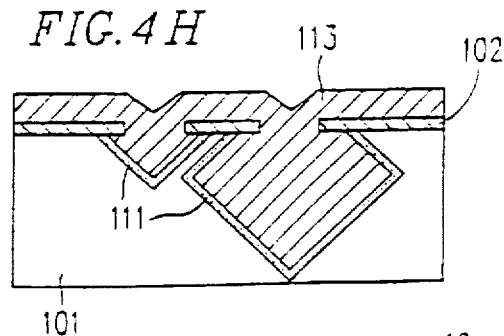
Figure 4D:
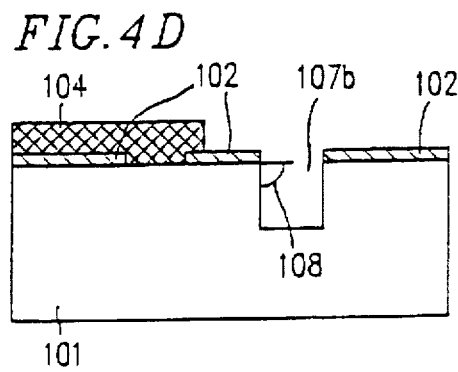
Figure 4I:
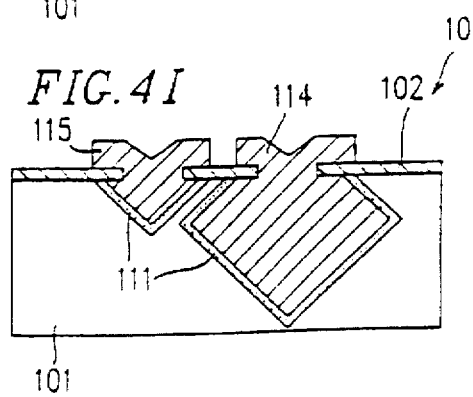
Figure 4E:
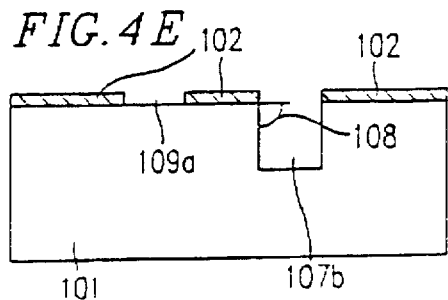

As illustrated in FIG. 4H, a polysilicon layer 113 is formed on the surface of the etching protection film 102, filling the first and the second grooves 107 and 109 by LPCVD. The polysilicon layer 113 has a thickness of 500 nm on the etching protection film 102. Next, the polysilicon layer 113 is treated with annealing at a temperature of 900° C. for 20 minutes in an atmosphere of POCl₃ to diffuse phosphorus as an n-type impurity into the polysilicon layer 113 at a high density of $1\times10^{19}$ cm$^{-3}$ or more. The resultant polysilicon including phosphorus is used as a material for the first and the second electrodes 114 and 115. The polysilicon layer 113 is patterned by photolithography and then treated with dry etching using $SiCl_4$, $CH_2F_2$, $SF_6$ and $O_2$ as etching gases to form the first electrode 114 and the second electrode 115 as illustrated in FIG. 4I.

In this manner, the resonance tunneling diode 10 in the first example according to the present invention having the double barrier structure 112 including the silicon oxide film 111 (acting as the tunneling barrier), the silicon thin plate 110 (acting as the quantum well) and the silicon oxide film 111 (acting as the tunneling barrier), and also including two terminals, namely the first and the second electrodes 114 and 115 is produced.

The silicon oxide films 111 acting as the tunneling barriers may be formed by chemical deposition instead of thermal oxidation. The tunneling barrier may be formed of a nitride film which is formed by thermal nitriding in a nitrogen atmosphere or chemical deposition, a nitride oxide film, or a SiC film or a SiGe film which is formed of crystal growth.

The etching protection film 102 may be formed of any other material and by any other method so long as the film provides protection against an etchant. For example, the etching protection film 102 may be formed of a nitride film or a chrome film.

The substrate 101 may be formed of a p-type substrate, in which case the first and the second electrodes 114 and 115 are formed of polysilicon including a p-type impurity diffused therein.

The etchant for crystalline anisotropic etching may be a mixture liquid of hydrazine, isopropyl alcohol and pure water or an aqueous solution of potassium hydroxide.

Example 2

Figure 5:
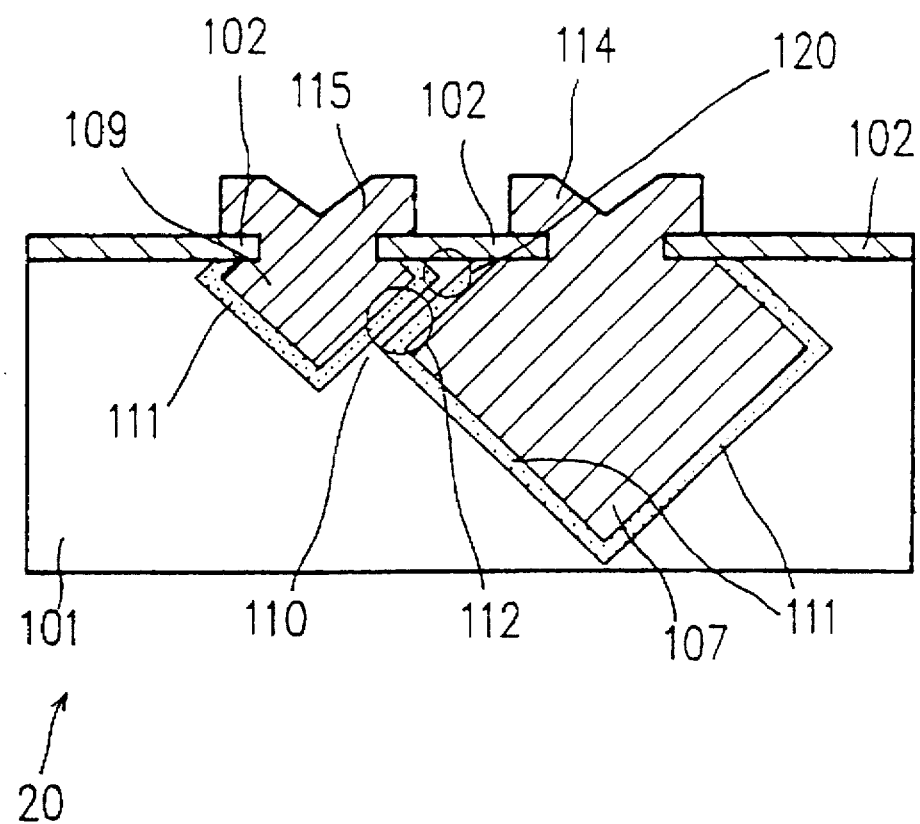
FIG. 5 is a cross sectional view of a resonance tunneling diode in a second example according to the present invention.

With reference to FIGS. 5 and 6A through 6K, a resonance tunneling diode in a second example according to the present invention will be described. FIG. 5 is a cross sectional view of a resonance tunneling diode 20 in accordance with the second example. FIGS. 6A through 6K are cross sectional views illustrating the steps of producing the resonance tunneling diode 20. Elements identical with those in the first example bear the identical reference numerals, and the explanations thereof will be omitted.

As illustrated in FIG. 5, the resonance tunneling diode 20, as the resonance tunneling diode 10 in the first example, includes the (001) silicon substrate 101. In the (001) silicon substrate 101, the double barrier structure 112, including the silicon thin plate 110 and the silicon oxide films 111 provided on two surfaces of the silicon thin plate 110, is provided. The double barrier structure 112 is sandwiched between the first electrode 114 and the second electrode 115 which act as two terminals. The surfaces of the first and the second grooves 107 and 109 are formed of a (111) plane.

The main difference between the resonance tunneling diode 20 in the second example and the resonance tunneling diode 10 in the first example is that the second groove 109 has a substantially diamond-shaped cross section which is similar to that of the first groove 107. As a result, the silicon thin plate 110 includes an etching protection film supporting area 120 having a reverse triangular cross section in a top part thereof which is immediately below the etching protection film 102. Due to the etching protection film supporting area 120, the silicon thin plate 110 supports the etching protection film 102 more strongly.

In the resonance tunneling diode 20 having the above-described configuration, the double barrier structure 112 is formed deep below the surface of the (001) silicon substrate 101. Therefore, areas of the silicon thin plate 110 in contact with the first and the second electrodes 114 and 115 are larger than the case of the first example, and thus the tunneling current can be increased.

With reference to FIGS. 6A through 6K, a production method of the resonance tunneling diode 20 in this example will be described.

Figure 6A:
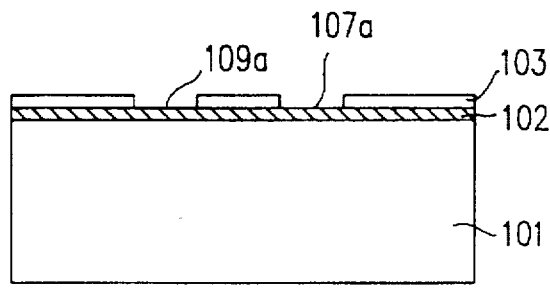
FIGS. 6A through 6K are cross sectional views illustrating the steps of producing the resonance tunneling diode in accordance with the second example.

As illustrated in FIG. 6A, the etching protection film 102 is formed in a thickness of 100 nm by thermal oxidation at a temperature of 900° C. for 54.5 minutes on the (001) silicon substrate 101 formed of an n-type silicon. On the etching protection film 102, the resist pattern 103 having the first opening 107a and the second opening 109a is formed by photolithography. The first and the second openings 107a and 109a are parallel to each other, and both are rectangular with a width of 500 nm. The first and the second openings 107a and 109a have an interval of 800 nm therebetween. The first and the second openings 107a and 109a are provided for forming the first and the second grooves 107 and 109. The first and the second openings 107a and 109a are located so that the sides thereof in the direction normal to the plane of the paper in FIG. 6A are parallel or perpendicular to the <110> crystal orientation of the (001) silicon substrate 101 with an error of ±1 degree.

The etching protection film 102 is treated with RIE using the resist pattern 103 as a mask and $O_2$ and $CF_4$ as etching gases to extend the first opening 107a and the second opening 109a into the etching protection film 102. The resist pattern 103 is removed after RIE to obtain the configuration shown in FIG. 6B.

Figure 6D:
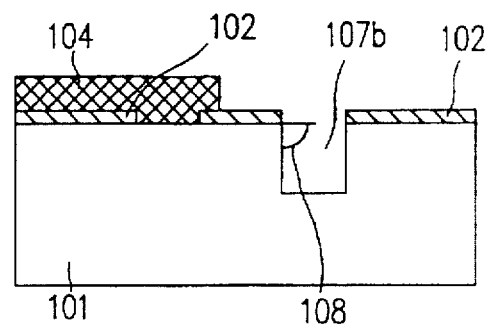
Figure 6B:
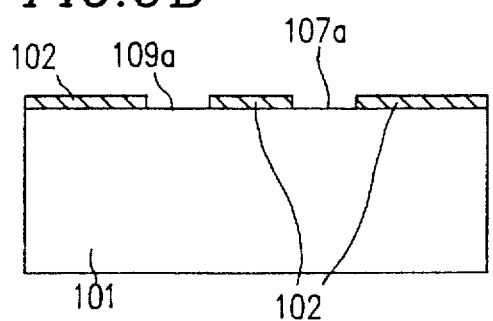
Figure 6E:
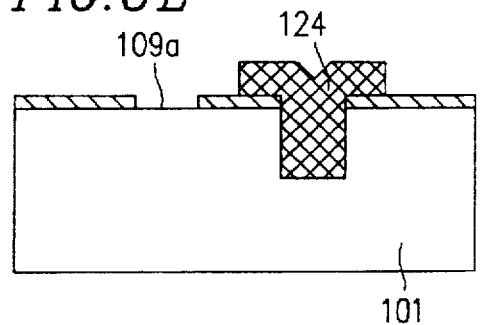
Figure 6C:
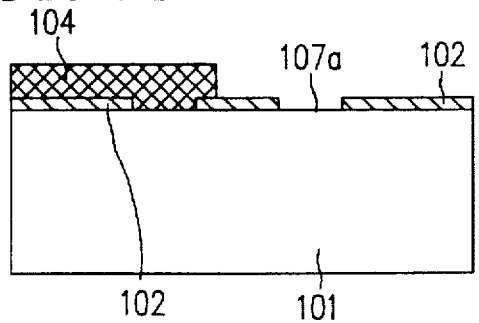

As shown in FIG. 6C, a resist mask 104 formed of an etchant resistive material is formed on the (001) silicon substrate 101, covering the second opening 109a. Dry etching is performed using the etching protection film 102 and the resist mask 104 as masks, and $SiCl_4$, $CH_2F_2$, $SF_6$, and $O_2$ as etching gases to form the groove 107b in positional correspondence with the first opening 107a as illustrated in FIG. 6D. The groove 107b has a depth of 900 nm. The groove 107b is formed so that the depression angle 108 made by the surface of the (001) silicon substrate 101 and the side wall of the groove 107b is 90 degrees or more. In FIG. 6E, the depression angle 108 is 90 degrees.

Figure 6F:
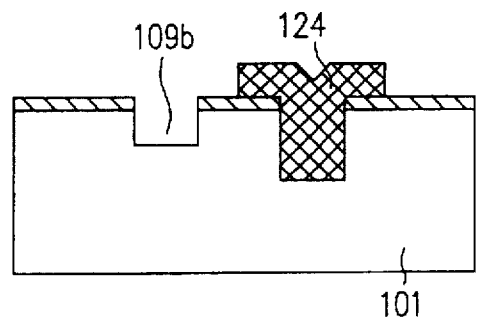
Figure 6G:
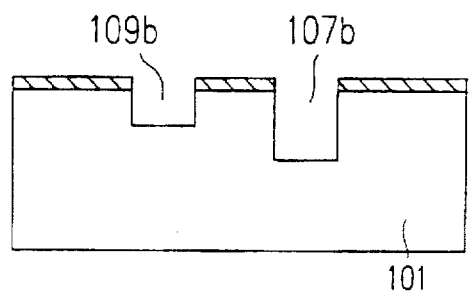

After the resist mask 104 is removed, another resist mask 124 is formed to fill the groove 107b as illustrated in FIG. 6E. Dry etching is performed in the same manner as that for forming the groove 107b to form a groove 109b in positional correspondence with the second opening 109a as illustrated in FIG. 6F. The groove 109b has a depth of 400 nm. The resist mask 124 is removed to obtain the configuration shown in FIG. 6G. The groove 109b is formed so that a depression angle made by the surface of the (001) silicon substrate 101 and a side wall of the groove 109b is 90 degrees or more. In FIG. 6F, the depression angle is 90 degrees.

The (001) silicon substrate 101 is treated with crystalline anisotropic etching using a mixture liquid of ethylene diamine ($NH_2(CH)_2NH_2$), pyrocatechol ($C_6H_4(OH)_2$) and pure water as an etchant in the same manner as described in the first example. As a result of the crystalline anisotropic etching, the groove 107b is formed into the first groove 107 having a substantially diamond-shaped cross section, and the groove 109b is formed into the second groove 109 having a substantially diamond-shaped cross section in the (001) silicon substrate 101, thereby also forming the silicon thin plate 110.

Figure 6I:
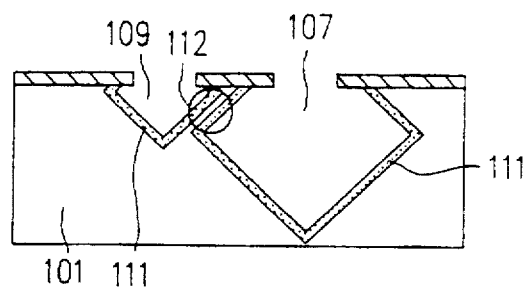
Figure 6H:
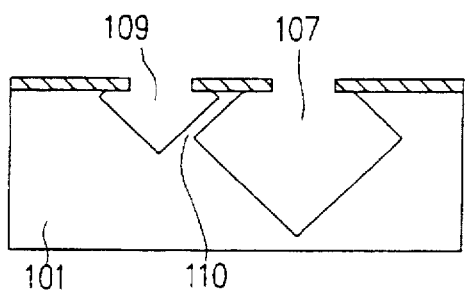
Figure 6J:
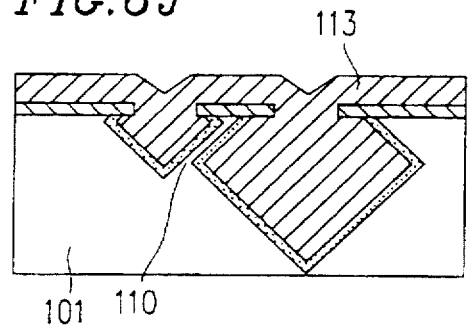
Figure 6K:
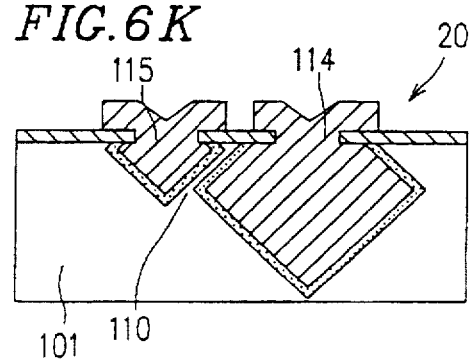

Then, the silicon oxide films 111, the first electrode 114 and the second electrode 115 are formed in the same manner as described in the first example (FIGS. 6I through 6K).

In this manner, the resonance tunneling diode 20 in the second example according to the present invention having the double barrier structure 112 including the silicon oxide film 111 (acting as the tunneling barrier), the silicon thin plate 110 (acting as the quantum well) and the silicon oxide film 111 (acting as the tunneling barrier), and also including two terminals, namely, the first and the second electrodes 114 and 115 is produced. In the resonance tunneling diode 20, the double barrier structure 112 is preferably formed at a depth of 200 nm from the surface of the (001) silicon substrate 101.

The silicon oxide films 111 acting as the tunneling barriers may be formed by chemical deposition instead of thermal oxidation. The tunneling barrier may be formed of a nitride film which is formed by thermal nitriding in a nitrogen atmosphere or chemical deposition, a nitride oxide film, or a SiC film or a SiGe film which is formed of crystal growth.

The etching protection film 102 may be formed of any other material and by any other method so long as the film provides protection against an etchant. For example, the etching protection film 102 may be formed of a nitride film or a chrome film.

The substrate 101 may be formed of a p-type substrate, in which case the first and the second electrodes 114 and 115 are formed of polysilicon including a p-type impurity diffused therein.

The etchant for crystalline anisotropic etching may be a mixture liquid of hydrazine, isopropyl alcohol and pure water or an aqueous solution of potassium hydroxide.

Example 3

With reference to FIGS. 7A through 7H, a resonance tunneling diode in a third example according to the present invention will be described. FIGS. 7A through 7H are cross sectional views illustrating the steps of producing a resonance tunneling diode 30 in accordance with the third example.

The resonance tunneling diode 30 has basically the same configuration as that of the resonance tunneling diode 20 in accordance with the second example. Elements identical with those in the second example bear the identical reference numerals, and the explanations thereof will be omitted.

The main difference between the resonance tunneling diode 30 and the resonance tunneling diode 20 is that the thickness of a silicon oxide film 121 provided on the surface of the first groove 107 is different from the thickness of a silicon oxide film 122 provided on the surface of the second groove 109. Accordingly, the resonance tunneling diode 30 has an asymmetrical double barrier structure 112.

With reference to FIGS. 7A through 7H, a production method of the resonance tunneling diode 30 in this example will be described.

Figure 7A:
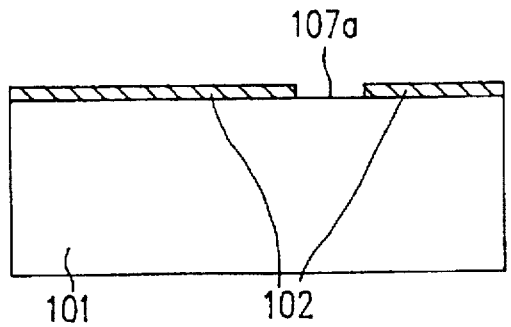
FIGS. 7A through 7H are cross sectional views illustrating the steps of producing a resonance tunneling diode in a third example according to the present invention.

As illustrated in FIG. 7A, the etching protection film 102 having the first opening 107a is formed in a thickness of 100 nm on the (001) silicon substrate 101 formed of an n-type silicon in the same manner as described in the second example. The first opening 107a is rectangular, and the sides thereof in the direction normal to the plane of the paper in FIG. 7A are parallel or perpendicular to the <110> crystal orientation of the (001) silicon substrate 101 with an error of ±1 degree.

Figure 7B:
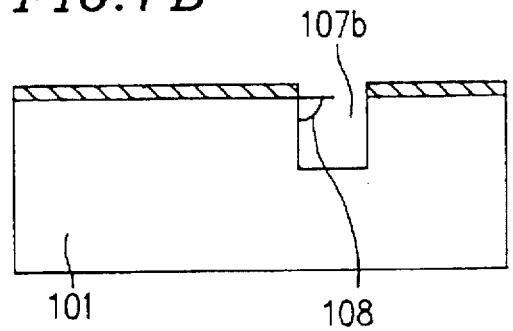

As shown in FIG. 7B, the groove 107b is formed in the (001) silicon substrate 101 in positional correspondence with the first opening 107a by dry etching using $SiCl_4$, $CH_2F_2$, $SF_6$, and $O_2$ as etching gases in the same manner as described in the second example. The groove 107b has a depth of 900 nm. The groove 107b is formed so that the depression angle 108 made by the surface of the (001) silicon substrate 101 and the side wall of the groove 107b is 90 degrees or more. In FIG. 7B, the depression angle 108 is 90 degrees.

Figure 7C:
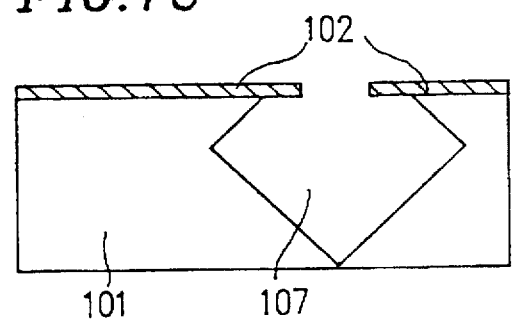

In the same manner described in the first and the second examples, the (001) silicon substrate 101 is treated with crystalline anisotropic etching using a mixture liquid of ethylene diamine ($NH_2(CH)_2NH_2$), pyrocatechol ($C_6H_4(OH)_2$) and pure water as an etchant. As a result, the groove 107b is formed into the first groove 107 having a substantially diamond-shaped cross section in the (001) silicon substrate 101 as illustrated in FIG. 7C.

Figure 7D:
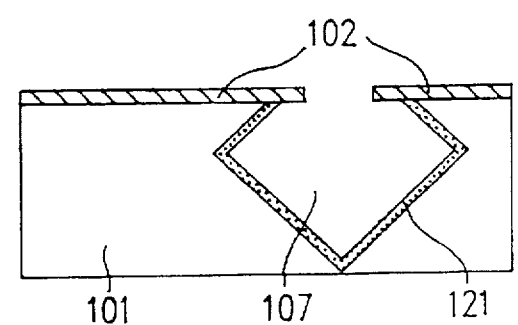

Then, the (001) silicon substrate 101 is thermally oxidized in an atmosphere of oxygen at a temperature of 900° C. By controlling the time period of oxidation, the silicon oxide film 121 having a thickness of 2 to 4 nm, preferably of 3 nm, is formed on the surface of the first groove 107 as shown in FIG. 7D.

Figure 7E:
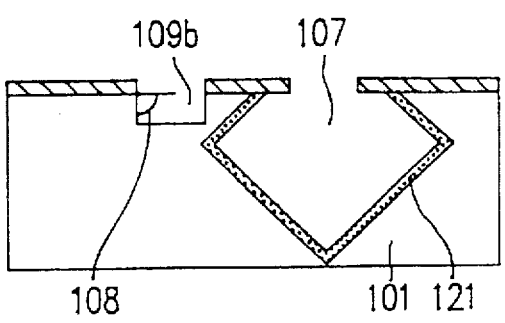
Figure 7F:
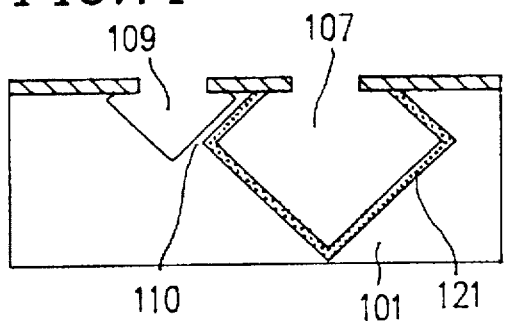

The etching protection film 102 is etched to form the second opening 109a which is also rectangular and parallel to the first opening 107a. Dry etching is performed in the same manner as that for forming the groove 107b to form the groove 109b in the (001) silicon substrate 101 in positional correspondence with the second opening 109a as shown in FIG. 7E. The groove 109b has a depth of 400 nm, and the depression angle made by the surface of the (001) silicon substrate 101 and the side wall of the groove 109b is 90 degrees or more. Next, crystalline anisotropic etching is performed in the same manner as that for forming the first groove 107 to form the groove 109b into the second groove 109 having a substantially diamond-shaped cross section in the (001) silicon substrate 101 as shown in FIG. 7F. As a result, a silicon thin plate 110 sandwiched between the first groove 107 and the second groove 109 is formed. Because the silicon oxide film 121 is on the surface of the first groove 107, an area of the (001) silicon substrate 101 surrounding the first groove 107 is not etched by the crystalline anisotropic etching. The surfaces of the first and the second grooves 107 and 109 are formed of a (111) plane.

Figure 7G:
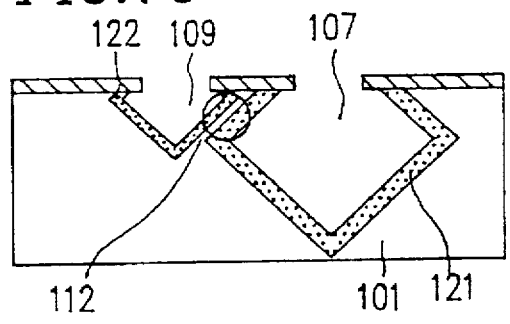

Next, the (001) silicon substrate 101 is thermally oxidized in an atmosphere of oxygen at a temperature of 900° C. By controlling the time period of oxidation, the silicon oxide film 122 having a thickness of 2 to 4 nm, preferably of 3 nm, is formed on the surface of the second groove 109. Since the silicon oxide film 121 is also oxidized during the oxidation for forming the silicon oxide film 122, the thickness of the silicon oxide film 121 on the surface of the first groove 107 is approximately doubled. Accordingly, the silicon oxide films 121 and 122 respectively having the thicknesses of 6 nm and 3 nm are formed on the two surfaces of the silicon thin film 110 as illustrated in FIG. 7G.

Figure 7H:
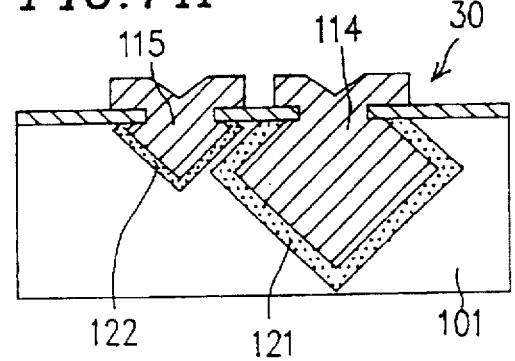

Then, the first electrode 114 and the second electrode 115 formed of polysilicon including an n-type impurity diffused therein at a high density are formed in the same manner as described in the first example (FIG. 7H).

In this manner, the resonance tunneling diode 30 in the third example according to the present invention having the double barrier structure 112 including the silicon oxide film 121 (acting as the tunneling barrier), the silicon thin plate 110 (acting as the quantum well) and the silicon oxide film 122 (acting as the tunneling barrier), and also including two terminals, namely, the first and the second electrodes 114 and 115 is produced.

The silicon oxide films 121 and 122 acting as the tunneling barriers may be formed by chemical deposition instead of thermal oxidation. The tunneling barrier may be formed of a nitride film which is formed by thermal nitriding in a nitrogen atmosphere or chemical deposition, a nitride oxide film, or a SiC film or a SiGe film which is formed of crystal growth.

The etching protection film 102 may be formed of any other material and by any other method so long as the film provides protection against an etchant. For example, the etching protection film 102 may be formed of a nitride film or a chrome film.

The substrate 101 may be formed of a p-type substrate, in which case the first and the second electrodes 114 and 115 are formed of polysilicon including a p-type impurity diffused therein.

The etchant for crystalline anisotropic etching maybe a mixture liquid of hydrazine, isopropyl alcohol and pure water or an aqueous solution of potassium hydroxide.

A resonance tunneling diode 10 described in the first example may have such an asymmetrical double barrier structure as described in this example. In such a case, after the second opening 109a is formed, crystalline anisotropic etching is performed without forming the groove 109b by dry etching (FIG. 7E). In this manner, the second groove 109 having a V-shaped cross section is formed. Thereafter, the processes shown in FIGS. 7G and 7H are performed.

Example 4

Figure 8:
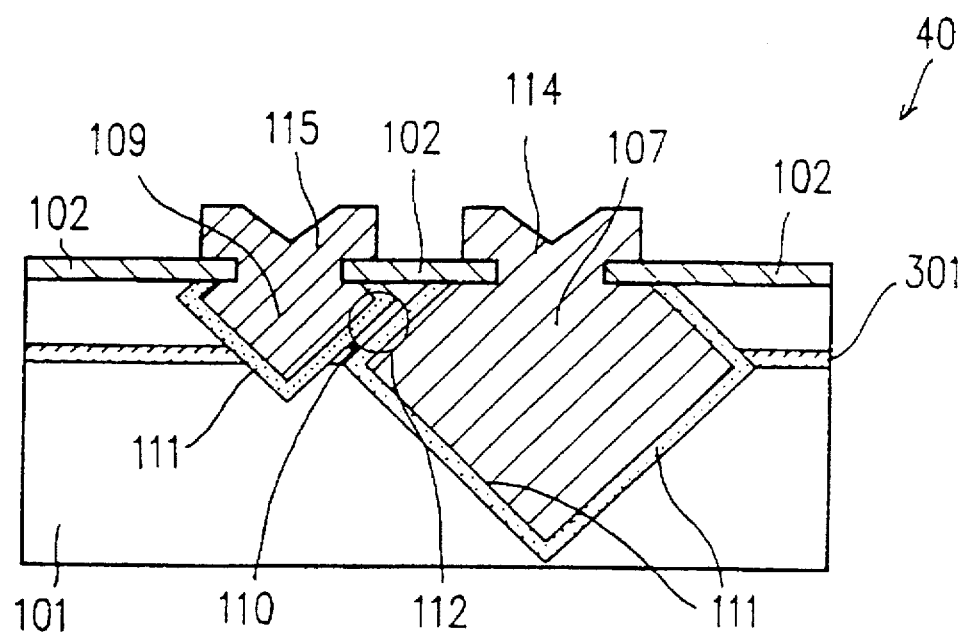
FIG. 8 is a cross sectional view of a resonance tunneling diode in a fourth example according to the present invention.

With reference to FIGS. 8 and 9A through 9I, a resonance tunneling diode in a fourth example according to the present invention will be described. FIG. 8 is a cross sectional view of a resonance tunneling diode 40 in the fourth example, and FIGS. 9A through 9I are cross sectional views illustrating the steps of producing the resonance tunneling diode 40. The resonance tunneling diode 40 has basically the same configuration with that of the resonance tunneling diode 10 in accordance with the first example. Elements identical with those in the first example bear the identical reference numerals, and the explanations thereof will be omitted.

The main difference between the resonance tunneling diode 40 and the resonance tunneling diode 10 is that a p-type impurity layer 301 is provided in the (001) silicon substrate 101.

The p-type impurity layer 301 is located at around a depth where the silicon thin plate 110 contacts the (001) silicon substrate 101, namely, at the lowermost portion of the silicon thin plate 110, and electrically isolates the silicon thin plate 110 acting as the quantum well from the (001) silicon substrate 101. Because of such a configuration, the resonance tunneling diode 40, including the double barrier structure 112 and the first and the second electrodes 114 and 115, prohibits generation of electric current leakage through the (001) silicon substrate 101.

With reference to FIGS. 9A through 9I, a production method of the resonance tunneling diode 40 in this example will be described.

Figure 9A:
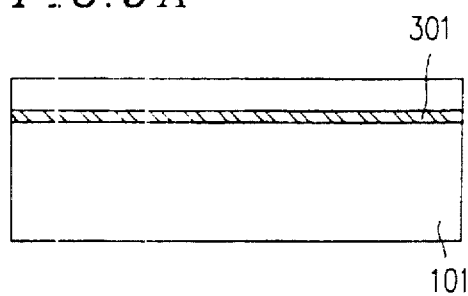
FIGS. 9A through 9I are cross sectional views illustrating the steps of producing the resonance tunneling diode in accordance with the fourth example.
Figure 9F:
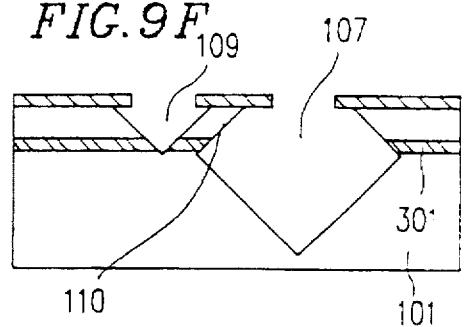
Figure 9B:
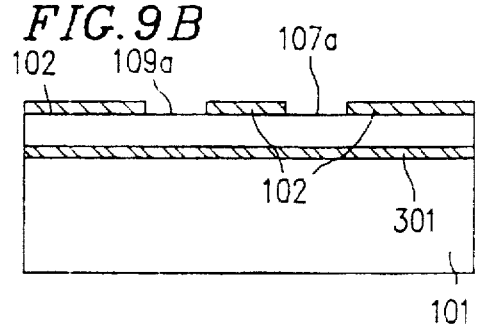
Figure 9G:
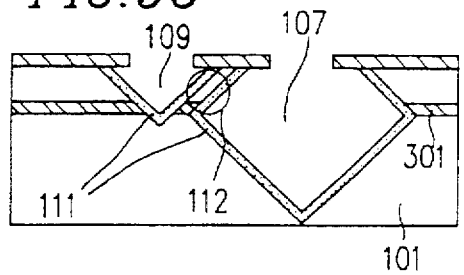
Figure 9C:
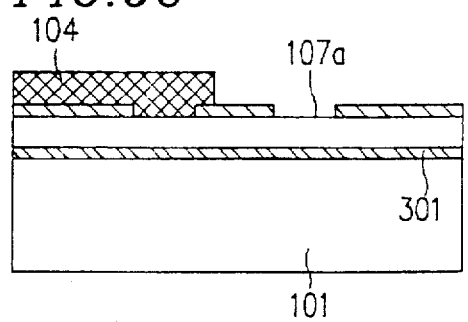
Figure 9H:
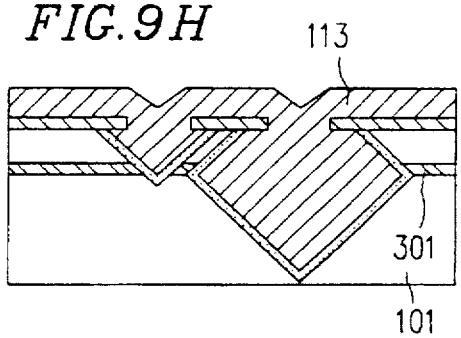
Figure 9D:
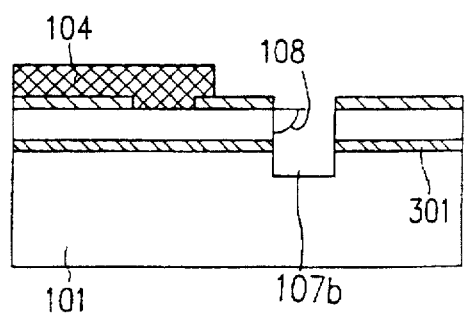
Figure 9I:
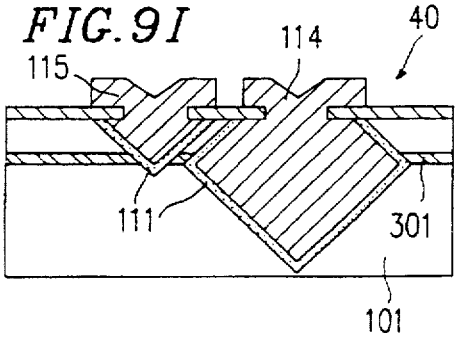
Figure 9E:
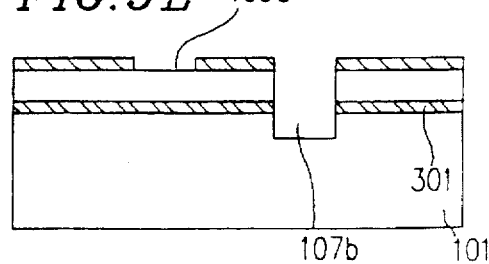

First, boron ions as a p-type impurity are implanted into the n-type (001) silicon substrate 101 at an acceleration energy of 200 keV in a dose of $1 \times 10^{15}$ cm$^{-2}$. Next, annealing is performed at a temperature of 900° C. for 20 minutes to form the p-type impurity layer 301 having a thickness of approximately 200 nm at around a depth of approximately 500 nm from the surface of the (001) silicon substrate 101 as illustrated in FIG. 9A.

After that, by the processes described in the first examples (shown in FIGS. 9B through 9I), the resonance tunneling diode 40 in the fourth example according to the present invention having the double barrier structure 112 including the silicon oxide film 111 (acting as the tunneling barrier), the silicon thin plate 110 (acting as the quantum well) and the silicon oxide film 111 (acting as the tunneling barrier), and also including two terminals, namely, the first and the second electrodes 114 and 115 is produced.

The resonance tunneling diodes 20 and 30 described in the second and the third examples may have such a p-type impurity layer 301. The same effect can be obtained. In any of the above-described diodes, an n-type impurity layer may be provided in a p-type (001) silicon substrate.

In the case when a p-type substrate is used as the (001) silicon substrate 101, phosphorus ions as an n-type impurity are implanted at an acceleration energy of 400 keV in a dose of $1 \times 10^{15}$ cm$^{-2}$, and annealing is performed at a temperature of 900° C. for 20 minutes. In this manner, an n-type layer having a thickness of approximately 400 nm is formed at around a depth of approximately 500 nm from the surface of the (001) silicon substrate 101.

The silicon oxide films 111 acting as the tunneling barriers may be formed by chemical deposition instead of thermal oxidation. The tunneling barrier may be formed of a nitride film which is formed by thermal nitriding in a nitrogen atmosphere or chemical deposition, a nitride oxide film, or a SiC film or a SiGe film which is formed of crystal growth.

The etching protection film 102 may be formed of any other material and by any other method so long as the film provides protection against an etchant. For example, the etching protection film 102 may be formed of a nitride film or a chrome film.

The etchant for crystalline anisotropic etching may be a mixture liquid of hydrazine, isopropyl alcohol and pure water or an aqueous solution of potassium hydroxide.

Example 5

With reference to FIGS. 10A through 10I, a resonance tunneling diode in a fifth example according to the present invention will be described. FIGS. 10A through 10I are cross sectional views illustrating the steps of producing a resonance tunneling diode 50 in accordance with the fifth example. The resonance tunneling diode 50 has basically the same configuration with that of the resonance tunneling diode 10 in accordance with the first example. Elements identical with those in the first example bear the identical reference numerals and the explanations thereof will be omitted.

The main difference between the resonance tunneling diode 50 and the resonance tunneling diode 10 is that an impurity layer 141 having an opposite conductivity to that of the (001) silicon substrate 101 is provided on each of the surfaces of the first and the second grooves 107 and 109, except for the areas acting as the surfaces of the silicon thin plate 110. Hereinafter, such surfaces will be referred to as the "bottom surfaces" of the first and the second grooves 107 and 109. On each of the impurity layers 141, a silicon oxide film 142 having a larger thickness than that of the silicon oxide film 111 in the first example is provided by an oxidation acceleration effect, namely, a phenomenon that formation of an oxide film is accelerated when conducted on an impurity layer. Due to such a configuration, the (001) silicon substrate 101 is electrically isolated from the first and the second electrodes 114 and 115 by the impurity layer 141 and the thick silicon oxide film 142. Accordingly, electric current leakage through the (001) silicon substrate 101 is restricted.

With reference to FIGS. 10A through 10I, a production method of the resonance tunneling diode 50 in this example will be described.

As illustrated in FIGS. 10A through 10E, the etching protection film 102 is formed on the (001) silicon substrate 101; and the first and the second grooves 107 and 109, and the silicon thin plate 110 are formed in the (001) silicon substrate 101 in the same manner described in the first example with reference to FIGS. 4A through 4F.

Figure 10A:
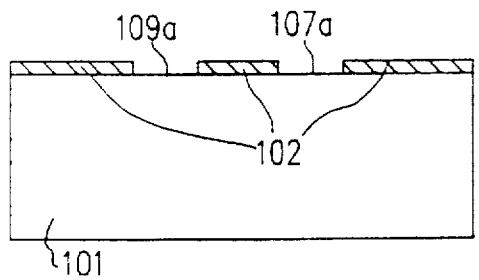
FIGS. 10A through 10I are cross sectional views illustrating the steps of producing a resonance tunneling diode in a fifth example according to the present invention.
Figure 10B:
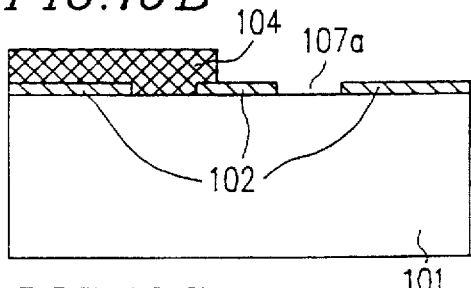
Figure 10C:
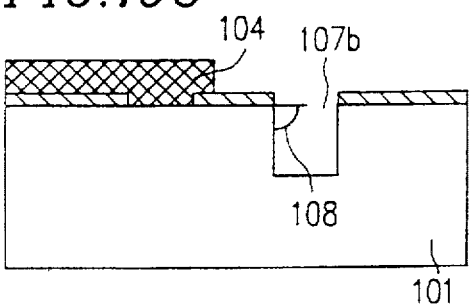
Figure 10D:
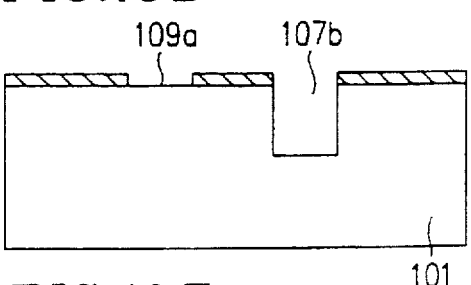
Figure 10E:
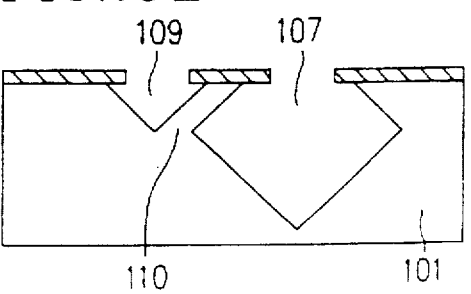
Figure 10F:
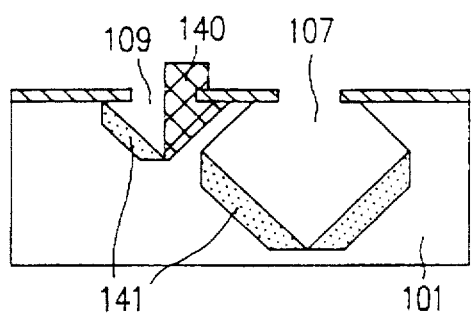

As shown in FIG. 10F, a resist mask 140 filling half of the groove 109 which is closer to the first groove 107 than the other half is formed. Next, boron ions are implanted into the (001) silicon substrate 101 at an acceleration energy of 100 keV in a dose of $2 \times 10^{13}$ cm$^{-2}$ in a direction normal to the surface of the (001) silicon substrate 101 and directions which are offset by 30 degrees, 60 degrees and 120 degrees from the normal direction. In this manner, the p-type impurity layers 141 are formed on the bottom surfaces of the first and the second grooves 107 and 109. Because of the resist mask 140 and the above-mentioned implantation directions of the boron ions, the p-type impurity layer 141 is not formed on the two surfaces of the silicon thin plate 110.

Figure 10G:
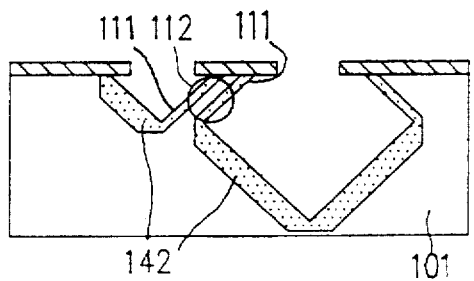

After the resist mask 140 is removed, thermal oxidation is performed at a temperature of 900° C. in an oxygen atmosphere to form silicon oxide films on the surfaces of the first and the second grooves 107 and 109 as illustrated in FIG. 10G. On the two surfaces of the silicon thin plate 110, the silicon oxide films 111 are each formed in a thickness of 2 to 4 nm, preferably of 3 nm as is described in the first example. On the bottom surfaces of the first and the second grooves 107 and 109 provided with the p-type impurity layers 141, the silicon oxide films 142 each having a thickness of 10 nm are formed because of the oxidation acceleration effect. The p-type impurity layers 141 are not shown in FIGS. 10G through 10I.

Figure 10H:
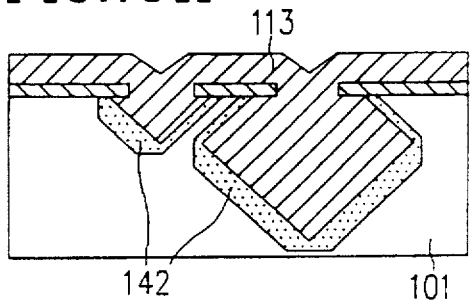
Figure 10I:
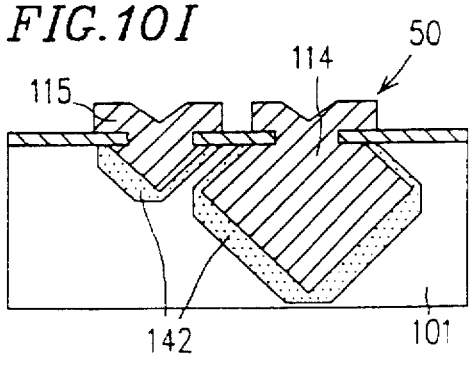

Next, as shown in FIGS. 10H and 10I, the first and the second electrodes 114 and 115 are formed in the same manner as described in the first example with reference to FIGS. 4H and 4I. The first and the second electrodes 114 and 115 are formed of polysilicon including an n-type impurity diffused therein.

In this manner, the resonance tunneling diode 50 in the fifth example according to the present invention having the double barrier structure 112 including the silicon oxide film 111 (acting as the tunneling barrier), the silicon thin plate 110 (acting as the quantum well) and the silicon oxide film 111 (acting as the tunneling barrier), and also including two terminals, namely, the first and the second electrodes 114 and 115 is produced.

A p-type substrate may be used as the (001) silicon substrate 101, in which case, the first and the second electrodes 114 and 115 are formed of polysilicon including a p-type impurity diffused therein. In such a case, the impurity layer 141 is formed by implanting n-type ions such as phosphorus ions or arsenic ions.

The etching protection film. 102 may be formed of any other material and by any other method so long as the film provides protection against an etchant. For example, the etching protection film 102 may be formed of a nitride film or a chrome film.

The etchant for crystalline anisotropic etching may be a mixture liquid of hydrazine, isopropyl alcohol and pure water or an aqueous solution of potassium hydroxide.

The resonance tunneling diodes 20, 30 and 40 in accordance with the second, third and fourth examples may have the impurity layer described in the fifth example on the bottom surfaces of the first and the second grooves 107 and 109.

Figure 11A:
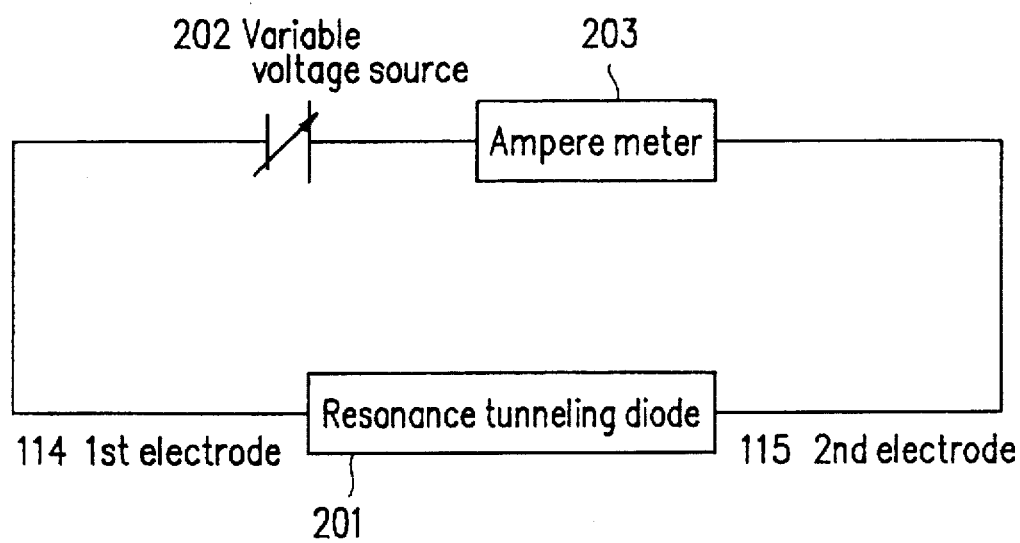
FIG. 11A is a circuit diagram of a circuit for measuring the V-I characteristic of resonance tunneling diodes.
Figure 11B:
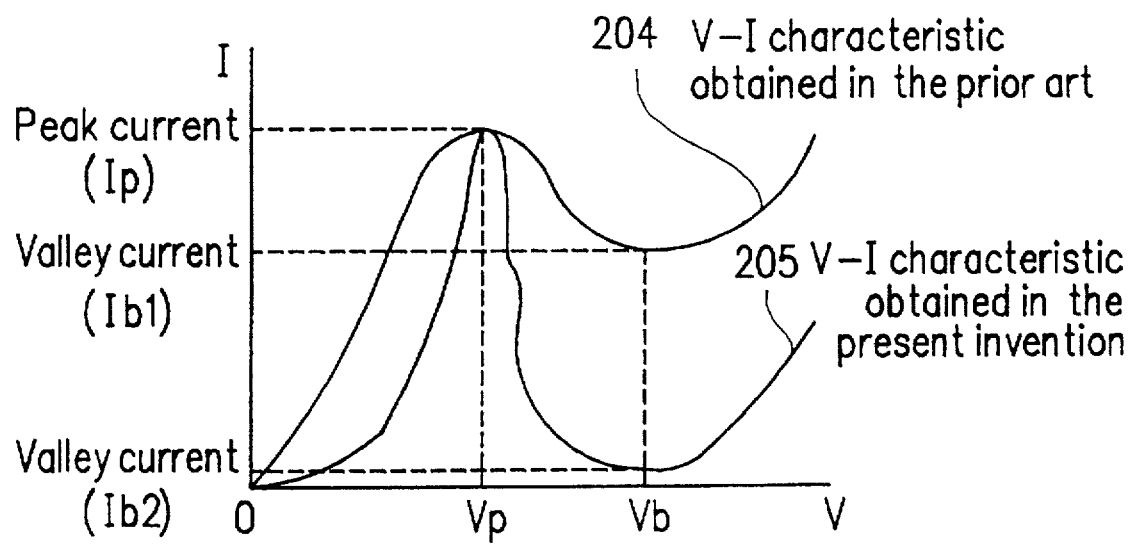
FIG. 11b is a graph illustrating the V-I characteristics of the resonance tunneling diode in accordance with the fifth example and a conventional resonance tunneling diode.

The resonance tunneling diode 50 in accordance with the fifth example of the present invention and a conventional resonance tunneling diode will be compared in terms of the V-I characteristics. FIG. 11A is a circuit diagram of a circuit used for measuring the V-I characteristics, and FIG. 11b is a graph illustrating the V-I characteristics of the resonance tunneling diode 50 (represented by curve 205) and the conventional resonance tunneling diode (represented by curve 204). For the sake of convenience, both of the resonance tunneling diodes are indicated by reference numeral 201 in FIG. 11A, and the reference numerals 114 and 115 are used for the first and the second electrodes of both of the resonance tunneling diodes.

The measurement is performed in the following manner.

The first and the second electrodes 114 and 115 of the resonance tunneling diode 201 are supplied with a voltage while increasing the level of the voltage by a variable voltage source 202, and the level of the current flowing in the resonance tunneling diode 201 is measured by an ampere meter 203. The curves representing the obtained V-I characteristics include a part which shows the negative resistance characteristic.

In FIG. 11B, the peak current (Ip) is obtained when the quantization level of the electronic energy equals the Fermi level of electrons in the first and the second electrodes 114 and 115. When a higher voltage than the voltage which provides the peak current is applied to the resonance tunneling diode 201, the resonance tunneling diode 201 exhibits the negative resistance characteristic; that is, the current level is reduced to the valley current (Ib1 in the case of the conventional diode or Ib2 in the case of the diode 50 according to the fifth example) in correspondence with the increase in the voltage.

As is apparent from curves 205 (fifth example) and 204 (conventional example), the peak current (Ip) is obtained at the same voltage (namely, Vp) and the valley current is also obtained at the same voltage (namely, Vb) in both of the resonance tunneling diodes. Assuming that the peak currents of both of the diodes are equal, the P/V ratio which is the ratio of the peak current (Ip) relative to the valley current (Ib1 or Ib2) is larger in the case of the fifth example than in the case of the conventional example. This indicates that the current leakage is smaller and thus the operation is more stable in the diode according to the fifth example than the diode in the conventional example.

Example 6

With reference to FIGS. 12A through 12D, a resonance tunneling diode in a sixth example according to the present invention will be described. FIGS. 12A through 12D are cross sectional views illustrating the steps of producing a resonance tunneling diode 60 in accordance with the sixth example. The resonance tunneling diode 60 has basically the same configuration with that of the resonance tunneling diode 10 in accordance with the first example. Elements identical with those in the first example bear the identical reference numerals and the explanations thereof will be omitted.

The main difference between the resonance tunneling diode 60 and the resonance tunneling diode 10 is that an impurity layer 401 is provided in the (001) silicon substrate 101. The impurity layer 401 has an opposite conductivity to that of the (001) silicon substrate 101. In such a configuration, the silicon thin plate 110 is provided in the impurity layer 401.

With reference to FIGS. 12A through 12D, a production method of the resonance tunneling diode 60 in this example will be described.

Figure 12A:
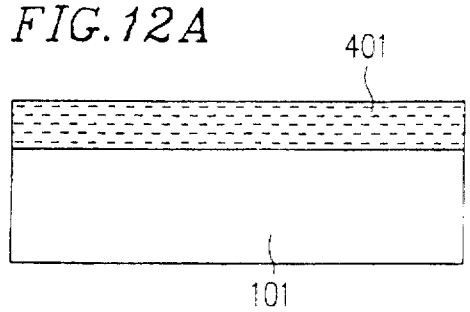
FIGS. 12A through 12D are cross sectional views illustrating the steps of producing a resonance tunneling diode in a sixth example according to the present invention.

First, phosphorus ions as an n-type impurity are implanted into the p-type (001) silicon substrate 101 at an acceleration energy of 250 keV in a dose of $1 \times 10^{15}$ cm$^{-2}$. Next, annealing is performed at a temperature of 900° C. for 30 minutes to form the n-type impurity layer 401 having a thickness of approximately 400 nm immediately below the surface of the (001) silicon substrate 101 as illustrated in FIG. 12A.

Figure 12B:
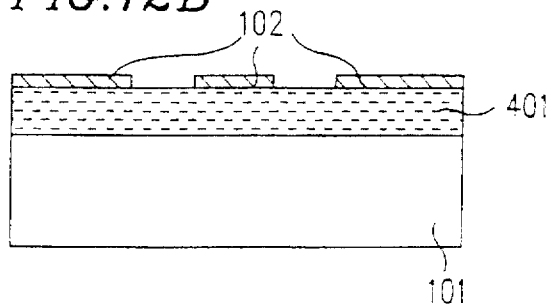
Figure 12C:
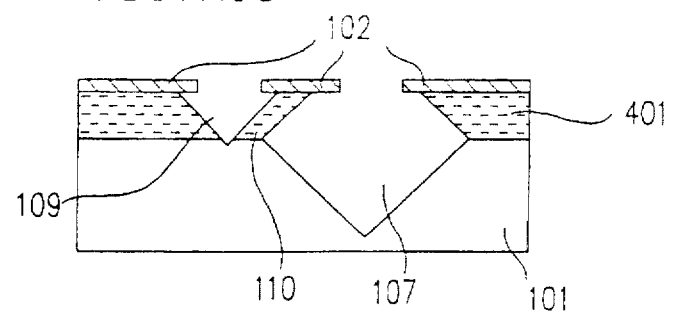
Figure 12D:
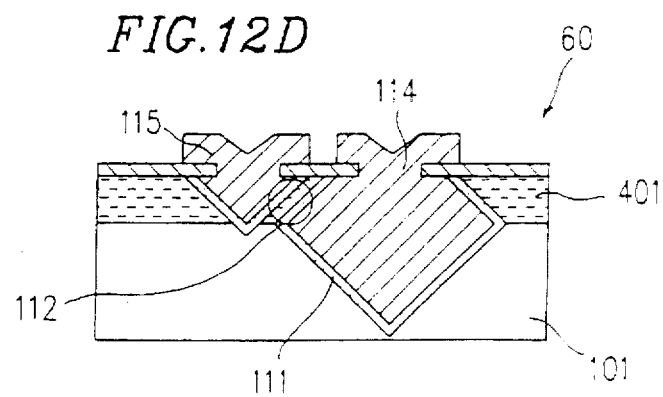

After that, by the processes shown in FIGS. 12B through 12D described in the first example with reference to FIG. 4B through 4I, the resonance tunneling diode 60 in the sixth example according to the present invention having the double barrier structure 112 including the silicon oxide film 111 (acting as the tunneling barrier), the silicon thin plate 110 (acting as the quantum well) and the silicon oxide film 111 (acting as the tunneling barrier), and also including two terminals, namely, the first and the second electrodes 114 and 115 is produced.

As illustrated in FIG. 12D, the silicon thin plate 110, which is a part of the double barrier structure 112, is formed in the impurity layer 401, and the impurity layer 401 and the (001) silicon substrate 101 form a P/N junction. In the resonance tunneling diode 60 having such a configuration, current leakage from the double barrier structure 112 to the (001) silicon substrate 101 can be restricted by applying an inverted bias voltage between the (001) silicon substrate 101 and the impurity layer 401.

An n-type substrate may be used as the (001) silicon substrate 101, in which case, the impurity layer 401, and the first and the second electrodes 114 and 115 include a p-type impurity diffused therein.

The resonance tunneling diodes 20 and 30 in accordance with the second and the third examples may have the impurity layer 401.

The silicon oxide films 111 acting as the tunneling barriers may be formed by chemical deposition instead of thermal oxidation. The tunneling barrier may be formed of a nitride film which is formed by thermal nitriding in a nitrogen atmosphere or chemical deposition, a nitride oxide film, or a SiC film or a SiGe film which is formed of crystalline growth.

The etching protection film 102 may be formed of any other material and by any other method so long as the film provides protection against an etchant. For example, the etching protection film 102 may be formed of a nitride film or a chrome film.

The etchant for crystalline anisotropic etching may be a mixture liquid of hydrazine, isopropyl alcohol and pure water or an aqueous solution of potassium hydroxide.

Example 7

Figure 13A:
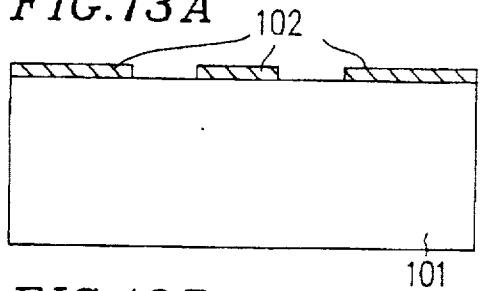
FIGS. 13A through 13H are cross sectional views illustrating the steps of producing a resonance tunneling diode in a seventh example according to the present invention.
Figure 13B:
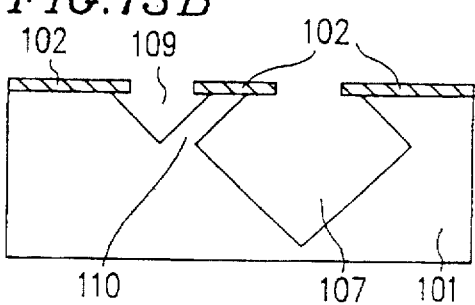
Figure 13F:
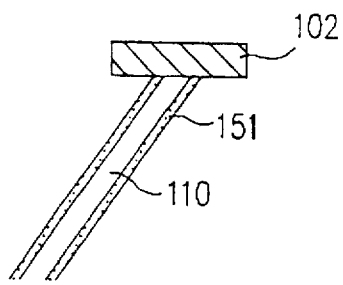
Figure 13C:
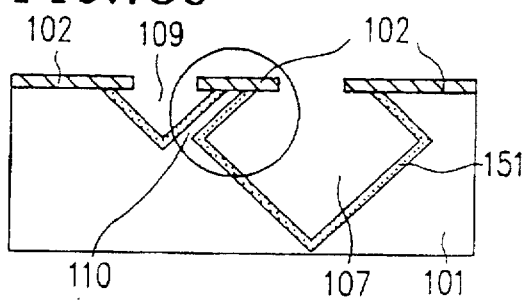
Figure 13G:
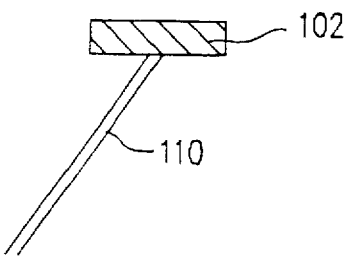
Figure 13D:
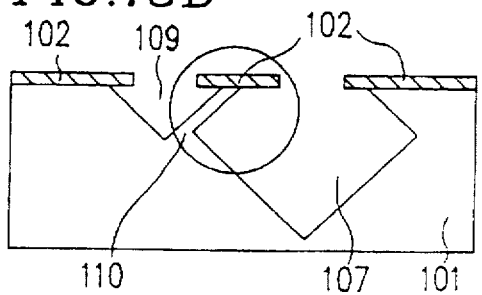
Figure 13H:
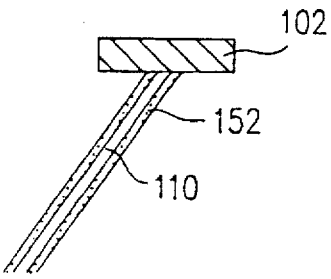

With reference to FIGS. 13A through 13H, a resonance tunneling diode in a seventh example according to the present invention will be described. FIGS. 13A through 13E are cross sectional views illustrating the steps of producing a resonance tunneling diode in accordance with the seventh example. FIGS. 13F, 13G and 13H are enlarged cross sectional views of: the silicon thin plate 110 and the vicinity thereof, respectively corresponding to the steps shown in FIGS. 13C, 13D and 13E (the circled parts in the respective figures). The resonance tunneling diode in the seventh example has basically the same configuration with that of the resonance tunneling diode 10 in accordance with the first example. Elements identical with those in the first example bear the identical reference numerals, and the explanations thereof will be omitted.

The main difference between the resonance tunneling diode in the seventh example and the resonance tunneling diode 10 is that the silicon thin plate 110 has a thickness of 10 nm, which is less than 20 to 50 nm in the case of the resonance tunneling diode 10.

With reference to FIGS. 13A through 13H, a production method of the resonance tunneling diode in the seventh example, by which the thickness of the silicon thin plate 110 can be accurately controlled to be small, will be described.

As shown in FIG. 13A and 13B, the silicon thin plate 110, having a thickness of 30 nm sandwiched between the first and the second grooves 107 and 109, is formed in the (001) silicon substrate 101 in the same manner as described in the first example with reference to FIGS. 4A through 4F.

By the following manner, the thickness of the silicon thin plate 110 is decreased to an extent which is impossible to realize by crystalline anisotropic etching.

Figure 13E:
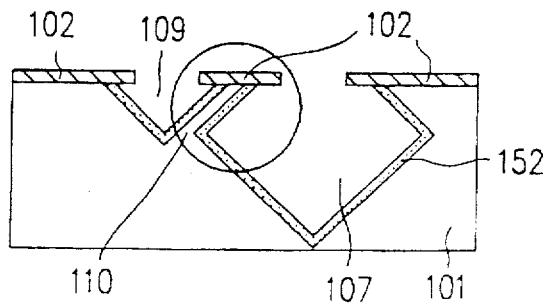

Thermal oxidation is performed at a temperature of 90° C. for 20 minutes to form first silicon oxide films 151 each having a thickness of 10 nm on the surfaces of the first and the second grooves 107 and 109 including the areas acting as the two surfaces of the silicon thin plate 110 as illustrated in FIGS. 13C and 13F. Next, as illustrated in FIG. 13D and 13G, the first silicon oxide films 151 are removed by etching using hydrogen fluoride. Thermal oxidation is again performed under the same conditions as mentioned above to form second silicon oxide films 152, each having a thickness of 3 nm on the surfaces of the first and the second grooves 107 and 109 including the areas acting as the two surfaces of the silicon thin plate 110 as illustrated in FIGS. 13E and 13H. By such repetition of oxidation and removal of the oxide films, the thickness of the silicon thin plate 110 is decreased down to as thin as 10 nm.

Although not shown, after the above-described process, the first and the second electrodes 114 and 115 formed of polysilicon including an n-type impurity diffused therein are formed in the (001) silicon substrate 101 in the same manner as described in the first example.

In this manner, the resonance tunneling diode in the seventh example according to the present invention having the double barrier structure 112 including the silicon oxide film 152 (acting as the tunneling barrier), the silicon thin plate 110 (acting as the quantum well) and the silicon oxide film 152 (acting as the tunneling barrier), and also including two terminals, namely, the first and the second electrodes 114 and 115 is produced.

Since the thin silicon layer 110 acting as the quantum well in this example is thinner than those in the resonance tunneling diodes in the previous examples, the pitch between resonance levels is larger than those in the previous examples. Therefore, the resonance tunneling diode in the seventh example exhibits the negative resistance characteristic more explicitly, and thus is operated more stably than the diodes in the previous examples.

A p-type substrate may be used as the (001) silicon substrate 101, in which case, the first and the second electrodes 114 and 115 are formed of polysilicon including a p-type impurity diffused therein.

The etching protection film 102 may be formed of any other material and by any other method so long as the film provides protection against an etchant. For example, the etching protection film 102 may be formed of a nitride film or a chrome film.

The etchant for crystalline anisotropic etching may be a mixture liquid of hydrazine, isopropyl alcohol and pure water or an aqueous solution of potassium hydroxide.

The resonance tunneling diodes 20–60 in accordance with the second through sixth examples may have such a thin silicon thin plate 110 as mentioned in the seventh example.

Example 8

Figure 14:
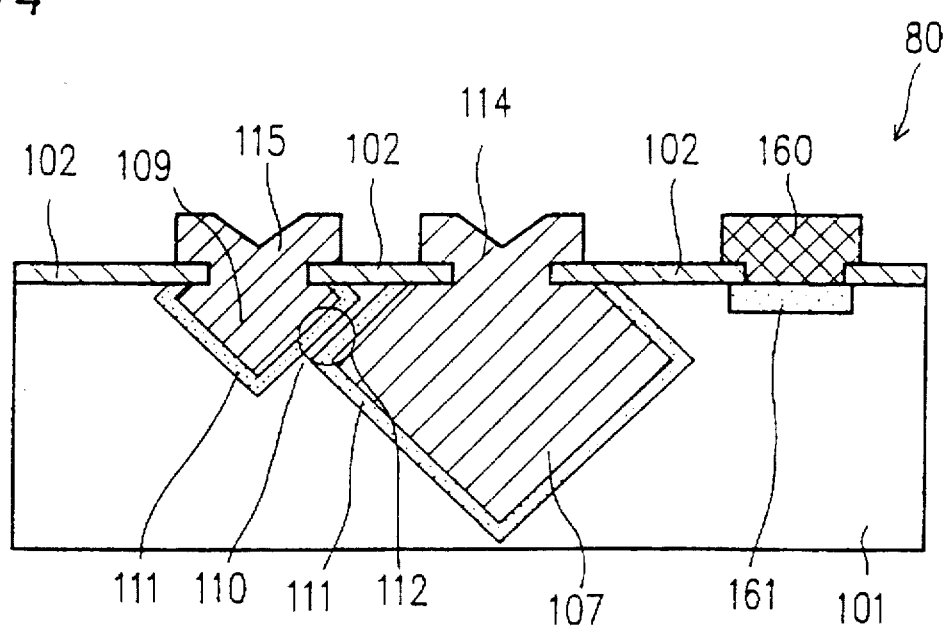
FIG. 14 is a cross sectional view of a hot electron transistor in an eighth example according to the present invention.

With reference to FIGS. 14 and 15A through 15J, a hot electron transistor in an eighth example according to the present invention will be described. FIG. 14 is a cross sectional view of a hot electron transistor 80 in accordance with the eighth example, and FIGS. 15A through 15J are cross sectional views illustrating the steps of producing the hot electron transistor 80. The hot electron transistor 80 includes the configuration of the resonance tunneling diode 10 described in the first example and further a third electrode 160. Elements identical with those in the first example bear the identical reference numerals and the explanations thereof will be omitted.

As mentioned above, the hot electron transistor 80 includes the third electrode 160 in order to operate as a three-terminal device. The third electrode 160 is located in the vicinity of the first and the second electrodes 114 and 115, and is electrically connected with the (001) silicon substrate 101 and further is connected with the silicon thin plate 110 through a contact diffusion layer 161 which includes an impurity diffused therein, the impurity having an identical conductivity with that of the (001) silicon substrate 101. In the hot electron transistor 80 having such a configuration, the first and the second electrodes 114 and 115 respectively act as a collector and an emitter, the silicon thin plate 110 acts as a base, and the third electrode 160 acts as a base electrode.

With reference to FIGS. 15A through 15J, a production method of the hot electron transistor 80 in this example will be described.

As illustrated in FIG. 15A through 15H, the configuration of the resonance tunneling diode 10 is formed in the same manner as described in the first example referring to FIGS. 4A through 4I.

Figure 15A:
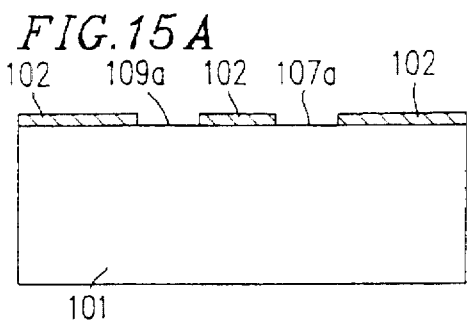
FIGS. 15A through 15J are cross sectional views illustrating the steps of producing the hot electron transistor in accordance with the eighth example.
Figure 15F:
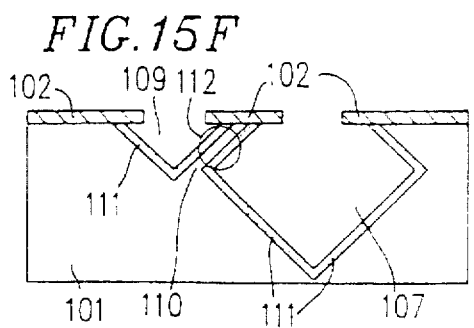
Figure 15B:
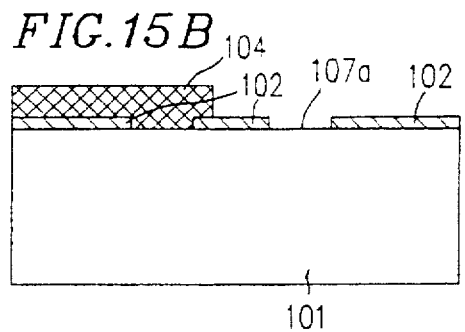
Figure 15G:
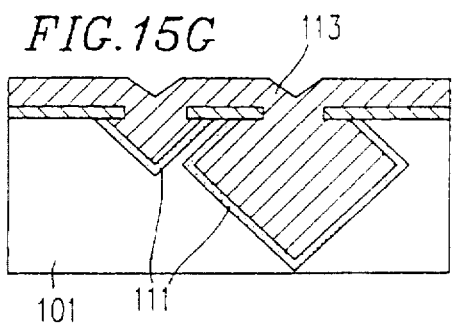
Figure 15C:
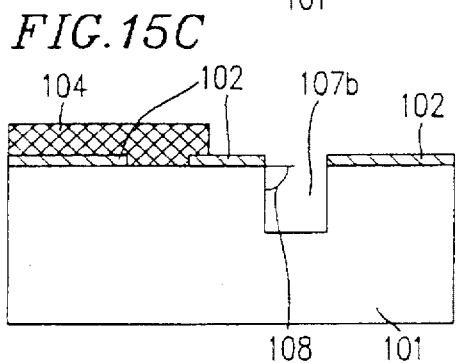
Figure 15H:
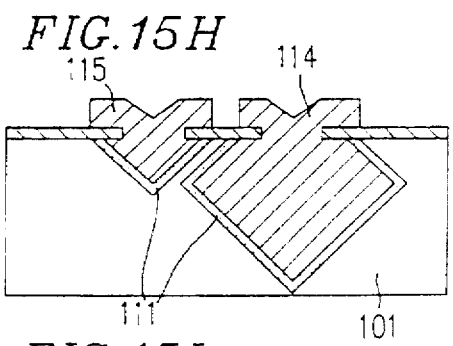
Figure 15D:
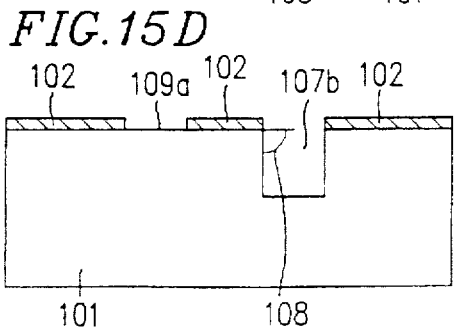
Figure 15I:
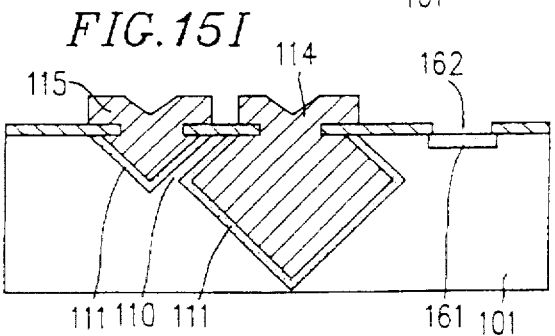
Figure 15E:
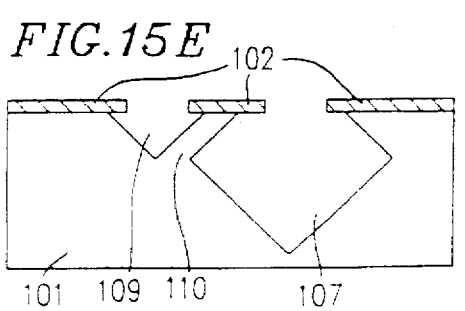
Figure 15J:
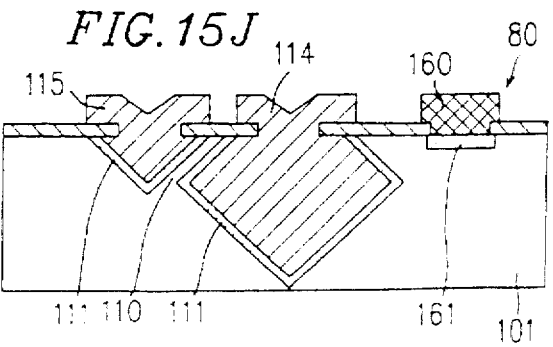

After formation of the first and the second electrodes 114 and 115 shown in FIG. 15H, an etching mask (not shown) is formed on the etching protection film 102 by photolithography. Dry etching is performed under the same conditions as used for forming the openings 107a and 109a in the etching protection film 102 (FIG. 15A) to form a contact window 162 in the etching protection film 102 using the etching mask as illustrated in FIG. 15I. After that, an impurity having an identical conductivity with that of the (001) silicon substrate 101 is diffused into the (001) silicon substrate 101 through the contact window 162 to form the contact diffusion layer 161. Formation of the contact diffusion layer 161 may be realized by, for example, ion implantation and impurity diffusion. In this example, arsenic ions are implanted into the (001) silicon substrate 101 at an acceleration energy of 40 keV in a dose of $4 \times 10^{15}$ cm$^{-2}$. Then, annealing is performed at a temperature of 900° C. for 20 minutes so as to form the contact diffusion layer 161. Next, the third electrode 160 is formed of, for example, aluminum so as to be in ohmic contact with the contact diffusion layer 161 as illustrated in FIG. 15J. The third electrode 160 may be formed of polysilicon including an impurity diffused therein, the impurity having an identical conductivity with that of the first and the second electrodes 114 and 115.

In this manner, the hot electron transistor 80 in the eighth example according to the present invention having the double barrier structure 112 including the silicon oxide film 111 (acting as the tunneling barrier), the silicon thin plate 110 (acting as the quantum well) and the silicon oxide film 111 (acting as the tunneling barrier), and also including three terminals, namely, the first and the second electrodes 114 and 115 and the third electrode 160 electrically connected with the (001) silicon substrate 101 and the silicon thin plate 110 through the contact diffusion layer 161 is produced.

The hot electron transistor 80 is produced of only silicon materials, which are generally used in the field of semiconductor and are also suitable for mass production and are inexpensive. The hot electron transistor 80 in accordance with this example can be produced using the conventional semiconductor technologies mainly handling silicon materials, and accordingly production cost is low, and the production efficiency is high.

Since the hot electron transistor 80 has the double barrier structure 112, which is similar to any one of those used in the first through seventh examples, the same effects can be obtained.

The hot electron transistor 80 may include the configuration of any of the resonance tunneling diodes in the second, third, fifth, and seventh examples in combination with the third electrode 160. In each case, the hot electron transistor 80 has the same effects as described above in relation with each of the examples. The conductivity of the substrate 101, the contact diffusion layer 161, and the impurity diffused into the electrodes 114, 115 and 160 and into the contact diffusion layer 161 may either a p-type or an n-type as far as the conductivity of these elements is the same.

The silicon oxide films 111 acting as the tunneling barriers may be formed by chemical deposition instead of thermal oxidation. The tunneling barrier may be formed of a nitride film which is formed by thermal nitriding in a nitrogen atmosphere or chemical deposition, a nitride oxide film, or a SiC film or a SiGe film which is formed of crystalline growth.

The etching protection film 102 may be formed of any other material and by any other method so long as the film provides protection against an etchant. For example, the etching protection film 102 may be formed of a nitride film or a chrome film.

The etchant for crystalline anisotropic etching may be a mixture liquid of hydrazine, isopropyl alcohol and pure water or an aqueous solution of potassium hydroxide.

Example 9

Figure 16:
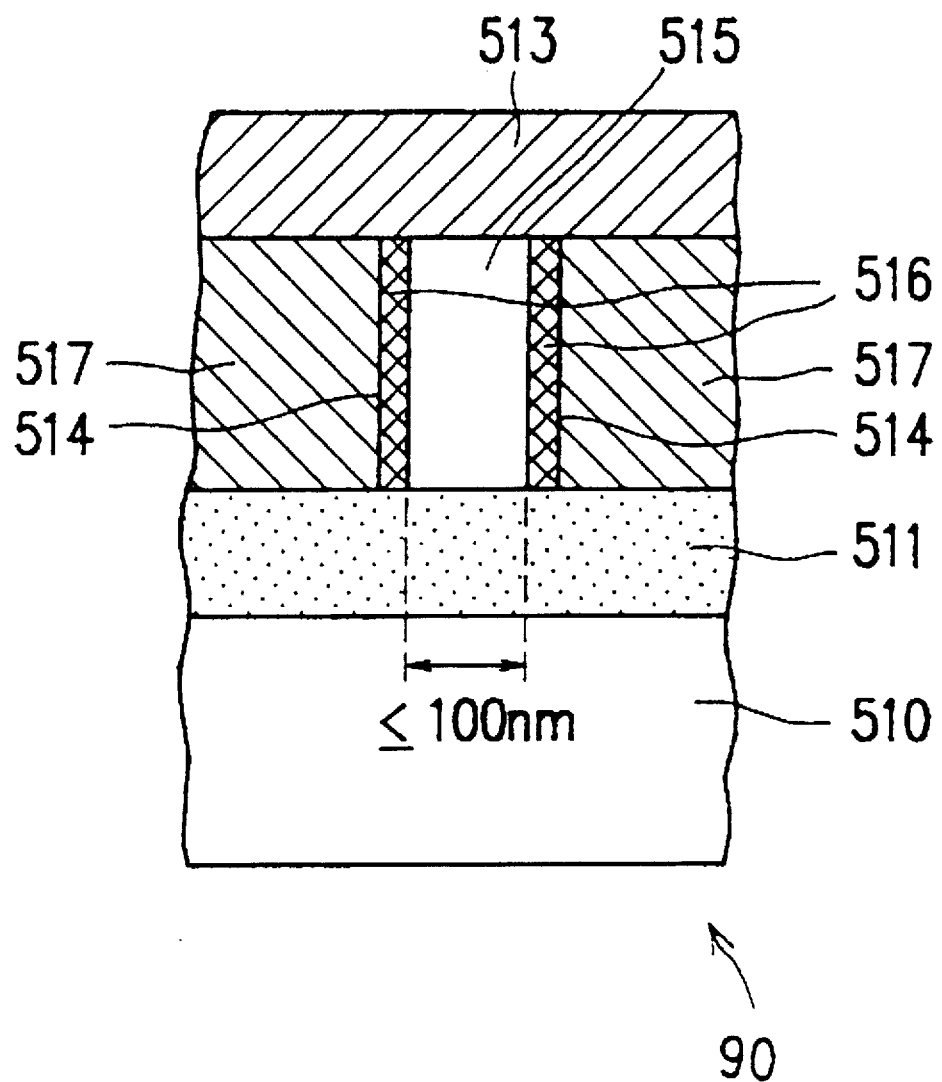
FIG. 16 is a partial cross sectional view schematically illustrating a resonance tunneling diode in a ninth example according to the present invention.
Figure 17A:
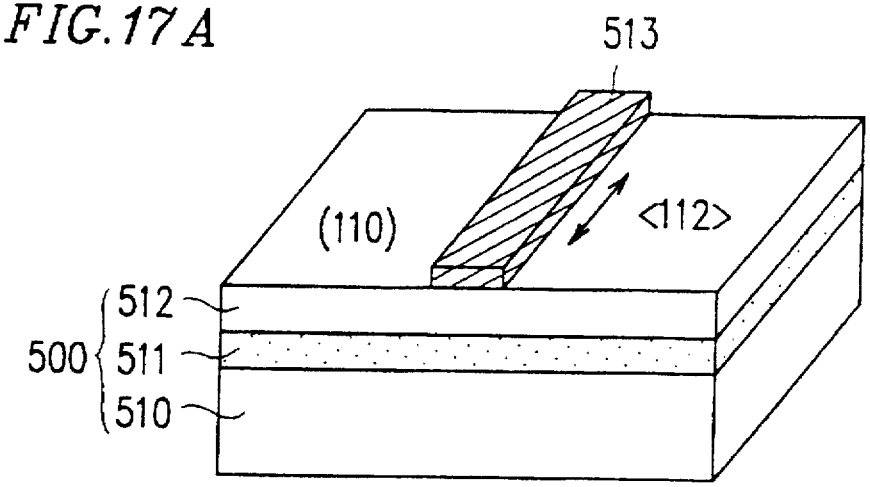
FIGS. 17A through 17C are cross sectional views illustrating the steps of producing the resonance tunneling diode in accordance with the ninth example.
Figure 17B:
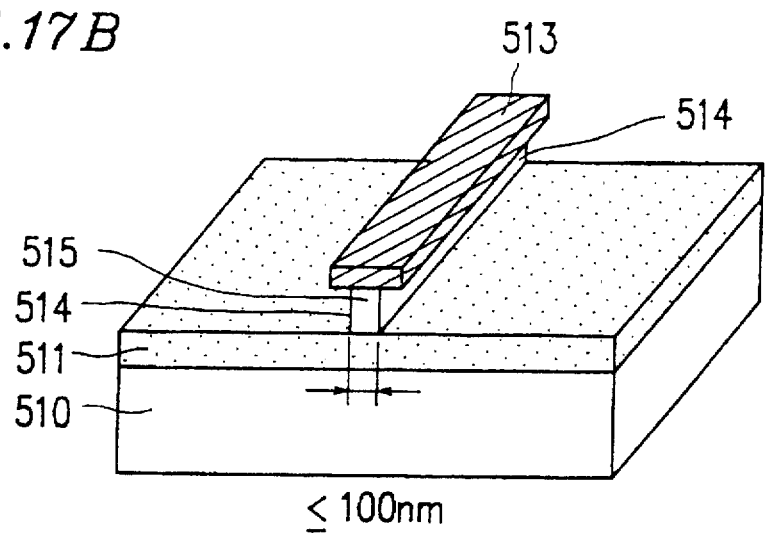
Figure 17C:
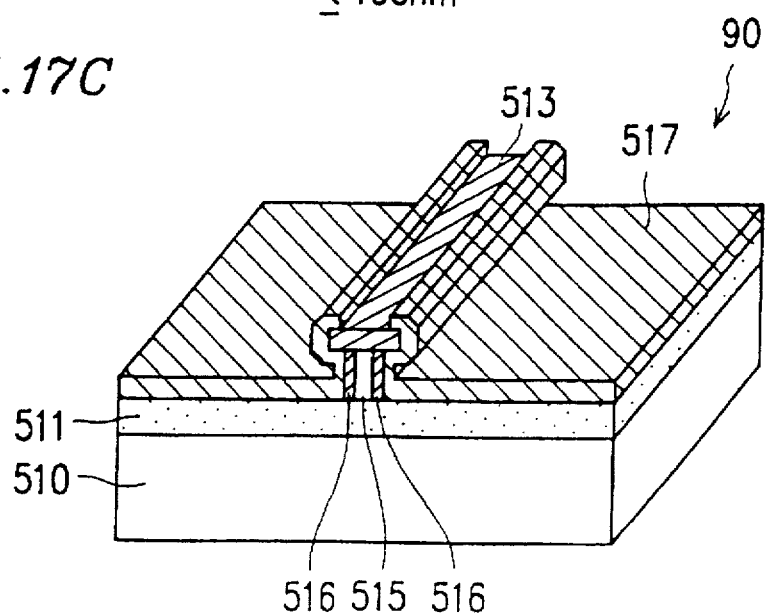

With reference to FIGS. 16 and 17A through 17C, a resonance tunneling diode in a ninth example according to the present invention will be described. FIG. 16 is a partial cross sectional view schematically illustrating a resonance tunneling diode 90, particularly a double barrier structure thereof. FIGS. 17A through 17C are cross sectional views illustrating the steps of producing the resonance tunneling diode 90.

As illustrated in FIGS. 16, the resonance tunneling diode 90 includes a double barrier structure including a silicon microscopic structure 515, which acts as the quantum well, having a rectangular cross section and tunneling oxide films 516, which act as the tunneling barriers, provided on opposing two side surfaces 514 of the silicon microscopic structure 515. The silicon microscopic structure 515 is formed by etching a top silicon substrate 512 (FIG. 17A), which forms a silicon-on-insulator substrate (hereinafter, referred to as the "SOI" substrate) 500 together with a buried oxide film 511 and a bottom silicon layer 510. The SOI substrate 500 is of an n-type and has a surface orientation of (110).

As shown in FIG. 16, the silicon microscopic structure 515 is provided on at least a part of the buried oxide film 511. The buried oxide film 511 is provided on the bottom silicon layer 510. The silicon microscopic structure 515 has a rectangular cross section as mentioned above and located parallel or perpendicular to the <112> crystal orientation of the SOI substrate 500. The side walls 514 of the silicon microscopic structure 515 both have a surface orientation of (111). The side walls 514 are parallel to each other, and perpendicular to the buried oxide film 511 and the bottom silicon layer 510. The width of the silicon microscopic structure 515, namely, the distance between the side walls 514 is 100 nm or less, preferably 20 nm, which is sufficiently small to generate a resonance tunneling effect. The height of the silicon microscopic structure 515 is preferably approximately 300 nm.

The silicon microscopic structure 515 provided with the tunneling oxide films 516 is sandwiched between a pair of electrodes 517 formed of polysilicon including an n-type impurity diffused therein. An etching protection film 513 is provided on the silicon microscopic structure 515.

Functions of the resonance tunneling diode 90 having the above-described configuration will be described.

Since the width of the silicon microscopic structure 515 is as small as 100 nm or less, the energy levels in the silicon microscopic structure 515 are discrete by a quantum effect. The electrodes 517 are supplied with a voltage while changing the level of the voltage. Only when the Fermi level of the electrons in the electrodes 517 equals the discrete quantization level in the silicon microscopic structure 515, the electrons pass through the tunneling oxide films 516 by a resonance tunneling effect. Therefore, a curve representing the V-I characteristic of the resonance tunneling diode 90 has a part which shows the negative resistance characteristic, which is determined by the current vs. voltage relationship.

Generally, functions of a resonance tunneling diode can be utilized better when the negative resistance is larger. In order to increase the negative resistance, the range of voltages for generating a resonance tunneling effect should be narrowed by enhancing, for example, the crystallinity of the silicon microscopic structure, the smoothness of the interface between the silicon microscopic structure and the tunneling oxide film, and the height of the potential barrier.

In the resonance tunneling diode 90 in accordance with the ninth example, the crystallinity of the silicon microscopic structure 515 is as high as that of the SOI substrate 500. The height of the potential barrier is high because of the high quality -tunneling oxide films 516. The interface between the silicon microscopic structure 515 and each tunneling oxide film 516 is formed of a (111) plane which is smooth in the atomic order. For these reasons, a resonance tunneling effect is generated by a narrow range of voltages in the silicon microscopic structure 515, and thus a satisfactory P/V ratio is obtained. Further, since the SOI substrate 500 is used, an area of the silicon microscopic structure 515 which is not covered with the tunneling oxide films 516 is covered with a thick oxide film. As a result, the current leakage through the SOI substrate 500 is significantly reduced. Moreover, since the resonance tunneling diode 90 is formed of silicon materials which are suitable for mass production and are inexpensive, the production cost is low and the production efficiency is high.

With reference to FIGS. 17A through 17C, a production method of the resonance tunneling diode 90 in this example will be described.

As shown in FIG. 17A, the n-type SOI substrate 500 having a surface orientation of (110) and including the top silicon layer 512, the buried oxide film 511 and the bottom silicon layer 510 is prepared. On the SOI substrate 500, the etching protection film 513, which is patterned to be parallel or perpendicular to the <112> crystal orientation of the SOI substrate 500, is formed. In this example, the etching protection film 513 is formed by performing thermal oxidation at a temperature of 900° C. for 54.5 minutes, and has a thickness of 100 nm. Areas of the SOI substrate 500 which are not covered with the etching protection film 513 are exposed.

The top silicon layer 512 is treated with crystalline anisotropic etching using a mixture liquid of ethylene diamine ($NH_2(CH)_2NH_2$), pyrocatechol ($C_6H_4(OH)_2$) and pure water as an etchant. The etching rate of the crystalline anisotropic etching using the above-described etchant is lower with respect to the (111) plane than with respect to the (001) plane and the (110) plane by approximately two digits. Accordingly, the top silicon layer 512 having the (110) plane is etched to form the silicon microscopic structure 515 having a rectangular cross section with the side walls 514 having the (111) plane as illustrated in FIG. 17B.

The mole ratio of the mixture liquid of ethylene diamine, pyrocatechol and pure water is, for example, 43.8:4.2:52. In this case, if the temperature of the mixture liquid is set to be 80° C., the etching rate of the (111) plane is approximately 7 nm/min. By controlling the time period of etching, the etching amount can be controlled in the nanometric order. In this example, by the crystalline anisotropic etching, the top silicon layer 512 is removed except for the silicon microscopic structure 515 to expose the buried oxide film 511, and the width of the silicon microscopic structure 515 is decreased down to 100 nm or less, preferably 20 nm.

In the above-mentioned crystalline anisotropic etching, the etching rate with respect to the (110) plane is significantly high, and thus the top silicon layer 512 is etched rapidly. However, since the SOI substrate 500 is used in this example, the buried oxide film 511 acts as an etching stop layer, only the top silicon layer 512 is etched.

Next, thermal oxidation is performed at a temperature in the range of 700° C. to 1000° C. to form the tunneling oxide films 516 each having a thickness of 2 to 4 nm, preferably of 3 nm on the side walls 514 having the (111) surface orientation as shown in FIG. 17C. The electrodes 517 of polysilicon including an n-type impurity such as phosphorus diffused therein at a density of as high as $1 \times 10^{19}$ cm$^{-3}$ or more are formed so as to sandwich the silicon microscopic structure 515 provided with the tunneling oxide films 516 in the same manner as described in the previous examples.

As in the previous examples, the (111) plane, which is not damaged by processing and is smooth in the atomic order, is obtained by the crystalline anisotropic etching of the top silicon layer 512. Also by the crystalline anisotropic etching of the top silicon layer 512, the width of the silicon microscopic structure 515 can be substantially uniformized. The tunneling oxide films 516 formed by thermal oxidation has a very low density of the interface level and a high potential barrier, and therefore has a high effect of confining electrons. As a result, a resonance tunneling effect is generated by a narrow range of voltages in the silicon microscopic structure 515, and thus a satisfactory P/V ratio is obtained. Moreover, the use of polysilicon for the electrodes 517 realizes highly reliable electric connections at the interfaces between the electrodes 517 and the tunneling oxide films 516.

The silicon microscopic structure 515 is located parallel or perpendicular to the <112> crystal orientation of the SOI substrate 500 having a surface orientation of (110). Because of such relationship of the orientations, the silicon microscopic structure 515 is provided perpendicular to the SOI substrate 500. The silicon microscopic structure 515 provided in such a direction is strong against an external force, and also supports the etching protection film 513 strongly.

The etching protection film 513 may be formed of a nitride film or a chrome film instead of a thermal oxide film. The etchant for crystalline anisotropic etching may be a mixture liquid of hydrazine, isopropyl alcohol and pure water or an aqueous solution of potassium hydroxide. The tunneling oxide films 516 may be formed of a nitride oxide film, a nitride film, a SiC film, or a SiGe film.

A p-type substrate may be used for the SOI substrate 500, in which case, the electrodes 517 are formed of polysilicon including a p-type impurity diffused therein.

In the first through eighth examples, the (001) silicon substrate 101, having a surface orientation of (001), includes the silicon thin layer 110 provided parallel or perpendicular to the <110> crystal orientation of the (001) silicon substrate 101. Because of such relationship of orientations, the silicon thin layer 110 is formed to be slanted relative to the surface of the (001) silicon substrate 101 as a result of the crystalline anisotropic etching. In the first through eighth examples, by using a silicon substrate having a surface orientation of (110) and forming the silicon thin layer 110 parallel or perpendicular to the <112> crystal orientation of such a silicon substrate, the first and the second grooves 107 and 109 can have a rectangular cross section and the silicon thin layer 110 can be provided perpendicular to the silicon substrate. In such a case, since the etching rate relative to the (110) plane is very high, it is desirable to provide an etching stop layer at an appropriate depth of the silicon substrate so that the first and the second grooves 107 and 109 have a desirable depth in order to facilitate the production of the resonance tunneling diode.

Example 10

With reference to FIGS. 18A through 18D, a resonance tunneling diode in a tenth example according to the present invention will be described. FIGS. 18A through 18D are cross sectional views illustrating the steps of producing a resonance tunneling diode 100 in accordance with the tenth example. The resonance tunneling diode 100 has basically the same configuration as that of the resonance tunneling diode 90 in accordance with the ninth example. Elements identical with those in the ninth example bear the identical reference numerals, and the explanations thereof will be omitted.

The main difference between the resonance tunneling diode 100 and the resonance tunneling diode 90 is that the SOI substrate of the 500 has a surface orientation of (001) and that the silicon microscopic structure 515 is provided parallel or perpendicular to the <110> crystal orientation of the SOI substrate 500. Because of such relationship of the surface orientations, the silicon microscopic structure 515 has a substantially parallelogram cross section.

With reference to FIGS. 18A through 18D, a production method of the resonance tunneling diode 100 in this example will be described.

Figure 18A:
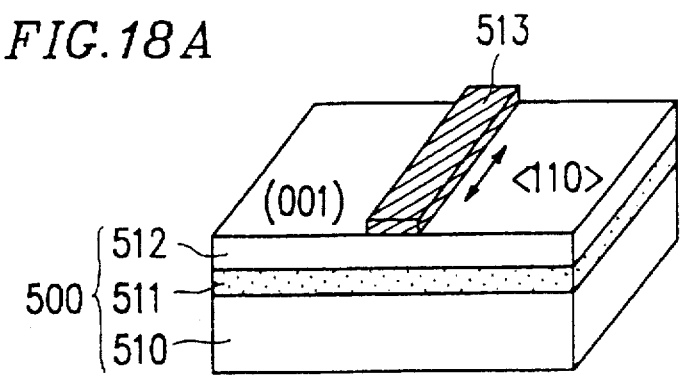
FIGS. 18A through 18D are cross sectional views illustrating the steps of producing a resonance tunneling diode in a tenth example according to the present invention.

As shown in FIG. 18A, on the n-type SOI substrate 500 having a surface orientation of (001) and including the top silicon layer 512, the buried oxide film 511 and the bottom silicon layer 510 is prepared. On the SOI substrate 500, the etching protection film 513, which is patterned to be parallel or perpendicular to the <110> crystal orientation of the SOI substrate 500, is formed. In this example, the etching protection film 513 is formed by performing thermal oxidation at a temperature of 900° C. for 54.5 minutes, and has a thickness of 100 nm. Areas of the SOI substrate 500 which are not covered with the etching protection film 513 are exposed.

Figure 18B:
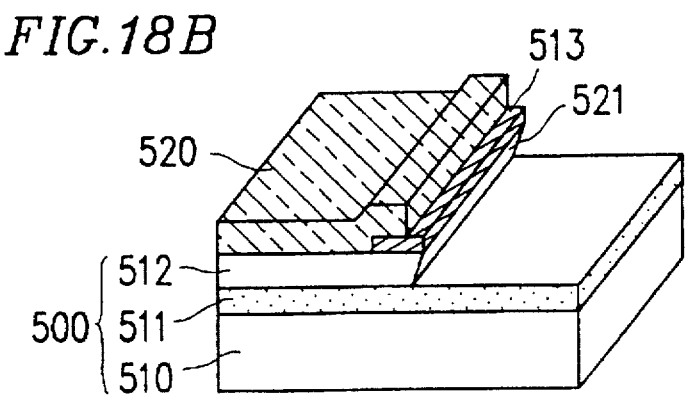

As illustrated in FIG. 18B, one of the exposed areas of the top silicon layer 512 (in FIG. 18B, the left side of the etching protection film 513) and the etching protection film 513 are covered with a resist mask 520. Dry etching is performed to remove the other area of the top silicon layer 512 (in FIG. 18B, the right side of the etching protection film 513). The dry etching is performed using the resist mask 520 as a mask, and SiCl$_4$, CH$_2$F$_2$, SF$_6$, and O$_2$ as etching gases. The dry etching is also performed so that an angle made by a surface of the etching protection film 513 and a surface 521 formed by the dry etching is 90 degrees or less.

Figure 18C:
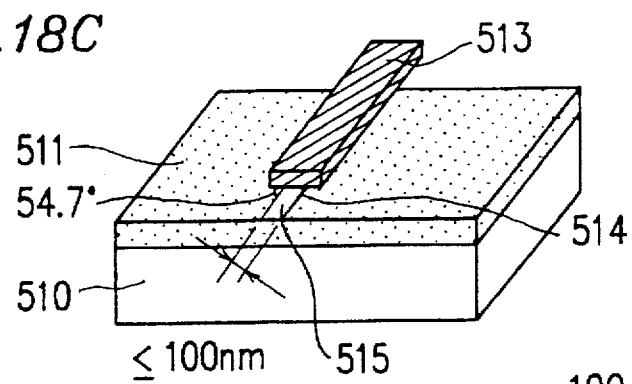

The resist mask 520 is removed, and the remaining top silicon layer 512 is treated with crystalline anisotropic etching using a mixture liquid of ethylene diamine (NH$_2$(CH$_2$)$_2$NH$_2$), pyrocatechol (C$_6$H$_4$(OH)$_2$) and pure water as an etchant. The etching rate of the crystalline anisotropic etching using the above-described etchant is lower with respect to the (111) plane than with respect to the (001) plane and the (110) plane by approximately two digits. Accordingly, the top silicon layer 512 having the (001) plane is etched to form the silicon microscopic structure 515 having a parallelogram cross section with the side walls 514 having the (111) plane as illustrated in FIG. 18C. In this example, the silicon microscopic structure 515 is formed so that an angle made by one of the side walls 514 and the surface of the etching protection film 513 is 54.7 degrees.

Figure 18D:
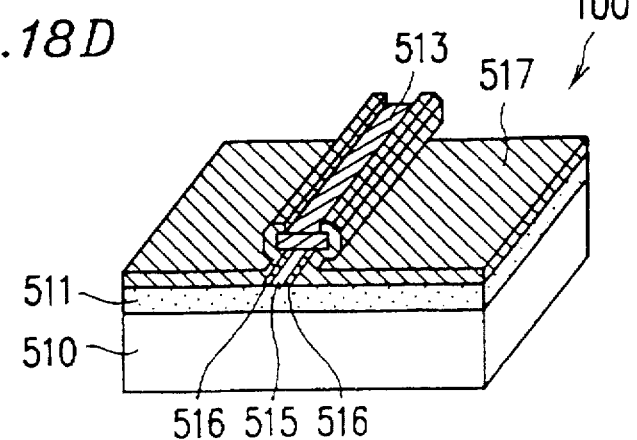

Next, as illustrated in FIG. 18D, the tunneling oxide films 516 and the electrodes 517 are formed in the same manner described in the ninth example.

The resonance tunneling diode 100 has the same effects as the resonance tunneling diode 90.

The etching protection film 513 may be formed of a nitride film or a chrome film instead of a thermal oxide film. The etchant for crystal-line anisotropic etching may be a mixture liquid of hydrazine, isopropyl alcohol and pure water or an aqueous solution of potassium hydroxide. The tunneling oxide films 516 may be formed of a nitride oxide film, a nitride film, a SiC film, or a SiGe film.

A p-type substrate may be used for the SOI substrate 500, in which case, the electrodes 517 are formed of polysilicon including a p-type impurity diffused therein.

Example 11

Figure 19:
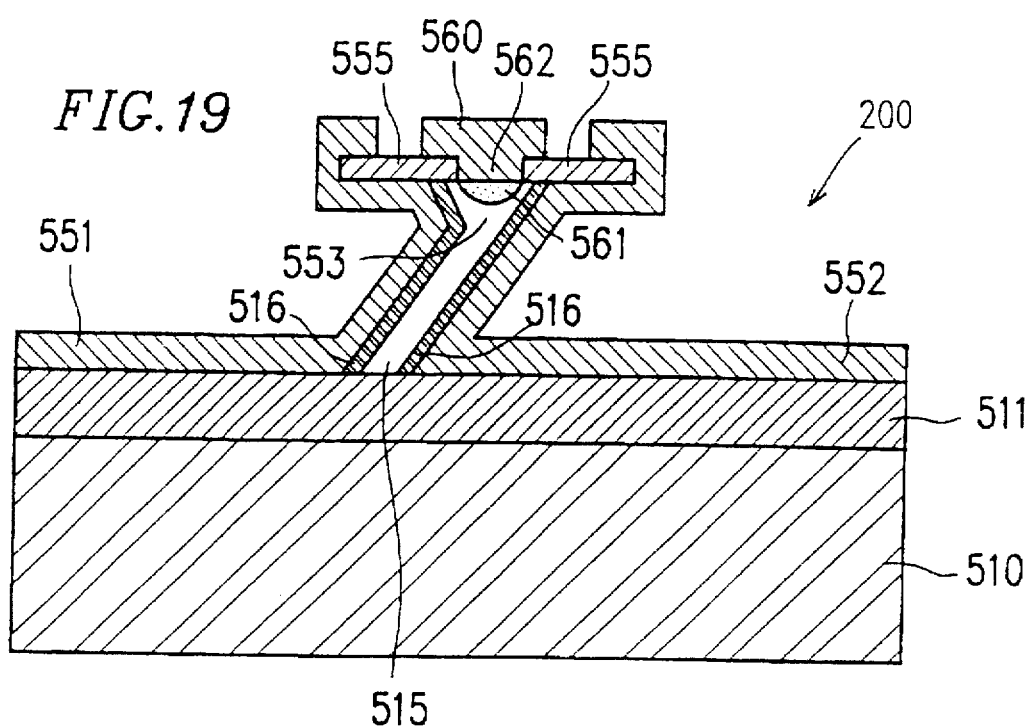
FIG. 19 is a cross sectional view of a hot electron transistor in an eleventh example according to the present invention.
Figure 20:
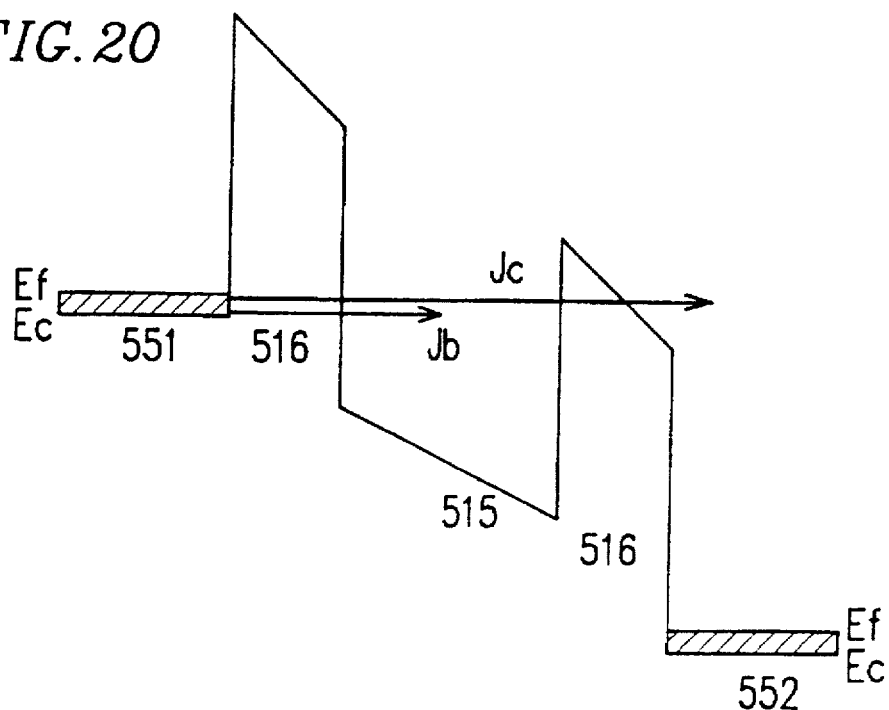
FIG. 20 is a view describing functions of the hot electron transistor in accordance with the eleventh example.

With reference to FIGS. 19, 20 and 21A through 21G, a hot electron transistor in an eleventh example according to the present invention will be described. FIG. 19 is a cross sectional view of a hot electron transistor 200 in accordance with the eleventh example, FIG. 20 is a view describing functions of the hot electron transistor 200, and FIGS. 21A through 21G are cross sectional views illustrating the steps of producing the hot electron transistor 200.

As illustrated in FIG. 19, the hot electron transistor 200 includes the silicon microscopic structure 515 provided on the buried oxide film 511. As in the tenth example, the silicon microscopic structure 515 is formed by etching the top silicon layer 512 (FIG. 21A), which forms the SOI substrate 500 together with the buried oxide film 511 and the bottom silicon layer 510. The SOI substrate 500 is of an n-type and has a surface orientation of (001).

The silicon microscopic structure 515 has a substantially parallelogram cross section and is provided at least on a part of the buried oxide film 511. The buried oxide film 511 is provided on the bottom silicon layer 510. The side walls 514 of the silicon microscopic structure 515 both have a surface orientation of (111). The side walls 514 are parallel to each other. The width of the silicon microscopic structure 515, namely, the distance between the side walls 514 is 100 nm or less, preferably 20 nm, which is sufficiently small to generate a resonance tunneling effect. The height of the silicon microscopic structure 515 is preferably approximately 300

On the two surfaces of the silicon microscopic structure 515, the tunneling oxide films 516 are provided. The silicon microscopic structure 515 provided with the tunneling oxide films 516 is sandwiched between a first electrode 551 and a second electrode 552 formed of polysilicon including an n-type impurity diffused therein.

The silicon microscopic structure 515 has a top portion 553 having a reverse triangular cross section. On a surface of the top portion 553, an etching protection film 555 having a contact window 562 is provided. A contact diffusion layer 561 including an n-type impurity diffused therein is provided in the top portion 553, and a third electrode 560 is provided in ohmic contact with the contact diffusion layer 561. The third electrode 560 is formed of polysilicon including an n-type impurity diffused therein. Alternatively, the third electrode 560 may be formed of aluminum. The three electrodes 551, 552 and 560 are electrically insulated from one another by the etching protection film 555 and the buried oxide film 511. The first electrode 551 and the silicon microscopic structure 515, and the second electrode 552 and the silicon microscopic structure 515 are connected to each other only via the tunneling oxide film 516.

The conductivity of the SOI substrate 500, the first, the second and the third electrodes 551, 552 and 560, and the contact diffusion layer 561 may be either a p-type or an n-type as far as the conductivity of these elements is the same.

The top portion 553 of the silicon microscopic structure 515 is provided in order to strongly support the above-described relatively large elements including the third electrode 560.

With reference to FIG. 20, functions of the hot electron transistor 200 will be described in detail.

In the hot electron transistor 200, the first electrode 551, the second electrode 552, the silicon microscopic structure 515, and the third electrode 560 respectively act as an emitter (E), a collector (C), the base (B), and a base electrode. Ef and Ec in FIG. 20 respectively indicate the Fermi energy level and the energy level corresponding to the bottom of the conduction band.

When a voltage is applied between the first electrode 551 and the third electrode 560, the electrons pass from the first electrode 551 as the emitter through the tunneling oxide film 516 acting as a potential barrier and are injected into the silicon microscopic structure 515 acting as the base., A portion of the electrons are captured in the base and form a base current Jb. However, since the electrons injected into the base generally have a large energy, a majority of the electrons injected into the base pass through the other tunneling oxide films 516 acting as the other potential barriers and reaches the second electrode 552 acting as the collector. Such electrons form a collector current Jc. The amount of the collector current Jc, namely, the number of the electrons reaching the collector is easily controlled by slightly changing the level of the voltage applied between the emitter and the base. In other words, current amplification is realized by changing the level of the voltage applied to the third electrode 560.

Since the crystallinity of the silicon microscopic structure 515 is as high as that of the SOI substrate 500, the scattering of the electrons in the silicon microscopic structure 515 (namely, the base) is restricted. Therefore, the ratio of the electrons reaching the collector is increased, and thus the amplification ratio of the current is raised. Because the electrons do not scatter greatly, the propagation rate of the electrons is increased, and thus the operating speed of the transistor is improved.

With reference to FIGS. 21A through 21G, a production method of the hot electron transistor 200 in this example will be described.

Figure 21A:
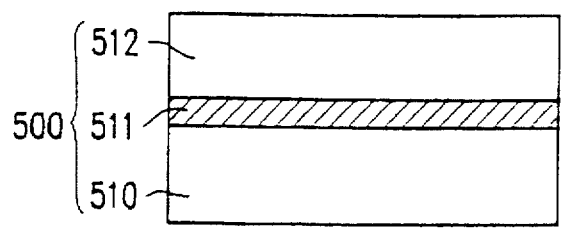
FIGS. 21A through 21G are cross sectional views illustrating the steps of producing the hot electron transistor in accordance with the eleventh example.
Figure 21B:
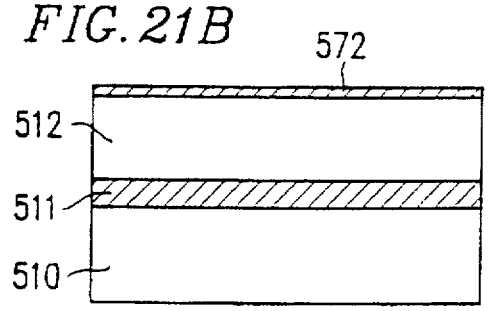

As shown in FIG. 21A, the n-type SOI substrate 500, having a surface orientation of (001) and including the top silicon layer 512, the buried oxide film 511 and the bottom silicon layer 510, is prepared. Thermal oxidation is performed at a temperature of 900° C. for 54.5 minutes to form an oxide film 572 in a thickness of 100 nm on the SOI substrate 500 as shown in FIG. 21B.

Figure 21C:
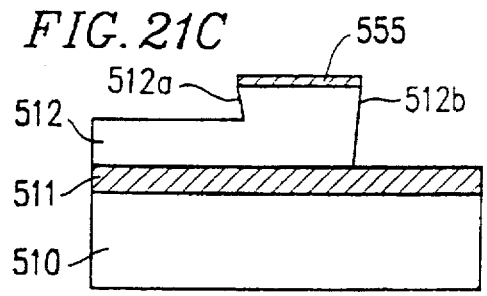

A resist pattern (not shown) is formed on the oxide film 572 to be parallel or perpendicular to the <110> crystal orientation of the SOI substrate 500 by photolithography. Dry etching is performed using the resist pattern as a mask, and $SiCl_4$, $CH_2F_2$, $SF_6$, and $O_2$ as etching gases to transform the oxide film 572 into the etching protection film 555 as shown in FIG. 21C.

By dry etching, the top silicon layer 512 is also etched. On one side of the etching protection film 555 (in FIG. 21C, the left side of the etching protection film 555), the top silicon layer 512 is etched to a depth of 100 nm from the surface of the etching protection film 555. On the other side of the etching protection film 555 (in FIG. 21C, the right side of the etching protection film 555), the top silicon layer 512 is etched to a depth of 300 nm from the surface of the etching protection film 555, namely, down to an interface between the top silicon layer 512 and the buried oxide film 511. Such etching is performed to later form the top portion 553 of the silicon microscopic structure 515. The dry etching is performed so that angles made by the surface of the etching protection film 555 and surfaces 512a and 512b formed by the dry etching and are 90 or less.

Figure 21D:
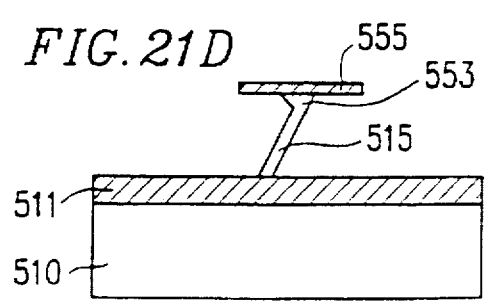

After the resist pattern is removed, the top silicon layer 512 is treated with crystalline anisotropic etching in the same manner as described in the tenth example to form the silicon microscopic structure 515 having side walls each of which has a surface orientation of (111) and also having the top portion 553 as illustrated in FIG. 21D. The width of the parallelogram part of the silicon microscopic structure 515 is 20 nm, and the width of the top portion 553 at the interface with the etching protection film 555 is approximately 150 nm, which is sufficiently large to support the third electrode 560.

Figure 21E:
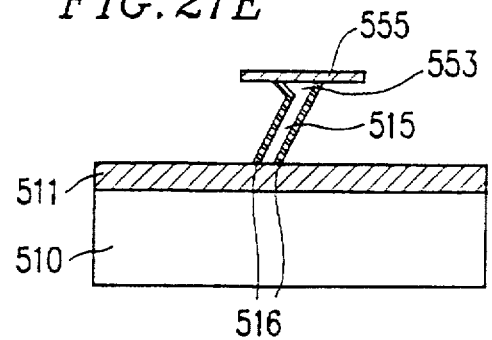
Figure 21F:
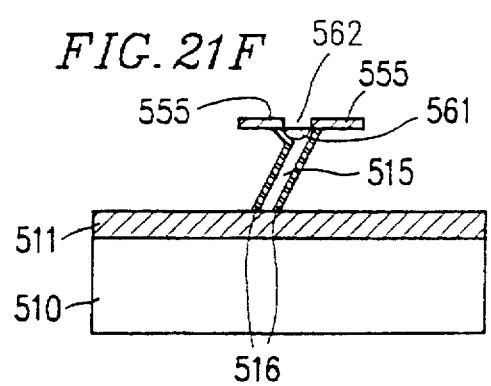

Thermal oxidation is performed at a temperature of 900° C. to form the tunneling oxide films 516 on the side surfaces of the silicon microscopic structure 515 as shown in FIG. 21E. The time period of oxidation is controlled so that the tunneling oxide films 516 each have a thickness of 2 to 4 nm, preferably of 3 nm. Next, as shown in FIG. 21F, a central portion of the etching protection film 555 is etched in a width of 100 nm to form a contact window 562 by performing dry etching under the same conditions as mentioned above. Ions of an n-type impurity (same conductivity as that of the top silicon layer 512) are implanted into the silicon microscopic structure 515 through the contact window 562, using a resist mask (not shown). The implantation is performed at an acceleration energy of 40 keV in a dose of $4 \times 10^{15}$ cm$^{-2}$. The ions are then diffused by annealing at a temperature of 900° C. for 20 minutes to form the contact diffusion layer 561. The contact diffusion layer 561 may be formed by impurity diffusion. In this example, phosphorus ions are used as the n-type impurity.

Figure 21G:
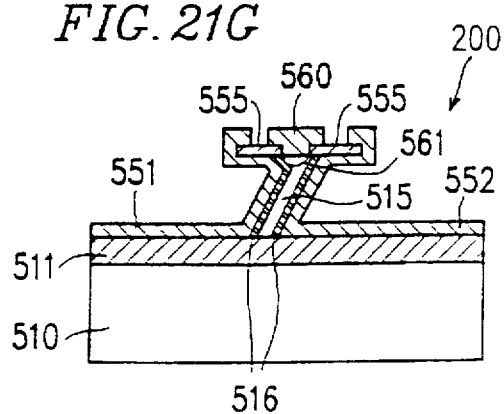

After the resist mask is removed, a polysilicon film is formed by CVD in a thickness of 150 nm on the buried oxide film 511 and on the top portion 553 of the silicon microscopic structure 515. An n-type impurity is diffused into the polysilicon film at a density as high as $1 \times 10^{19}$ cm$^{-3}$ or more by, for example, gas phase diffusion. The polysilicon film is patterned by dry etching to form the first electrode 551, the second electrode 552 and the third electrode 560 as shown in FIG. 21G. In this manner, the hot electron transistor 200 is produced.

The etching protection film 555 may be formed of a nitride film or a chrome film instead of a thermal oxide film. The etchant for crystalline anisotropic etching may be a mixture liquid of hydrazine, isopropyl alcohol and pure water or an aqueous solution of potassium hydroxide. The tunneling oxide films 516 may be formed of a nitride oxide film, a nitride film, a SiC film, or a SiGe film.

Example 12

Figure 22:
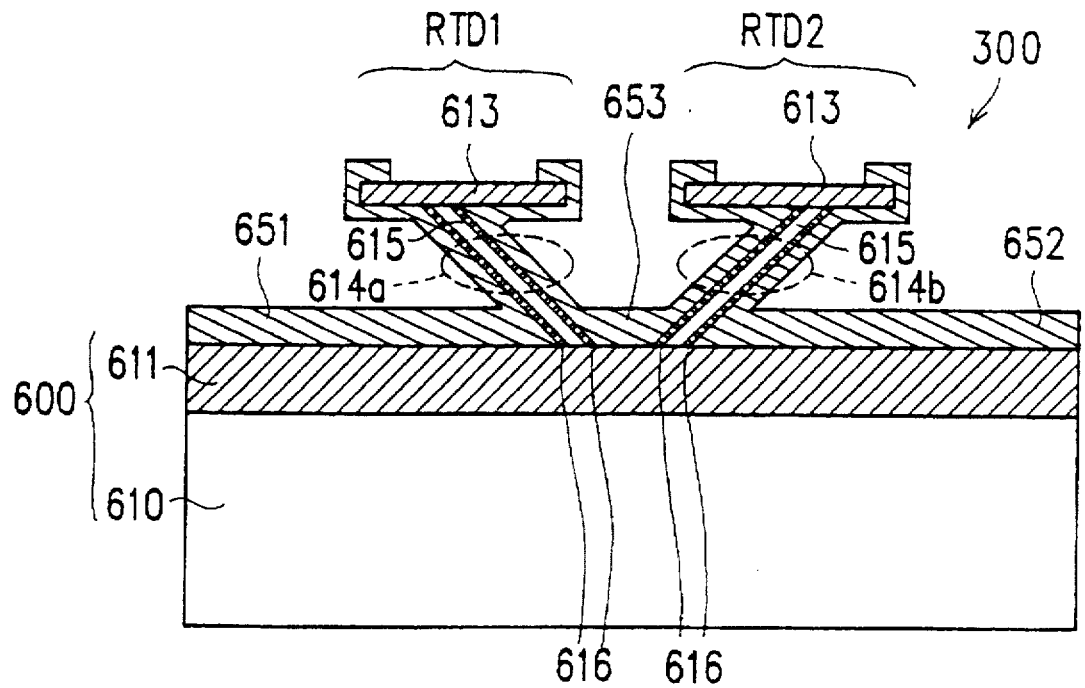
FIG. 22 is a cross sectional view of a memory device in a twelfth example according to the present invention.

In a twelfth example according to the present invention, a memory device utilizing a resonance tunneling diode according to the present invention will be described with reference to FIGS. 22 and 23. FIG. 22 is a cross sectional view of a memory device 300 in accordance with the twelfth example.

As is shown in FIG. 22, the memory device 300 includes two resonance tunneling diodes RTD1 and RTD2, which have an identical configuration with each other. The resonance tunneling diodes RTD1 and RTD2 respectively include a first double barrier structure 614a and a second double barrier structure 614b, which are located symmetrically and also each have the same configuration with that of the double barrier structure in accordance with the tenth example. The double barrier structures 614a and 614b each have a silicon microscopic structure 615. The silicon microscopic structure 615 is formed by etching a top silicon layer (not shown in FIG. 22), which forms an SOI substrate 600 together with a buried oxide film 611 and a bottom silicon layer 610. The SOI substrate 600 is of an n-type and has a surface orientation of (001). The double barrier structures 614a and 614b also respectively include tunneling oxide films 616 provided on two opposing side surfaces of the silicon microscopic structure 615. The double barrier structures 614a and 614b provided with the tunneling oxide films 616 are sandwiched between a first electrode 651 and a second electrode 652, and are connected with each other via a third electrode 653.

The first, second and third electrodes 651, 652 and 653 are electrically insulated from one another by etching protection films 613 and the buried oxide film 611, and connected only through the silicon microscopic structures 615 and tunneling oxide films 616.

Figure 23:
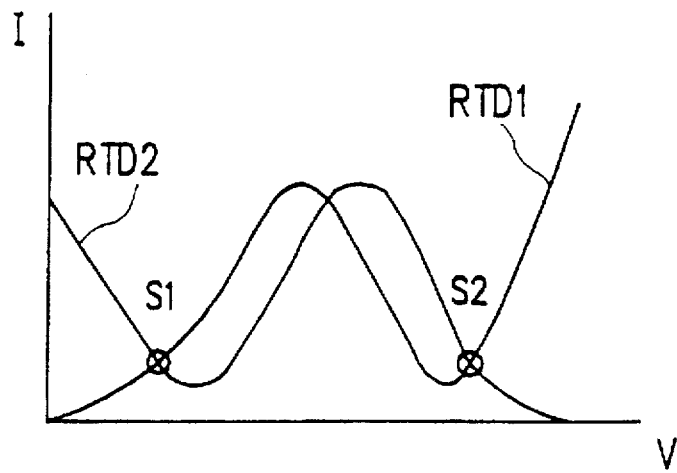
FIG. 23 is a graph illustrating the V-I characteristic of the memory device in accordance with the twelfth example.

Referring to FIG. 23, operation of the memory device 300 having the above-described configuration will be described. FIG. 23 is a graph illustrating the V-I characteristic of the resonance tunneling diodes RTD1 and RTD2. Curves representing the V-I characteristic of the resonance tunneling diodes RTD1 and RTD2 both show a negative resistance characteristic obtained by a resonance tunneling effect.

In the memory device 300, the first and the second double structures 614a and 614b are connected in series with each other. When the voltage applied to the first electrode 651 and the second electrode 652 is gradually increased, two points (indicated as S1 and S2 in FIG. 23) where the charge state is stable are obtained. By using such stable states at S1 and S2 as an "ON" state and an "OFF" state, the memory device 300 can operate bistably. Thus, data can be written, read and rewritten.

For reading data, the memory device 300 operates in the following manner.

A voltage of a constant positive level is applied to the third electrode 653. In the case that a large number of electrons are stored in the memory device 300 (S1 in FIG. 23), the quantization level of the electron energy in the first double barrier structure 614a equals the Fermi level in the third electrode 653. Therefore, a large number of electrons flow into the second electrode 652 through the double barrier structures 614a and 614b by resonance tunneling effect. In the case that a small number of electrons are stored in the memory device 300 (S2 in FIG. 23), the number of electrons flowing into the second electrode 652 is not significant because no resonance tunneling effect is generated in the double barrier structure 614a or 614b. Based on such a difference in the numbers of electrons flowing into the second electrode 652, whether the memory device 300 is in the S1 state or S2 state can be read.

For writing and rewriting data, the memory device 300 operates in the following manner.

The voltage applied to the third electrode 653 is increased to over a prescribed level, thereby changing the memory device 300 from the S1 state to the S2 state. By decreasing the voltage applied to the third electrode 653, the memory device 300 is changed from the S2 state to the S1 state. In this manner, data can be written and rewritten.

Figure 24:
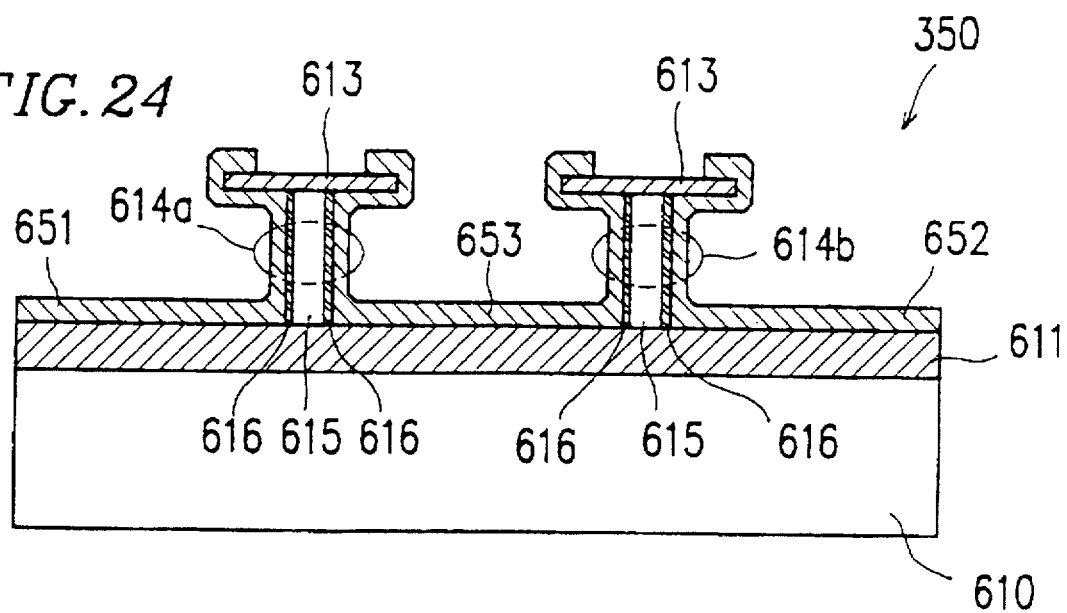
FIG. 24 is a cross sectional view of a memory device in a modification of the twelfth example.

In this example, the silicon microscopic structure 615 is provided parallel or perpendicular to the <110> crystal orientation of the SOI substrate 600 having a surface orientation of (001). Accordingly, the silicon microscopic structure 615 is slanted relative to the surface of the SOI substrate 600. In the case where a substrate having a surface orientation of (110) is used for the SOI substrate 600, and the silicon microscopic structure 615 is formed parallel or perpendicular to the <112> crystal orientation of such an SOI substrate 600, another memory device 350 is formed in which the silicon microscopic structure 615 is provided perpendicular to the surface of the SOI substrate as illustrated in FIG. 24. The memory device 350 has basically the same configuration with that of the memory device 300. In the memory device 350, elements identical with those in the memory device 300 bear identical reference numerals and explanation thereof will be omitted.

Example 13

In a thirteenth example according to the present invention, an integrated circuit including a resonance tunneling diode in accordance with the present invention and a LOCOS layer surrounding the resonance tunneling diode will be described referring to FIGS. 25A through 25C and 26A through 26G. By the LOCOS layer, the resonance tunneling diode is insulated from other devices included in the same substrate.

Figure 25A:
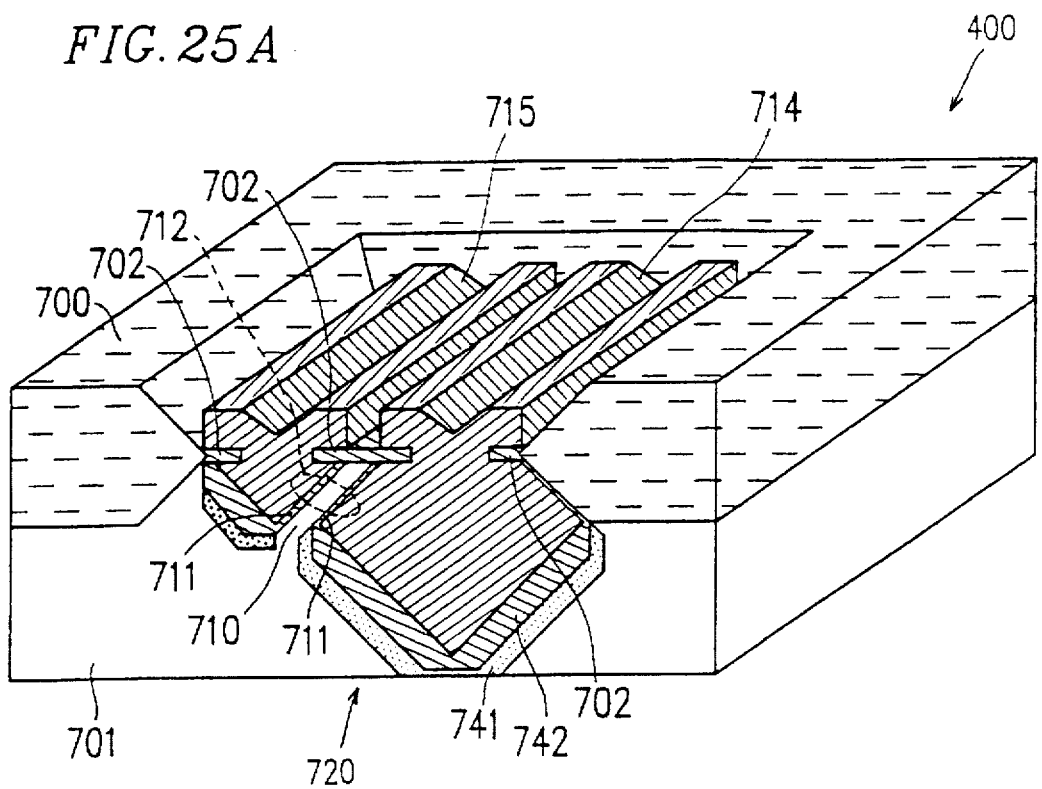
FIG. 25A is an isometric view schematically illustrating a part of an integrated circuit including a resonance tunneling diode in a thirteenth example according to the present invention.

FIG. 25A is an isometric view schematically illustrating a portion of an integrated circuit 400 including a resonance tunneling device 720 surrounded by a LOCOS layer 700 in accordance with the thirteenth example. As shown in FIG. 25A, the resonance tunneling diode 720 has the configuration of the resonance tunneling diode 50 described in the fifth example with reference to FIGS. 10A through 10I. The integrated circuit 400 may have at least one quantization functional device such as a resonance tunneling diode or a hot electron transistor in accordance with any one of the previous examples instead of the resonance tunneling diode 720.

As shown in FIG. 25A, the resonance tunneling diode 720 includes an n-type (001) silicon substrate 701. On the (001) silicon substrate 701, a double barrier structure 712 including a silicon oxide film 711 (acting as a tunneling barrier), a silicon-thin layer 710 (acting as a quantum well) and a silicon oxide film 711 (acting as a tunneling barrier) is provided. A first electrode 714 and a second electrode 715 are also provided on the (001) silicon substrate 701. The first and the second electrodes 714 and 715 are both formed of polysilicon including an n-type impurity diffused therein. Each of the first and the second electrodes: 714 and 715, and the (001) silicon substrate 701 sandwich an impurity layer 741, having an opposite conductivity from that of the (001) silicon substrate 701, and a thick silicon oxide film 742 therebetween. By the impurity layer 741 and the silicon oxide film 742, generation of current leakage between each of the first and the second electrodes 714 and 715 and the (001) silicon substrate 701 is restricted. In order to restrict generation of the current leakage from sides of the first and the second electrodes 714 and 715, and also in order to insulate the resonance tunneling diode 720 from other devices included in the (001) silicon substrate 701, the resonance tunneling diode 720 is surrounded by the LOCOS layer 700.

Figure 25B:
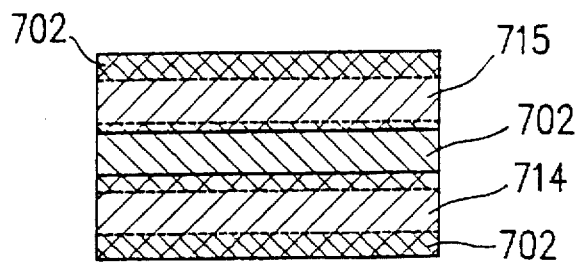
FIG. 25B is a partial plan view of the integrated circuit in accordance with the thirteenth example.

FIG. 25B is a plan view of a part of the resonance tunneling diode 720. The first and the second electrode 714 and 715 are parallel to each other with an etching protection film 702 therebetween. Although not shown in FIG. 25A or 25B, by providing a wire connected to the first and the second electrodes 714 and 715 and extending the wire in an arbitrary direction, the resonance tunneling diode 720 can be connected to any other semiconductor device provided on the (001) silicon substrate 701.

Figure 25C:
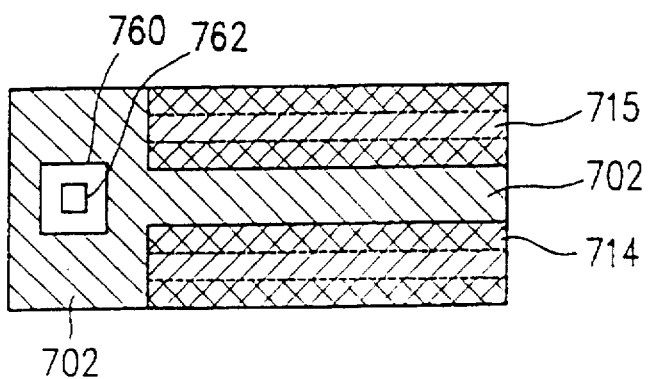
FIG. 25C is a partial plan view of an integrated circuit including a hot electron transistor in accordance with the thirteenth example.

In a modification of the thirteenth example, a third electrode 760 is provided in addition to the resonance tunneling diode 720 described above to form a hot electron transistor, and the hot electron transistor is surrounded by the LOCOS layer 700. FIG. 25C is a plan view of a part of such a hot electron transistor. In FIG. 25C, the etching protection film 702 has a contact window 762 at an arbitrary position in the vicinity of the first and the second electrodes 714 and 715. The third electrode 760, formed of aluminum or n-type impurity doped polysilicon, is included in the contact window 762. Although not shown in FIG. 25C, by providing a wire connected to the=first and the second electrodes 714 and 715 and extending the wire in an arbitrary direction, the hot electron transistor can be connected to any other semiconductor device included in the (001) silicon substrate 701.

The hot electron transistor in this modification has an identical configuration and effects with that of the hot electron transistor 80 described in the eighth example, and description thereof will be omitted.

With reference to FIGS. 26A through 26G, a production method of the integrated circuit 400 in this example will be described.

Figure 26A:
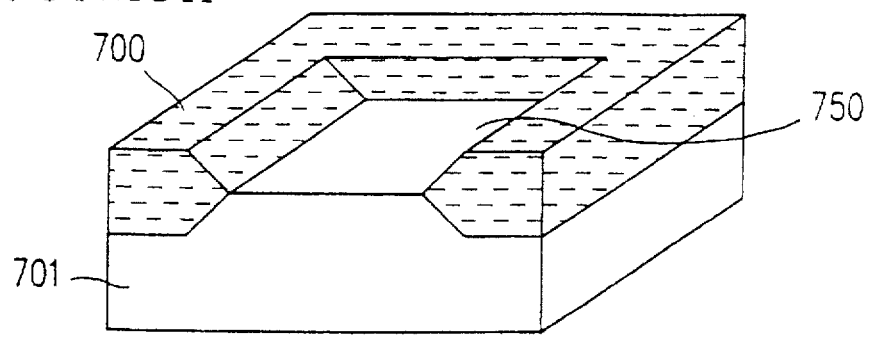
FIGS. 26A through 26G are cross sectional views illustrating the steps of producing the integrated circuit in accordance with the thirteenth example.

As illustrated in FIG. 26A, on the n-type (001) silicon substrate 701, the LOCOS layer 700 having a thickness of 600 nm is formed to surround an area 750 having a length in the direction of <110> of 10 μm and a length in the direction of <110> of 2 μm by performing thermal oxidation at a temperature of 1000° C. for 175 minutes.

Figure 26B:
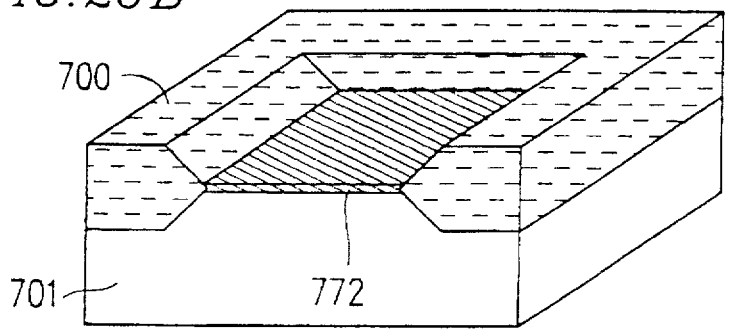
Figure 26C:
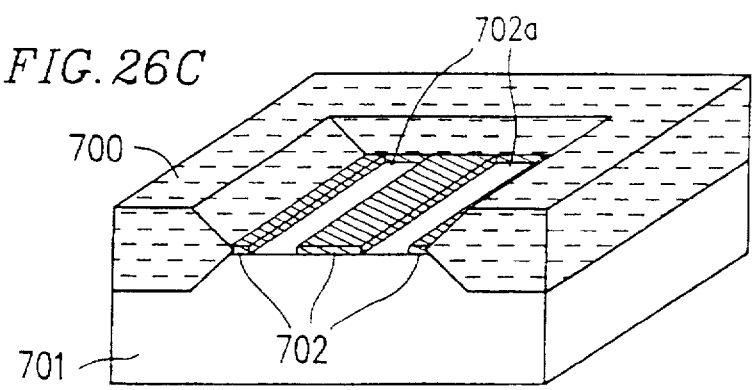

Next, as shown in FIG. 26B, an oxide film 772 is formed in a thickness of 100 nm on a surface of the area 750 by performing thermal oxidation at a temperature of 900° C. for 54.5 minutes. As shown in FIG. 26C, a pair of openings 702a each having a width of 500 nm are formed in the <110> direction of the oxide film 772 at an interval of 500 nm to form etching protection films 702 in stripes.

Figure 26D:
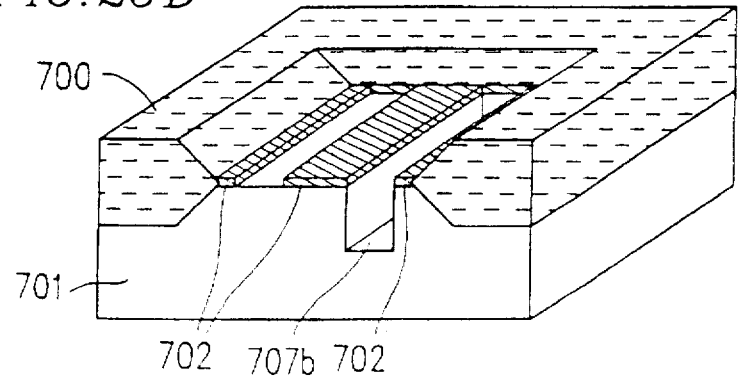
Figure 26E:
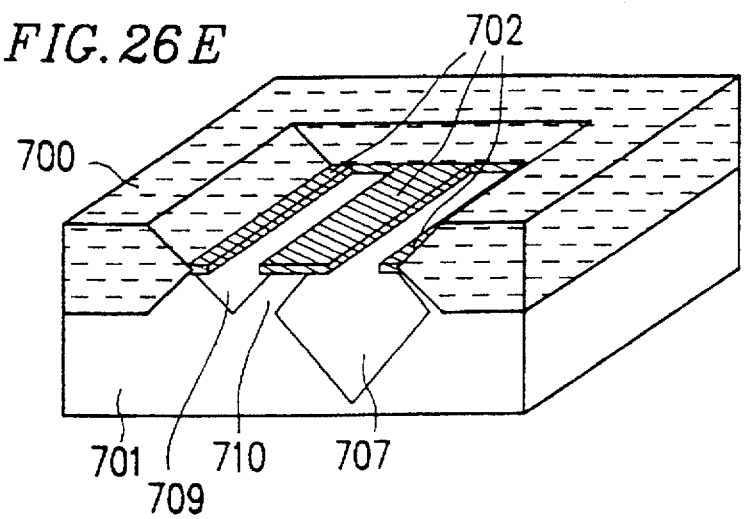

As illustrated in FIGS. 26D and 26E, a first groove 707 having a substantially diamond-shaped cross section and a second groove 709 having a V-shaped cross section are formed by performing etching in the same manner as described in the fifth example with reference to FIGS. 10C through 10E.

Figure 26F:
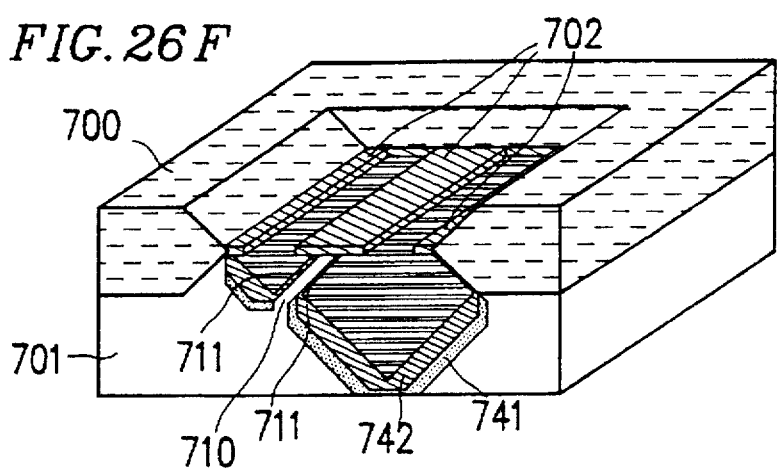

The first and the second grooves 707 and 709 are formed so that perimeters thereof are almost in contact with inner side surface of the LOCOS layer 700. A p-type impurity is implanted into surfaces of the first and the second grooves 707 and 709 except for areas acting as the surfaces of silicon thin plate 710 to form the impurity layers 741 as shown in FIG. 26F in the same manner described in the fifth example with reference to FIGS. 10F and 10G. The thick silicon oxide films 742 are formed on the impurity layers 741 by performing thermal oxidation at a temperature of 800° C.c for 7 minutes, utilizing an oxidation acceleration effect. By the thermal oxidation, the surfaces of the first and the second grooves 707 and 709 are oxidized up to the junction with the LOCOS layer 700.

Figure 26G:
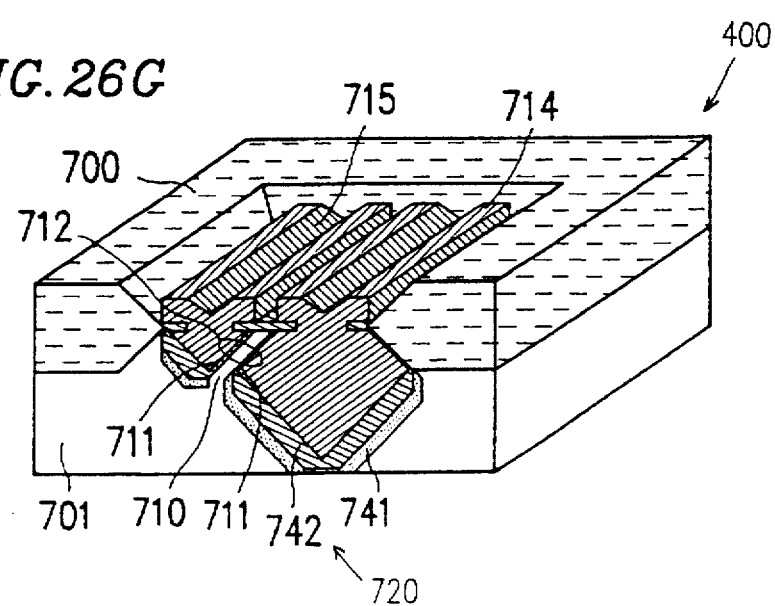

As a result, areas surrounding the first and the second grooves 707 and 709 are covered with the thick silicon oxide film 742. Next, as illustrated in FIG. 26G, the first and the second electrodes 714 and 715 are formed of polysilicon including an n-type impurity diffused therein.

In order to produce the hot electron transistor surrounded by the LOCOS layer 700 shown in FIG. 25C, the LOCOS layer 700 is formed so as to surround a larger area than the area 750 so that a sufficient area for the contact window 762 and the third electrode 760 is obtained. After the processes shown in FIGS. 26A through 26G, the third electrode 760 is formed in the same manner as described in the eighth example with reference to FIGS. 15I and 15J.

In either case, wires connected to the electrodes 714, 715 and 760 may be further formed in a method generally used in the field of semiconductors.

A resonance tunneling diode, a hot electron transistor and a memory device in any of the above-described examples according to the present invention is produced utilizing technologies in the field of semiconductors handling silicon materials. Accordingly, any device according to the present invention can be produced using a conventional semiconductor substrate in the process of producing conventional semiconductor devices. For example, by the LOCOS layer as described in the thirteenth example, one or a plurality of quantization functional devices according to the present invention can be provided on a silicon substrate which also has conventional semiconductor devices such as MOSFETs in a proper insulation state so as to form an integrated circuit.

Example 14

With reference to FIGS. 27 and 28A through 28J, a resonance tunneling transistor in a fourteenth example according to the present invention will be described. FIG. 27 is a cross sectional view of a resonance tunneling transistor 5010 in accordance with the fourteenth example. FIGS. 28A through 28J are cross sectional views illustrating the steps of producing the resonance tunneling transistor 5010.

As illustrated in FIG. 27, the resonance tunneling transistor 5010 includes: a silicon substrate 5101 having a surface orientation of (001) (hereinafter, referred to as the (001) silicon substrate). The (001) silicon substrate 5101 has a first groove 5107 having a substantially diamond-shaped cross section and a second groove 5109 having a V-shaped cross section. The first and the second grooves 5107 and 5109 are formed by anisotropic etching, and are parallel or perpendicular to the <110> crystal orientation of the (001) silicon substrate 5101. The first and the second grooves 5107 and 5109 respectively have maximum depths of 1450 nm and 770 nm.

The first and the second grooves 5107 and 5109 sandwich a silicon thin plate 5110 therebetween. The silicon thin plate 5110 has an entirely uniform thickness of 20 to 50 nm, preferably of 20 nm so that a quantum effect is generated in the silicon thin plate 5110 to allow the silicon thin plate 5110 to act as a quantum well. The silicon thin plate 5110 is formed during the anisotropic etching for forming the first and the second grooves 5107 and 5109 by partially leaving single crystal-line silicon forming the (001) silicon substrate 5101 in a small thickness. The surface of the silicon thin plate 5110 has a surface orientation of (111).

Surfaces of the first and the second grooves 5107 and 5109 including the areas acting as surfaces of the silicon thin plate 5110 have a surface orientation of (111). On the surfaces of the first and the second grooves 5107 and 5109, silicon oxide films 5111 are provided with a uniform thickness. The silicon oxide films 5111 each have a thickness of 2 nm to 4 nm, preferably of 3 nm.

On a surface of the (001) silicon substrate 5101 including an area acting as a surface of the silicon thin plate 5110, an etching protection film 5102 is provided. The etching protection film 5102 is formed of a thermal oxide film and has a thickness of 100 nm. The etching protection film 5102 overhangs at the ends of the first and the second grooves 5107 and 5109.

The first groove 5107 is filled with a first electrode 5114, and the second groove 5109 is filled with a second electrode 5115. The first and the second electrodes 5114 and 5115 are formed of polysilicon including an n-type impurity doped thereto at a high density. As the n-type impurity, phosphorus (P) or arsenic (As), or the like which is generally used in the field of semiconductors can be used. In this example, as described later, the first and the second electrodes 5114 and 5115 are formed of polysilicon including phosphorus doped thereto by thermal diffusion at a density of $1 \times 10^{19}$ cm$^{-3}$ or more.

The first and the second electrodes 5114 and 5115 entirely cover the silicon oxide films 5111 provided on the first and the second grooves 5107 and 5109. The first and the second electrodes 5114 and 5115 are partially projected above the etching protection film 5102.

Further, a third electrode 5141 is provided over a double barrier structure 5112 with the etching protection film 5102 interposed therebetween. By applying appropriate voltage to the third electrode 5141, potential of the thin silicon plate 5110 is controlled.

The double barrier structure 5112 for generating a resonance tunneling effect includes lamination of the silicon thin plate 5110 and the silicon oxide films 5111. The silicon thin plate 5110 acts as a quantum well, and the silicon oxide films 5111 provided on the silicon thin plate 5110 act as tunneling barriers of the double barrier structure 5112. In summary, the resonance tunneling transistor 5010 includes the double barrier structure 5112, the first and the second electrodes 5114 and 5115 sandwiching the double barrier structure 5112, and the third electrode 5141.

In the resonance tunneling transistor 5010 having the above-described configuration, the silicon thin plate 5110 acting as the quantum well is a part of the (001) silicon substrate 5101. Accordingly, the crystallinity of the silicon thin plate 5110 is as high as that of the (001) silicon substrate 5101. Since high quality oxide films 5111 are used as the tunneling barriers, the potential barrier is high. Furthermore, since the interface between the silicon thin plate 5110 and the silicon oxide films 5111 has a surface orientation of (111), which is smooth in the atomic order, the range of voltages for generating a resonance tunneling effect is very narrow, and thus a satisfactory resonance tunneling effect of electrons is obtained. By applying voltage of an appropriate level to the third electrode 5141, potential in the quantum well is controlled in a desired manner. The use of silicon which is convenient for mass production and is inexpensive contributes to reduction in the production cost and enhancement in the production efficiency.

With reference to FIGS. 28A through 28J, a production method of the resonance tunneling transistor 5010 in this example will be described.

Figure 28A:
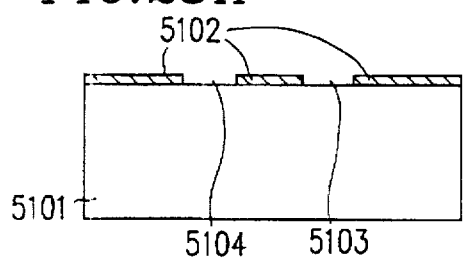
FIGS. 28A through 28J are cross sectional views illustrating the steps of producing the! resonance tunneling transistor in accordance with the fourteenth example.

As illustrated in FIG. 28A, the etching protection film 5102 is formed in a thickness of 100 nm by thermal oxidation at a temperature of 900° C. for 54.5 minutes on the (001) silicon substrate 5101 formed of an n-type silicon. On the etching protection film 5102, a resist pattern having a pair of openings is formed by photolithography. The pair of openings are parallel to each other, and both are rectangular with a width of 500 nm. The pair of openings have an interval of 800 nm therebetween. The pair of openings are provided for forming the first and the second grooves 5107 and 5109. The pair of openings are located so that the sides thereof in the normal to the plane of the paper in FIG. 28A are parallel or perpendicular to the <110> crystal orientation of the (001) silicon substrate 5101 with an error of ±1 degree.

The etching protection film 5102 is treated with reactive ion etching (RIE) using the resist pattern as a mask, and $O_2$ and $CF_4$ as etching gases to form a first opening 5103 and a second opening 5104 in the etching protection film 5102. The resist pattern is removed after RIE to obtain the configuration shown in FIG. 28A.

Figure 28B:
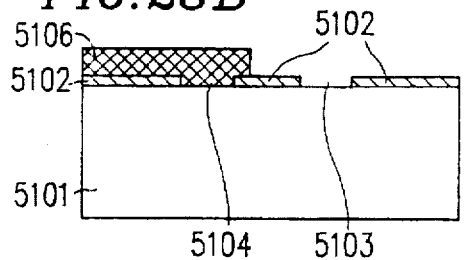
Figure 28C:
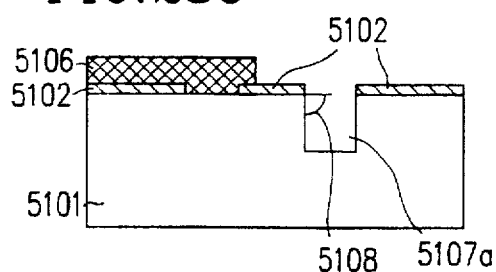
Figure 28D:
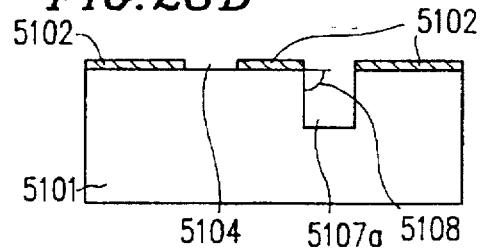

As shown in FIG. 28B, a resist mask 5106 formed of an etchant resistive material is formed on the (001) silicon substrate 5101, covering the second opening 5104. Dry etching is performed using the etching protection film 5102 and the resist mask 5106 as a mask, and $SiCl_4$, $CH_2F_2$, $SF_6$, and $O_2$ as etching gases to form a groove 5107a in positional correspondence with the first opening 5103 as illustrated in FIG. 28C. The groove 5107a has a depth of 900 nm. The resist mask 5106 is removed to obtain the configuration shown in FIG. 28D. The groove 5107a is formed so that a depression angle 5108 made by the surface of the (001) silicon substrate 5101 and a side wall of the groove 5107a is 90 degrees or more. In FIG. 28D, the depression angle 5108 is 90 degrees.

Then, the (001) silicon substrate 5101 is treated with crystalline anisotropic etching (wet chemical etching) using a mixture liquid of ethylene diamine ($NH_2(CH)_2NH_2$), pyrocatechol ($C_6H_4(OH)_2$) and pure water as an etchant. The etching rate of the crystalline anisotropic etching using the above-described etchant is lower with respect to the (111) plane than with respect to the (001) plane and the (110) plane by approximately two digits. Accordingly, etching is performed non-uniformly from the side walls and a bottom face of the groove 5107a and an area of the surface of the (001) silicon substrate 5101 corresponding to the second opening 5104. As a result, the groove 5107a is formed into the first groove 5107 having a substantially diamond-shaped cross section, and the second groove 5109 having a V-shaped cross section is formed in positional correspondence with the second opening 5104 in the (001) silicon substrate 5101.

The mole ratio of the ethylene diamine, pyrocatechol and pure water mixture liquid is, for example, 43.8:4.2:52. In this case, if the temperature of the mixture liquid is set to be 80° C., the etching rate of the (111) plane 5130 is approximately 7 nm/min.

Figure 28E:
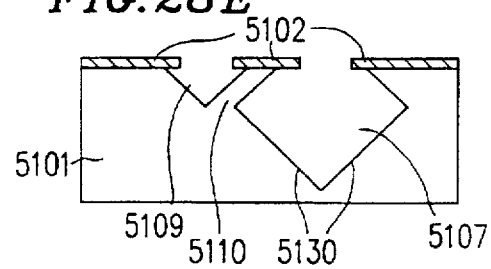

During the etching process, by controlling the etching rate and the etching time, the silicon thin plate 5110 having a thickness of 20 to 50 nm and acting as the quantum well is formed between the first groove 5107 and the second groove 5109 as shown in FIG. 28E. In this example, the etching rate and the etching time are set so that the thickness of the silicon thin plate 5110 will be 20 nm.

The crystalline anisotropic etching provides the following advantages: (1) the surfaces of the silicon thin plate 5110 obtained by the etching is flat; (2) the high crystallinity of the (001) silicon substrate 5101 is maintained in the silicon thin plate 5110; and (3) since the silicon thin plate 5110 is formed utilizing the difference in the etching rate depending on the crystal-line orientation, the thickness thereof is uniform and the damage by etching thereto is significantly reduced.

The etching protection film 5102 on the (001) silicon substrate 5101 is not etched. Accordingly, the etching protection film 5102 overhangs at the ends of the first and the second grooves 5107 and 5109. Therefore, the silicon thin plate 5110 having a thickness of 20 to 50 nm is superposed by the etching protection film 5102 having a width of 800 nm corresponding to the width of the interval between the first opening 5103 and the second opening 5104.

Figure 28F:
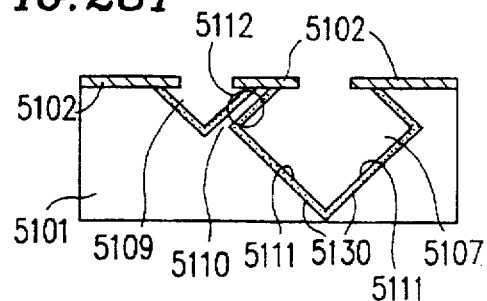

Then, the (001) silicon substrate 5101 is thermally oxidized in an oxygen atmosphere at a temperature of 900° C. By such oxidation, the thickness of the etching protection film 5102 is increased, and the silicon oxide films 5111 are formed having a thickness of 2 to 4 nm on the surfaces of the first and the second grooves 5107 and 5109 including the surfaces of the silicon thin plate 5110 as is shown in FIG. 28F. As a result, the double barrier structure 5112 including the silicon thin plate 5110 and the silicon oxide films 5111 sandwiching the silicon thin plate 5110 is formed. The thickness of the silicon oxide films 5111 can be adjusted by controlling the oxidation time. In this example, oxidation conditions are set so that the thickness will be 3 nm.

Then, the first electrode 5114 and the second electrode 5115 are formed so as to sandwich the double barrier structure 5112 in the following manner.

Figure 28G:
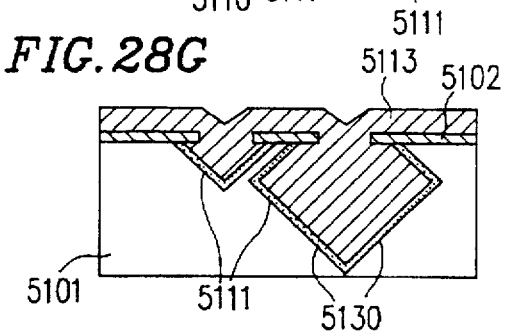
Figure 28H:
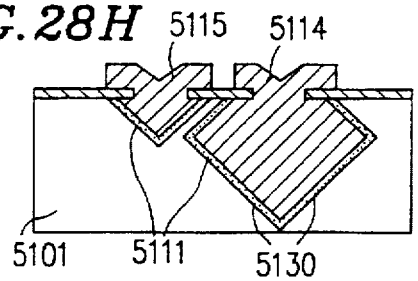

As illustrated in FIG. 28G, a polysilicon layer 5113 is formed on the surface of the etching protection film 5102, filling the first and the second grooves 5107 and 5109 by LPCVD. The polysilicon layer 5113 has a thickness of 500 nm on the etching protection film 5102. Next, the polysilicon layer 5113 is treated by annealing at a temperature of 900° C. for 20 minutes in an atmosphere of $POCl_3$ to diffuse phosphorus as an n-type impurity into the polysilicon layer 5113 at a high density of $4 \times 10^{19}$ $cm^{-3}$ or more. The resultant polysilicon including phosphorus is used as a material for the first and the second electrodes 5114 and 5115. The polysilicon layer 5113 is patterned by photolithography and then treated with dry etching using $SiCl_4$, $CH_2F_2$, $SF_6$ and $O_2$ as etching gases to form the first electrode 5114 and the second electrode 5115 as illustrated in FIG. 28H.

Figure 28I:
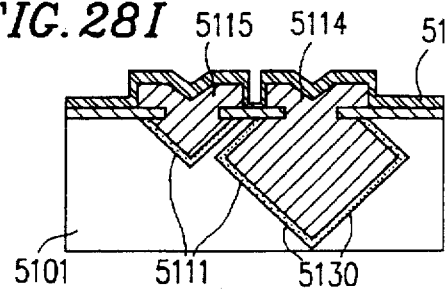
Figure 28J:
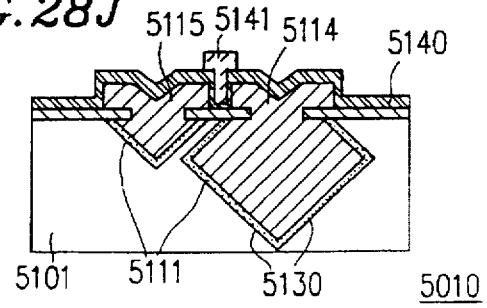

Then, as shown in FIG. 28I, an insulating layer 5140 is deposited so as to cover the etching protection film 5102 as well as the first and the second electrodes 5114 and 5115. Then, an AlSiCu layer is deposited on the insulating layer to a thickness, for example, of 1000 nm, and a resist pattern having a predetermined pattern is formed on the AlSiCu layer by photolithography. By conducting a dry etching process, the AlSiCu layer is patterned in accordance with the resist pattern so as to form a third electrode 5141 in the vicinity of the thin silicon plate 5110, as shown in FIG. 28J.

In this manner, the resonance tunneling transistor 5010 in this example according to the present invention having the double barrier structure 5112 including the silicon oxide film 5111 (acting as the tunneling barrier), the silicon thin plate 5110 (acting as the quantum well) and the silicon oxide film 5111 (acting as the tunneling barrier), and also including three terminals, namely, the first through the third electrodes 5114, 5115 and 5141, is produced.

The silicon oxide films 5111 acting as the tunneling barriers may be formed by chemical deposition instead of thermal oxidation. The tunneling barrier may be formed of a nitride film which is formed by thermal nitriding in a nitrogen atmosphere or chemical deposition, a nitride oxide film, or a SiC film or a SiGe film which is formed of crystal growth.

The etching protection film 5102 may be formed of any other material and by any other method so long as the film provides protection against an etchant. For example, the etching protection film 5102 may be formed of a nitride film or a chrome film.

The substrate 5101 may be formed of a p-type substrate, in which case the first and the second electrodes 5114 and 5115 are formed of polysilicon including a p-type impurity diffused therein.

The etchant for crystalline anisotropic etching may be a mixture liquid of hydrazine, isopropyl alcohol and pure water or an aqueous solution of potassium hydroxide.

Example 15

Figure 29:
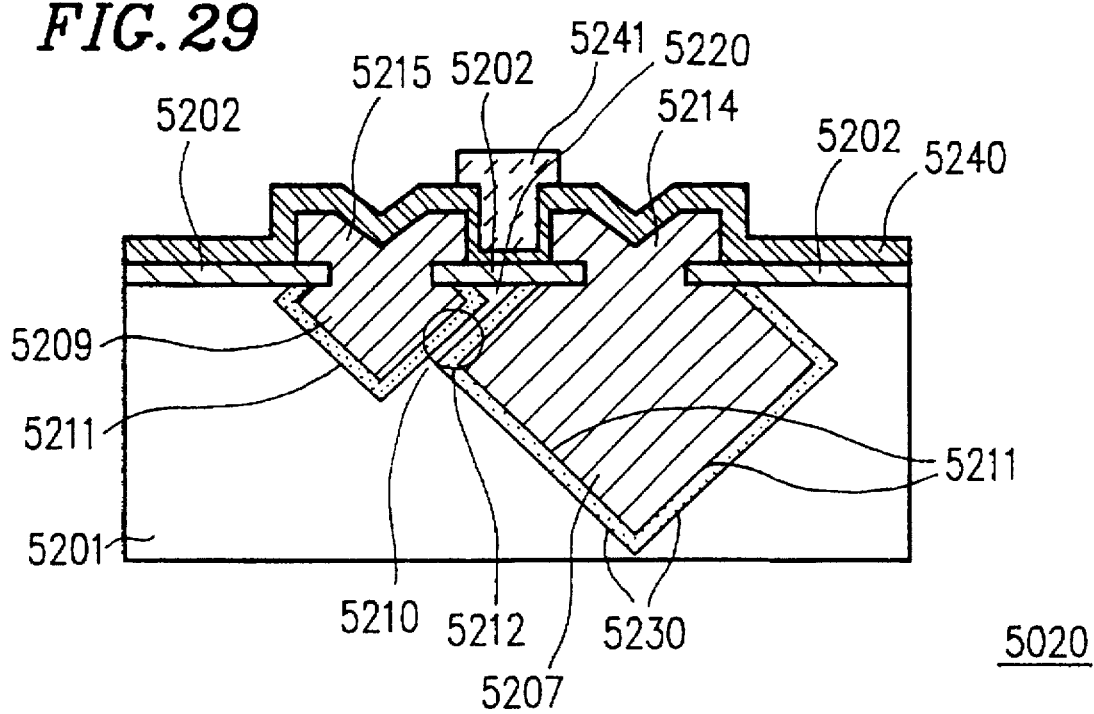
FIG. 29 is a cross sectional view of a resonance tunneling transistor in a fifteenth example according to the present invention.

With reference to FIGS. 29 and 30A through 30L, a resonance tunneling transistor in a fifteenth example according to the present invention will be described. FIG. 29 is a cross sectional view of a resonance tunneling transistor 5020 in accordance with the fifteenth example. FIGS. 30A through 30L are cross sectional views illustrating the steps of producing the resonance tunneling transistor 5020. Elements identical with those in the fourteenth example bear the similar reference numerals, and the explanations thereof will be omitted.

As illustrated in FIG. 29, the resonance tunneling transistor 5020, similar with the resonance tunneling transistor 5010 in the fourteenth example, includes the (001) silicon substrate 5201. In the (001) silicon substrate 5201, the double barrier structure 5212, including the silicon thin plate 5210 and the silicon oxide films 5211 provided on two surfaces of the silicon thin plate 5210, is provided. The double barrier structure 5212 is sandwiched between the first electrode 5214 and the second electrode 5215 which act as two terminals. The third electrode 5241 is further provided. The surfaces of the first and the second grooves 5207 and 5209 are formed of a (111) plane 5230.

The main difference between the resonance tunneling transistor 5020 in this example and the resonance tunneling transistor 5010 in the previous example is that the second groove 5209 has a substantially diamond-shaped cross section which is similar to that of the first groove 5207. As a result, the silicon thin plate 5210 includes an etching protection film supporting area 5220 having a reverse triangular cross section in a top part thereof which is immediately below the etching protection film 5202. Due to the etching protection film supporting area 5220, the silicon thin plate 5210 supports the etching protection film 5202 more strongly.

In the resonance tunneling transistor 5020 having the above-described configuration, the double barrier structure 5212 is formed deep below the surface of the (001) silicon substrate 5201. Therefore, areas of the silicon thin plate 5210 in contact with the first and the second electrodes 5214 and 5215 are larger than the case of the first example, and thus the tunneling current can be increased.

With reference to FIGS. : 30A through 30L, a production method of the resonance tunneling transistor 5020 in this example will be described.

Figure 30A:
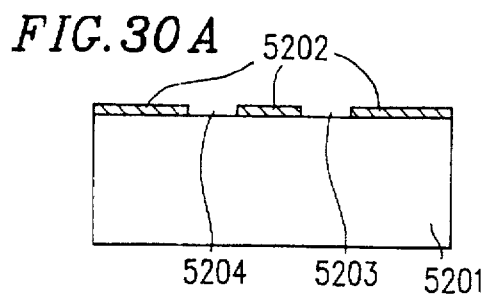
FIGS. 30A through 30L are cross sectional views illustrating the steps of producing the resonance tunneling transistor in accordance with the fifteenth example.

As illustrated in FIG. 30A, the etching protection film 5202 is formed in a thickness of 100 nm by thermal oxidation at a temperature of 900° C. for 54.5 minutes on the (001) silicon substrate 5201 formed of an n-type silicon. On the etching protection film 5202, the resist pattern having a pair of openings is formed by photolithography. The pair of openings are parallel to each other, and both are rectangular with a width of 500 nm. The openings have an interval of 800 nm therebetween. The openings are provided for forming the first and the second grooves 5207 and 5209. The openings are located so that the sides thereof in the direction normal to the plane of the paper in FIG. 30A are parallel or perpendicular to the <110> crystal orientation of the (001) silicon substrate 5201 with an error of ±1 degree.

The etching protection film 5202 is treated with RIE using the resist pattern as a mask and $O_2$ and $CF_4$ as etching gases to form the first opening 5203 and the second opening 5204 in the etching protection film 5202. The resist pattern is removed after RIE to obtain the configuration shown in FIG. 30A.

Figure 30G:
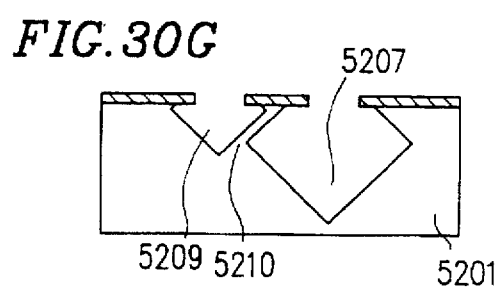
Figure 30B:
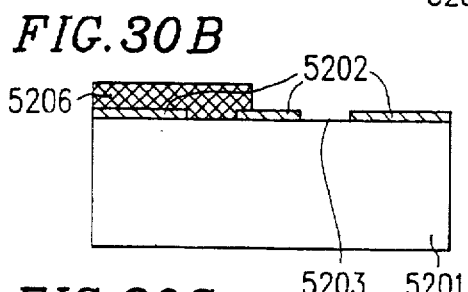
Figure 30H:
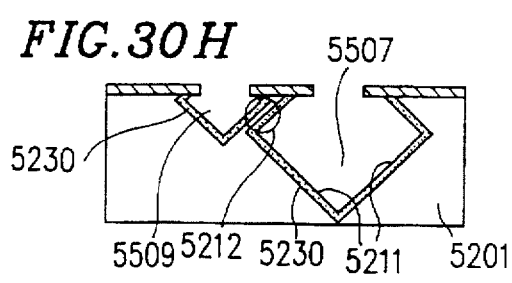
Figure 30C:
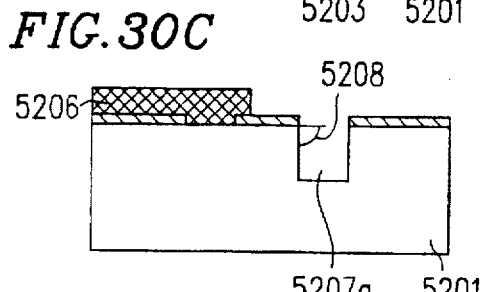
Figure 30I:
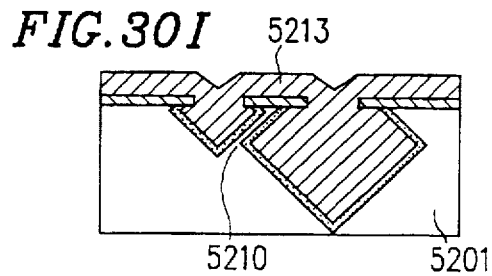

As shown in FIG. 30B, a resist mask 5206 formed of an etchant resistive material is formed on the (001) silicon substrate 5201, covering the second opening 5204. Dry etching is performed using the etching protection film 5202 and the resist mask 5206 as a mask, and $SiCl_4$, $CH_2F_2$, $SF_6$, and $O_2$ as etching gases to form the groove 5207a in positional correspondence with the first opening 5203 as illustrated in FIG. 30C. The groove 5207a has a depth of 900 nm. The groove 5207a is formed so that the depression angle 5208 made by the surface of the (001) silicon substrate 5201 and the side wall of the groove 5207a is 90 degrees or more. In FIG. 30C, the depression angle 5208 is 90 degrees.

Figure 30D:
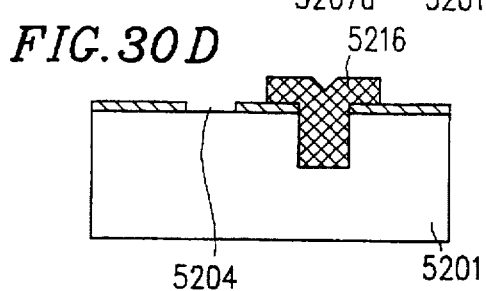
Figure 30J:
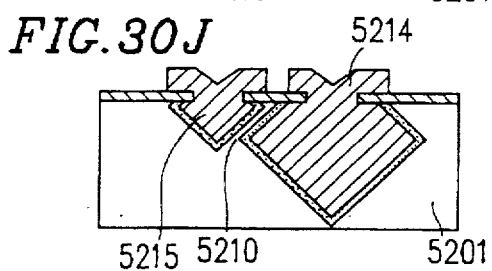
Figure 30E:
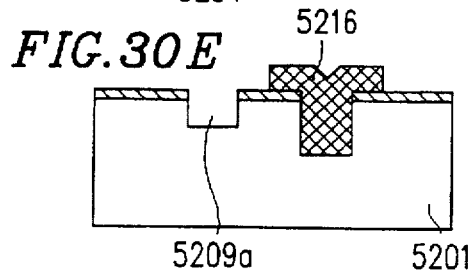
Figure 30K:
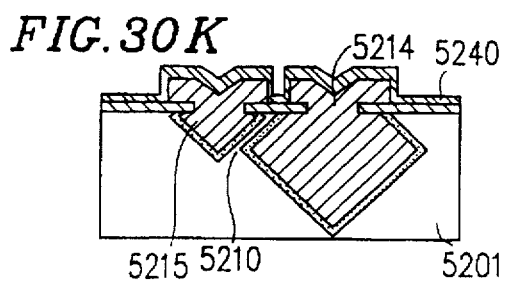
Figure 30F:
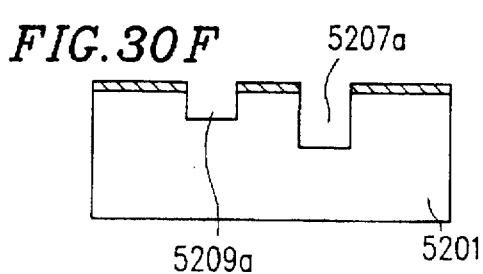
Figure 30L:
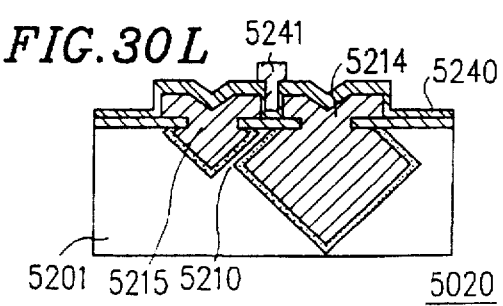

After the resist mask 5206 is removed, another resist mask 5216 is formed to fill the groove 5207a as illustrated in FIG. 30D. Dry etching is performed in the same manner as that for forming the groove 5207a to form a groove 5209a in positional correspondence with the second opening 5204 as illustrated in FIG. 30E. The groove 5209a has a depth of 400 nm. The resist mask 5216 is removed to obtain the configuration shown in FIG. 30F. The groove 5209a is formed so that a depression angle made by the surface of the (001) silicon substrate 5201 and a side wall of the groove 5209a is 90 degrees or more. In FIG. 30F, the depression angle is 90 degrees.

The (001) silicon substrate 5201 is treated with crystalline anisotropic etching using a mixture liquid of ethylene diamine ($NH_2(CH)_2NH_2$), pyrocatechol ($C_6H_4(OH)_2$) and pure water as an etchant in the same manner as described in the fourteenth example. As a result of the crystal-line anisotropic etching, the groove 5207a is formed into the first groove 5207 having a substantially diamond-shaped cross section, and the groove 5209a is formed into the second groove 5209 having a substantially diamond-shaped cross section in the (001) silicon substrate 5201, thereby also forming the silicon thin plate 5210, as shown in FIG. 30G.

Then, the silicon oxide films 5211, the first electrode 5214, the second electrode 5215 and the third electrode 5241 are formed in the same manner as described in the first example (FIGS. 30H through 30L).

In this manner, the resonance tunneling transistor 5020 in the fifteenth example according to the present invention having the double barrier structure 5212 including the silicon oxide film 5211 (acting as the tunneling barrier), the silicon thin plate 5210 (acting as the quantum well) and the silicon oxide film 5211 (acting as the tunneling barrier), and also including three terminals, namely, the first through the third electrodes 5214, 5215 and 5241 is produced. In the resonance tunneling transistor 5020, the double barrier structure 5212 is preferably formed at a depth of 200 nm from the surface of the (001) silicon substrate 5201.

The silicon oxide films 5211 acting as the tunneling barriers may be formed by chemical deposition instead of thermal oxidation. The tunneling barrier may be formed of a nitride film which is formed by thermal nitriding in a nitrogen atmosphere or chemical deposition, a nitride oxide film, or a SiC film or a SiGe film which is formed of crystal growth.

The etching protection film 5202 may be formed of any other material and by any other method so long as the film provides protection against an etchant. For example, the etching protection film 5202 may be formed of a nitride film or a chrome film.

The substrate 5201 may be formed of a p-type substrate, in which case the first and the second electrodes 5214 and 5215 are formed of polysilicon including a p-type impurity diffused therein.

The etchant for crystalline anisotropic etching may be a mixture liquid of hydrazine, isopropyl alcohol and pure water or an aqueous solution of potassium hydroxide.

Example 16

With reference to FIGS. 31A through 31J, a resonance tunneling transistor in a sixteenth example according to the present invention will be described. FIGS. 31A through 31J are cross sectional views illustrating the steps of producing a resonance tunneling transistor 5030 in accordance with this example.

The resonance tunneling transistor 5030 has basically the same configuration as that of the resonance tunneling transistor 5020 in accordance with the fifteenth example. Elements identical with those in the fifteenth example bear the similar reference numerals, and the explanations thereof will be omitted.

The main difference between the resonance tunneling transistor 5030 and the resonance tunneling transistor 5020 is that the thickness of a silicon oxide film provided on the surface of the first groove is different from the thickness of a silicon oxide film provided on the surface of the second groove. Accordingly, the resonance tunneling transistor 5030 has an asymmetrical double barrier structure.

With reference to FIGS. 31A through 31J, a production method of the resonance tunneling diode 5030 in this example will be described.

Figure 31A:
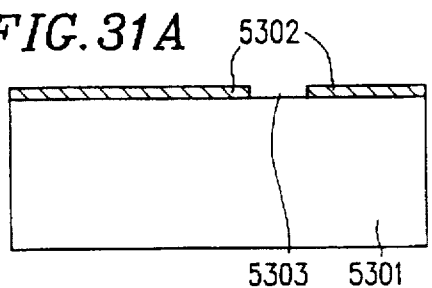
FIGS. 31A through 31J are cross sectional views illustrating the steps of producing a resonance tunneling transistor in a sixteenth example according to the present invention.

As illustrated in FIG. 31A, the etching protection film 5302 having the first opening 5303 is formed in a thickness of 100 nm on the (001) silicon substrate 5301 formed of an n-type silicon in the same manner as described in the fifteenth example. The first opening 5303 is rectangular, and the sides thereof in the direction normal to the plane of the paper in FIG. 31A are parallel or perpendicular to the <110> crystal orientation of the (001) silicon substrate 5301 with an error of ±1 degree.

Figure 31B:
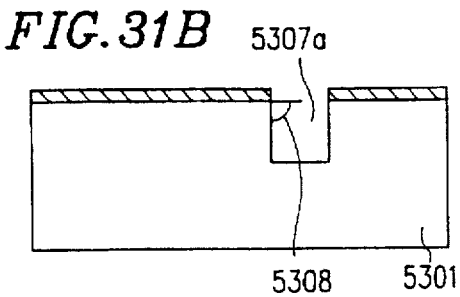

As shown in FIG. 31B, the groove 5307a is formed in the (001) silicon substrate 5301 in positional correspondence with the first opening 5303 by dry etching using $SiCl_4$, $CH_2F_2$, $SF_6$, and $O_2$ as etching gases in the same manner as described in the fifteenth example. The groove 5307a has a depth of 900 nm. The groove 5307a is formed so that the depression angle 5308 made by the surface of the (001) silicon substrate 5301 and the side wall of the groove 5307a is 90 degrees or more. In FIG. 31B, the depression angle 5308 is 90 degrees.

Figure 31C:
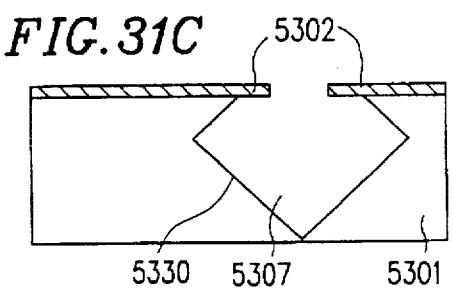

In the same manner described in the previous examples, the (001) silicon substrate 5301 is treated with crystalline anisotropic etching using a mixture liquid of ethylene diamine ($NH_2(CH)_2NH_2$), pyrocatechol ($C_6H_4(OH)_2$) and pure water as an etchant. As a result, the groove 5307a is formed into the first groove 5307 having a substantially diamond-shaped cross section in the (001) silicon substrate 5301 as illustrated in FIG. 31C.

Figure 31D:
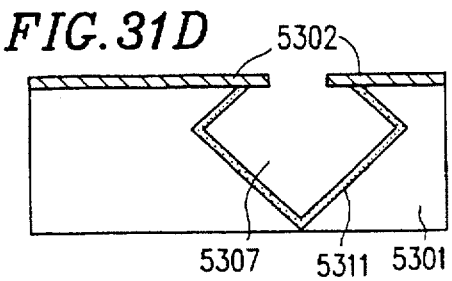

Then, the (001) silicon substrate 5301 is thermally oxidized in an atmosphere of oxygen at a temperature of 900° C. By controlling the time period of oxidation, the silicon oxide film 5311 having a thickness of 2 to 4 nm, preferably of 3 nm, is formed on the surface of the first groove 5307 as shown in FIG. 31D.

Figure 31E:
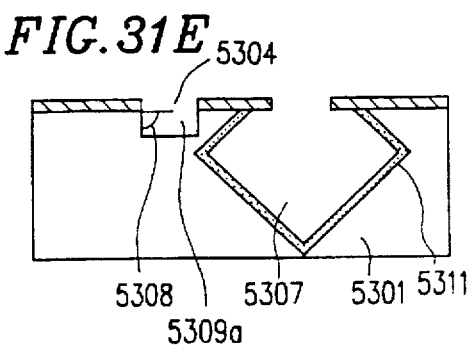
Figure 31F:
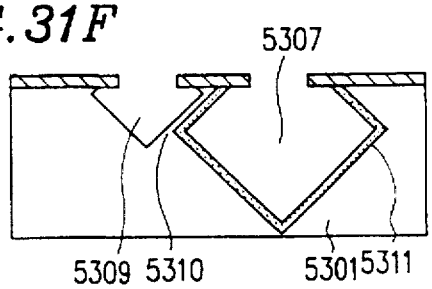

The etching protection film 5302 is then etched to form the second opening 5304 which is also rectangular and parallel to the first opening ! 5303. Dry etching is performed in the same manner as that for forming the first groove 5307a to form the first groove 5307 in the (001) silicon substrate 5301 in positional correspondence with the second opening 5304 as shown in FIG. 31E. The groove 5309a has a depth of 400 nm, and the depression angle made by the surface of the (001) silicon substrate 5301 and the side wall of the groove 5309a is 90 degrees or more. Next, crystalline anisotropic etching is performed in the same manner as that for forming the first groove 5307 to form the groove 5309a into the second groove 5309 having a substantially diamond-shaped cross section in the (001) silicon substrate 5301 as shown in FIG. 31F. As a result, a silicon thin plate 5310 sandwiched between the first groove 5307 and the second groove 5309 is formed. Because the silicon oxide film 5311 is on the surface of the first groove 5307, an area of the (001) silicon substrate 5301 surrounding the first groove 5307 is not etched by the crystalline anisotropic etching. The surfaces of the first and the second grooves 5307 and 5309 are formed of a (111) plane 5330.

Figure 31G:
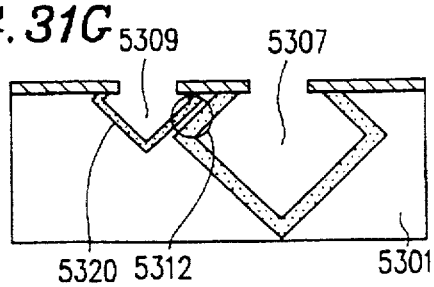

Next, the (001) silicon substrate 5301 is thermally oxidized in an atmosphere of oxygen at a temperature of 900° C. By controlling the time period of oxidation, the silicon oxide film 5320 having a thickness of 2 to 4 nm, preferably of 3 nm, is formed on the surface of the second groove 5309. Since the silicon oxide film 5311 is also oxidized during the oxidation for forming the silicon oxide film 5320, the thickness of the silicon oxide film 5311 on the surface of the first groove 5307 is approximately doubled. Accordingly, the silicon oxide films 5311 and 5320 respectively having the thicknesses of 6 nm and 3 nm are formed on the two surfaces of the silicon thin film 5310 as illustrated in FIG. 31G.

Figure 31H:
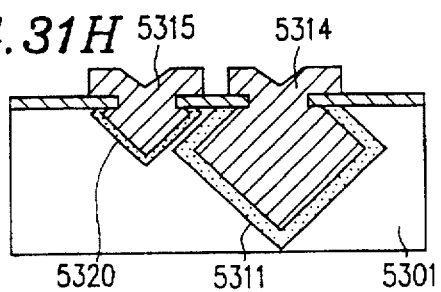
Figure 31I:
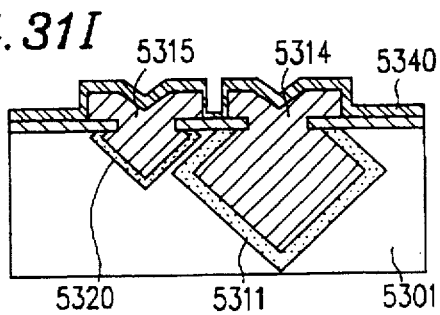
Figure 31J:
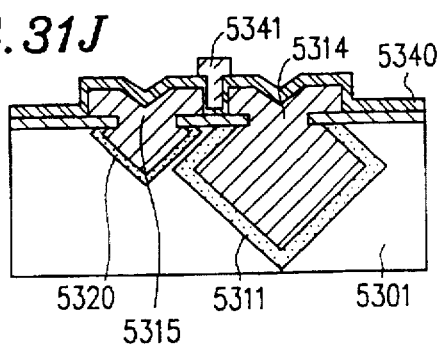

Then, the first electrode 5314 and the second electrode 5315 formed of polysilicon including an n-type impurity diffused therein at a high density, as well as the third electrode 5341, are formed in the same manner as described in the fourteenth and fifteenth examples (FIGS. 31H through 31J).

In this manner, the resonance tunneling transistor 5030 in the sixteenth example according to the present invention having the double barrier structure 5312 including the silicon oxide film 5311 (acting as the tunneling barrier), the silicon thin plate 5310 (acting as the quantum well) and the silicon oxide film 5320 (acting as the tunneling barrier), and also including three terminals, namely, the first through the third electrodes 5314, 5315 and 5341 is produced.

The silicon oxide films 5311 and 5320 acting as the tunneling barriers may be formed by chemical deposition instead of thermal oxidation. The tunneling barrier may be formed of a nitride film which is formed by thermal nitriding in a nitrogen atmosphere or chemical deposition, a nitride oxide film, or a SiC film or a SiGe film which is formed of crystal growth.

The etching protection film 5302 may be formed of any other material and by any other method so long as the film provides protection against an etchant. For example, the etching protection film 5302 may be formed of a nitride film or a chrome film.

The substrate 5301 may be formed of a p-type substrate, in which case the first and the second electrodes 5314 and 5315 are formed of polysilicon including a p-type impurity diffused therein.

The etchant for crystalline anisotropic etching may be a mixture liquid of hydrazine, isopropyl alcohol and pure water or an aqueous solution of potassium hydroxide.

A resonance tunneling transistor 5010 described in the fourteenth example may have such an asymmetrical double barrier structure as described in this example.

Example 17

Figure 32:
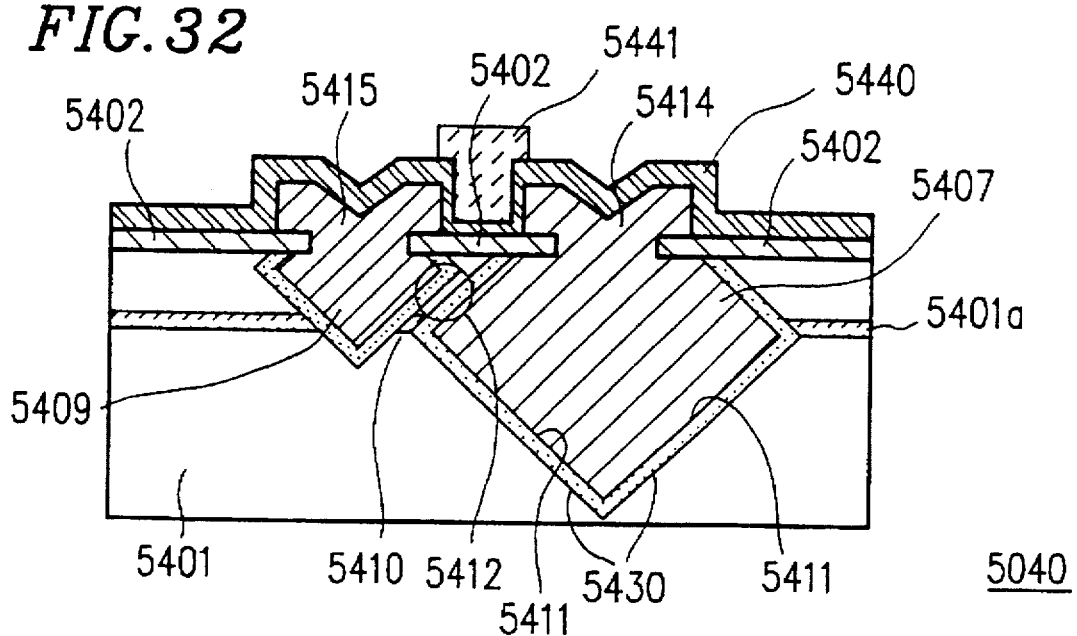
FIG. 32 is a cross sectional view of a resonance tunneling transistor in a seventeenth example according to the present invention.

With reference to FIGS. 32 and 33A through 33K, a resonance tunneling diode in a seventeenth example according to the present invention will be described. FIG. 32 is a cross sectional view of a resonance tunneling transistor 5040 in the seventeenth example, and FIGS. 33A through 33K are cross sectional views illustrating the steps of producing the resonance tunneling transistor 5040. The resonance tunneling transistor 5040 has basically the same configuration with that of the resonance tunneling transistor 5010 in accordance with the fourteenth example. Elements identical with those in the fourteenth example bear the similar reference numerals, and the explanations thereof will be omitted.

The main difference between the resonance tunneling transistor 5040 and the resonance tunneling transistor 5010 is that a p-type impurity layer 5401a is provided in the (001) silicon substrate 5401.

The p-type impurity layer 5401a is located at around a depth where the silicon thin plate 5410 contacts the (001) silicon substrate 5401, namely, at the lowermost portion of the silicon thin plate 5410, and electrically isolates the silicon thin plate 5410 acting as the quantum well from the (001) silicon substrate 5401. Because of such a configuration, the resonance tunneling transistor 5040, including the double barrier structure 5412 and the first through the third electrodes 5414, 5415 and 5441, prohibits generation of electric current leakage through the (001) silicon substrate 5401.

With reference to FIGS. 33A through 33K, a production method of the resonance tunneling transistor 5040 in this example will be described.

Figure 33A:
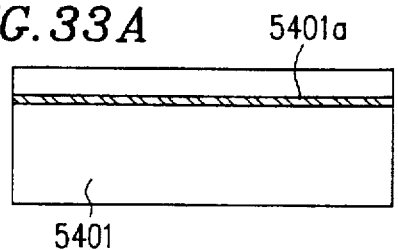
FIGS. 33A through 33K are cross sectional views illustrating the steps of producing the resonance tunneling transistor in accordance with the seventeenth example.
Figure 33B:
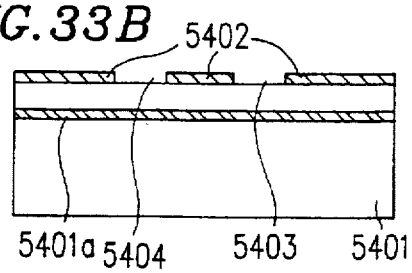
Figure 33C:
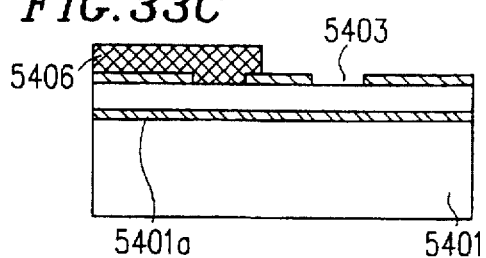
Figure 33D:
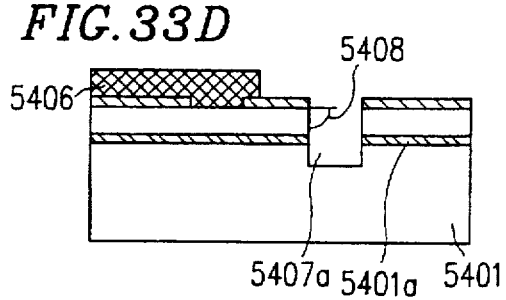
Figure 33E:
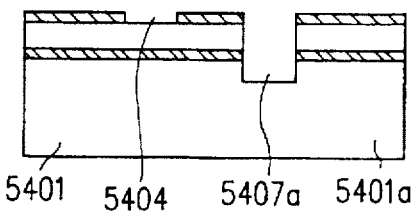
Figure 33F:
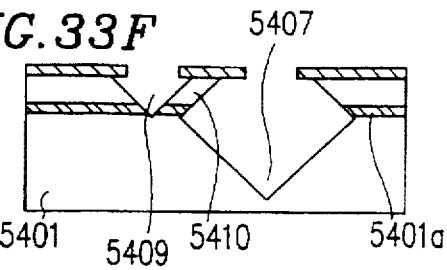
Figure 33G:
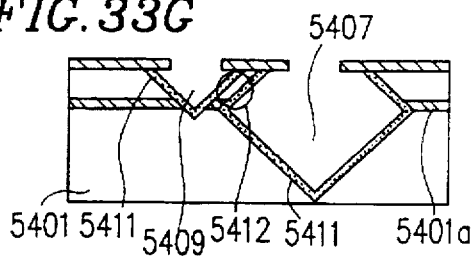
Figure 33H:
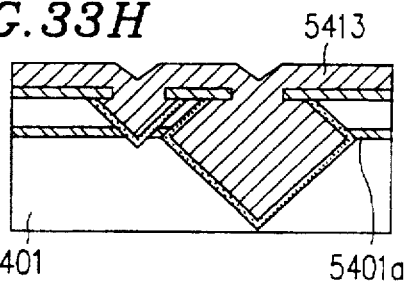
Figure 33I:
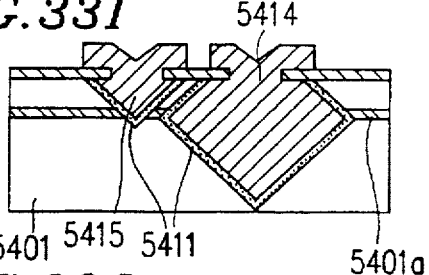
Figure 33J:
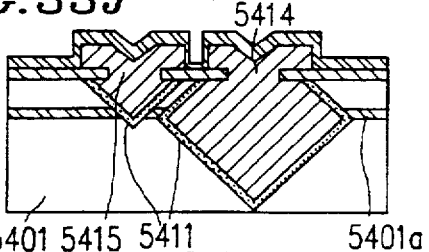
Figure 33K:
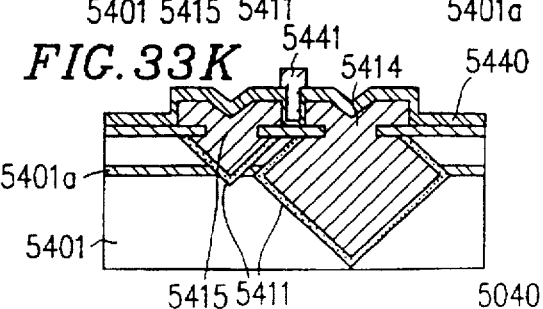

First, boron ions as a p-type impurity are implanted into the n-type (001) silicon substrate 5401 at an acceleration energy of 200 keV in a dose of $1\times10^{15}$ cm$^{-2}$. Next, annealing is performed at a temperature of 900° C. for 20 minutes to form the p-type impurity layer 5401a having a thickness of approximately 200 nm at around a depth of approximately 500 nm from the surface of the (001) silicon substrate 5401 as illustrated in FIG. 33A.

After that, by the processes described in the fourteenth examples (shown in FIGS. 33B through 33K), the resonance tunneling transistor 5040 in the seventeenth example according to the present invention having the double barrier structure 5412 including the silicon oxide film 5411 (acting as the tunneling barrier), the silicon thin plate 5410 (acting as the quantum well) and the silicon oxide film 5411 (acting as the tunneling barrier), and also including three terminals, namely, the first through the third electrodes 5414, 5415 and 5441 is produced.

The resonance tunneling transistors 5020 and 5030 described in the fifteenth and the sixteenth examples may have such a p-type impurity layer. The same effect can be obtained. In any of the above-described transistors, an n-type impurity layer may be provided in a p-type (001) silicon substrate.

In the case when a p-type substrate is used as the (001) silicon substrate 5401, phosphorus ions as an n-type impurity are implanted at an acceleration energy of 400 keV in a dose of $1\times10^{15}$ cm$^{-2}$, and annealing is performed at a temperature of 900° C. for 20 minutes. In this manner, an n-type layer having a thickness of approximately 400 nm is formed at around a depth of approximately 500 nm from the surface of the (001) silicon substrate 5401.

The silicon oxide films 5411 acting as the tunneling barriers may be formed by chemical deposition instead of thermal oxidation. The tunneling barrier may be formed of a nitride film which is formed by thermal nitriding in a nitrogen atmosphere or chemical deposition, a nitride oxide film, or a SiC film or a SiGe film which is formed of crystal growth.

The etching protection film 5402 may be formed of any other material and by any other method so long as the film provides protection against an etchant. For example, the etching protection film 5402 may be formed of a nitride film or a chrome film.

The etchant for crystalline anisotropic etching may be a mixture liquid of hydrazine, isopropyl alcohol and pure water or an aqueous solution of potassium hydroxide.

Example 18

With reference to FIGS. 34A through 34K, a resonance tunneling diode in an eighteenth example according to the present invention will be described. FIGS. 34A through 34K are cross sectional views illustrating the steps of producing a resonance tunneling transistor 5050 in accordance with the eighteenth example. The resonance tunneling transistor 5050 has basically the same configuration with that of the resonance tunneling transistor 5010 in accordance with the fourteenth example. Elements identical with those in the fourteenth example bear the similar reference numerals and the explanations thereof will be omitted.

The main difference between the resonance tunneling transistor 5050 and the resonance tunneling transistor 5010 is that an impurity layer having an opposite conductivity to that of the (001) silicon substrate is provided on each of the surfaces of the first and the second grooves, except for the areas acting as the surfaces of the silicon thin plate. Hereinafter, such surfaces will be referred to as the "bottom surfaces" of the first and the second grooves. On each of the impurity layers, a silicon oxide film having a larger thickness than that of the silicon oxide film in the fourteenth example is provided by an oxidation acceleration effect, namely, a phenomenon that formation of an oxide film is accelerated when conducted on an impurity layer. Due to such a configuration, the (001) silicon substrate is electrically isolated from the first and the second electrodes by the impurity layer and the thick silicon oxide film. Accordingly, electric current leakage through the (001) silicon substrate is restricted.

With reference to FIGS. 34A through 34K, a production method of the resonance tunneling transistor 5050 in this example will be described.

As illustrated in FIGS. 34A through 34E, the etching protection film 5502 is formed on the (001) silicon substrate 5501; and the first and the second grooves 5507 and 5509, and the silicon thin plate 5510 are formed in the (001) silicon substrate 5501 in the same manner as described in the fourteenth example with reference to FIGS. 28A through 28E.

Figure 34A:
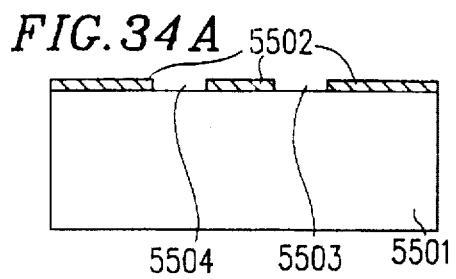
FIGS. 34A through 34K are cross sectional views illustrating the steps of producing a resonance tunneling transistor in an eighteenth example according to the present invention.
Figure 34B:
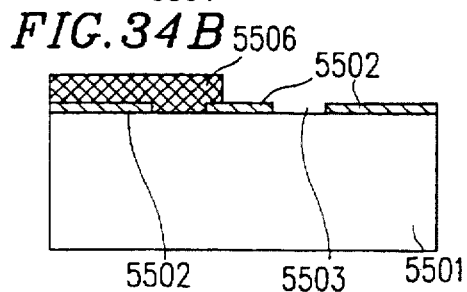
Figure 34C:
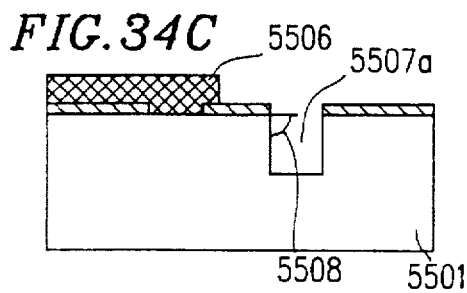
Figure 34D:
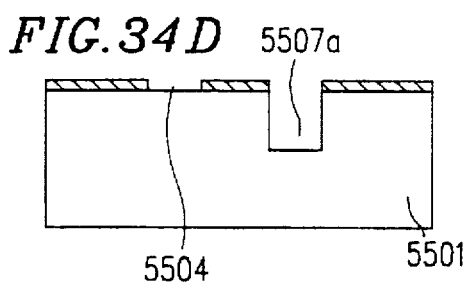
Figure 34E:
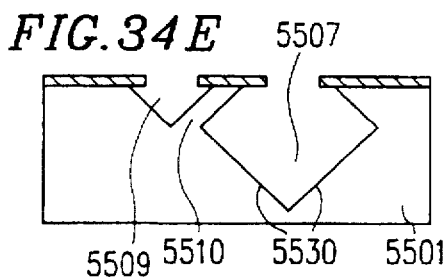
Figure 34F:
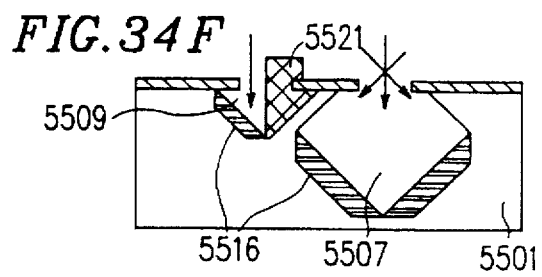

As shown in FIG. 34F, a resist mask 5521 filling half of the second groove 5509 which is closer to the first groove 5507 than the other half is formed. Next, boron ions are implanted into the (001) silicon substrate 5501 at an acceleration energy of 100 keV in a dose of $2\times10^{13}$ cm$^{-2}$ in a direction normal to the surface of the (001) silicon substrate 5501 and directions which are offset by 30 degrees, 60 degrees and 120 degrees from the normal direction. In this manner, the p-type impurity layers 5516 are formed on the bottom surfaces of the first and the second grooves 5507 and 5509. Because of the resist mask 5521 and the above-mentioned implantation directions of the boron ions, the p-type impurity layer 5516 is not formed on the two surfaces of the silicon thin plate 5510.

Figure 34G:
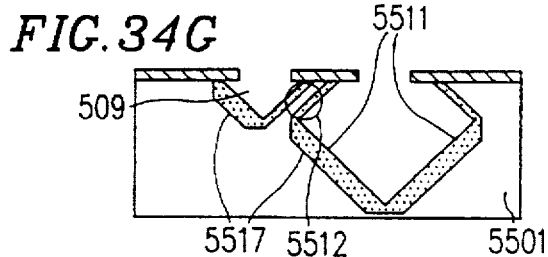
Figure 34H:
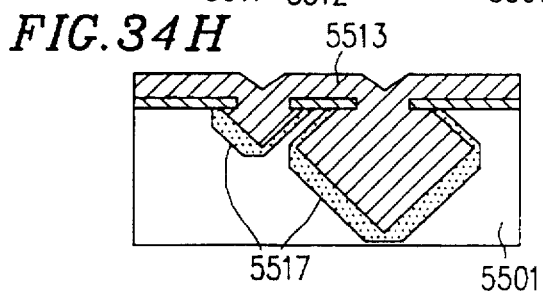
Figure 34I:
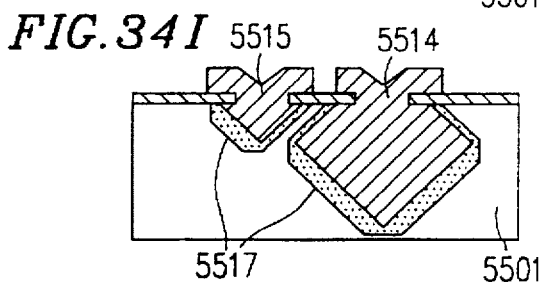
Figure 34J:
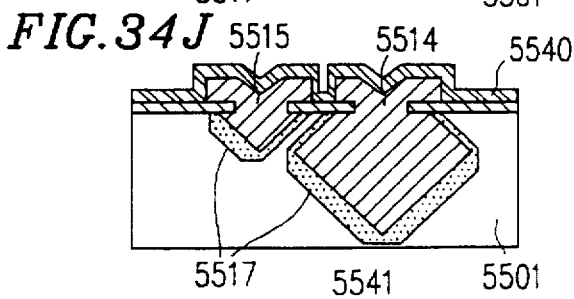
Figure 34K:
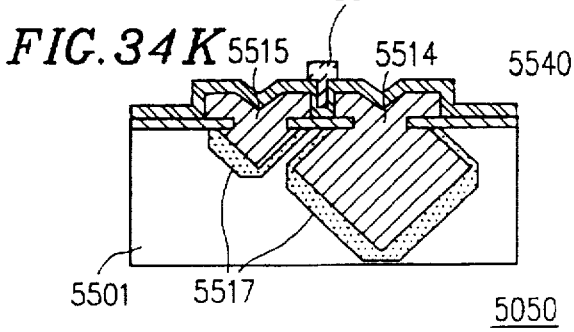

After the resist mask 5521 is removed, thermal oxidation is performed at a temperature of 900° C. in an oxygen atmosphere to form silicon oxide films 5517 on the surfaces of the first and the second grooves 5507 and 5509 as illustrated in FIG. 34G. On the two surfaces of the silicon thin plate 5510, the silicon oxide films 5511 are each formed in a thickness of 2 to 4 nm, preferably of 3 nm as is described in the fourteenth example. On the bottom surfaces of the first and the second grooves 5507 and 5509 provided with the p-type impurity layers 5516, the silicon oxide films 5517 each having a thickness of 10 nm are formed because of the oxidation acceleration effect. The p-type impurity layers 5516 are not shown in FIGS. 34G through 34K.

Next, as shown in FIGS. 3.4H and 34I, the first and the second electrodes 5514 and 5515 are formed of polysilicon including an n-type impurity diffused therein. Then, the third electrode 5541 is formed in the steps shown in FIGS. 34J and 34K.

In this manner, the resonance tunneling transistor 5050 in the eighteenth example according to the present invention having the double barrier structure 5512 including the silicon oxide film 5511 (acting as the tunneling barrier), the silicon thin plate 5510 (acting as the quantum well) and the silicon oxide film 5511 (acting as the tunneling barrier), and also including three terminals, namely, the first through the third electrodes 5514, 5515 and 5541, is produced.

A p-type substrate may be used as the (001) silicon substrate 5501, in which case, the first and the second electrodes 5514 and 5515 are formed of polysilicon including a p-type impurity diffused therein. In such a case, the impurity layer 5516 is formed by implanting n-type ions such as phosphorus ions or arsenic ions.

The etching protection film 5502 may be formed of any other material and by any other method so long as the film provides protection against an etchant. For example, the etching protection film 5502 may be formed of a nitride film or a chrome film.

The etchant for crystalline anisotropic etching may be a mixture liquid of hydrazine, isopropyl alcohol and pure water or an aqueous solution of potassium hydroxide.

The resonance tunneling transistors 5020, 5030 and 5040 in accordance with the fifteenth through seventeenth examples may have the impurity layer described in this example on the bottom surfaces of the first and the second grooves.

Example 19

With reference to FIGS. 35A through 35F, a resonance tunneling transistor in a nineteenth example according to the present invention will be described. FIGS. 35A through 35F are cross sectional views illustrating the steps of producing a resonance tunneling transistor 5060 in accordance with this example. The resonance tunneling transistor 5060 has basically the same configuration with that of the resonance tunneling transistor 5010 in accordance with the fourteenth example. Elements identical with those in the fourteenth example bear the similar reference numerals and the explanations thereof will be omitted.

The main difference between the resonance tunneling transistor 5060 and the resonance tunneling transistor 5010 is that an impurity layer is provided in the (001) silicon substrate. The impurity layer has an opposite conductivity to that of the (001) silicon substrate. In such a configuration, the silicon thin plate is provided in the impurity layer.

With reference to FIGS. 35A through 35F, a production method of the resonance tunneling transistor 5060 in this example will be described.

Figure 35A:
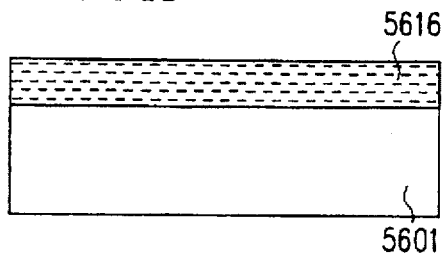
FIGS. 35A through 35F are cross sectional views illustrating the steps of producing a resonance tunneling transistor in a nineteenth example according to the present invention.
Figure 35B:
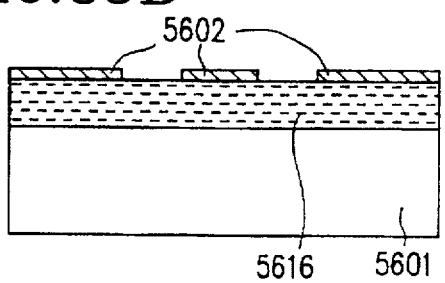
Figure 35C:
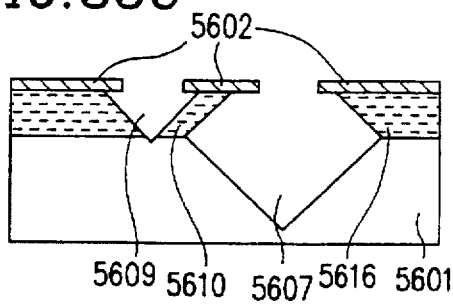
Figure 35D:
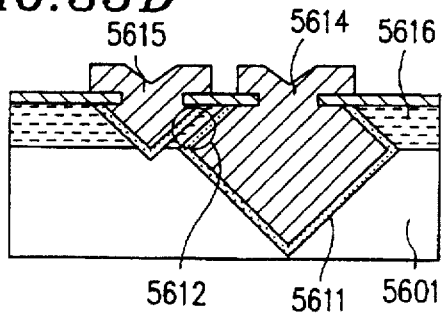
Figure 35E:
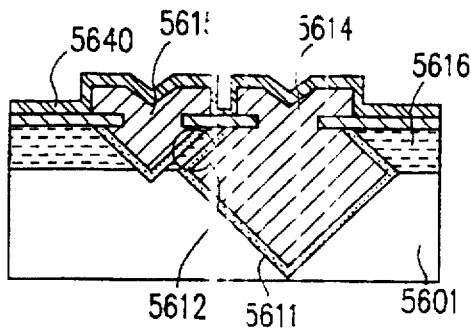

First, phosphorus ions as an n-type impurity are implanted into the p-type (001) silicon substrate 5601 at an acceleration energy of 250 keV in a dose of $1 \times 10^{15}$ $cm^{-2}$. Next, annealing is performed at a temperature of 900° C. for 30 minutes to form the n-type impurity layer 5616 having a thickness of approximately 400 nm immediately below the surface of the (001) silicon substrate 5601 as illustrated in FIG. 35A.

After that, by the processes shown in FIGS. 35B through 35F which are similar in the corresponding process described in the fourteenth example, the resonance tunneling transistor 5060 in this example according to the present invention having the double barrier structure 5612 including the silicon oxide film 5611 (acting as the tunneling barrier), the silicon thin plate 5610 (acting as the quantum well) and the silicon oxide film 5611 (acting as the tunneling barrier), and also including three terminals, namely, the first through the third electrodes 5614, 5615 and 5641 is produced.

Figure 35F:
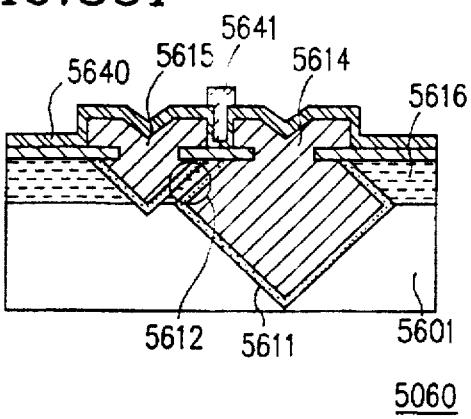

As illustrated in FIG. 35F, the silicon thin plate 5610, which is a part of the double barrier structure 5612, is formed in the impurity layer 5616, and the impurity layer 5616 and the (001) silicon substrate 5601 form a P/N junction. In the resonance tunneling transistor 5060 having such a configuration, current leakage from the double barrier structure 5612 to the (001) silicon substrate 5601 can be restricted by applying an inverted bias voltage between the (001) silicon substrate 5601 and the impurity layer 5616.

An n-type substrate may be used as the (001) silicon substrate 5601, in which case, the impurity layer 5616, and the first and the second electrodes 5614 and 5615 include a p-type impurity diffused therein.

The resonance tunneling transistors 5020 and 5030 in accordance with the fifteenth and the sixteenth examples may have the impurity layer 5616, as in this example.

The silicon oxide films 5611 acting as the tunneling barriers may be formed by chemical deposition instead of thermal oxidation. The tunneling barrier may be formed of a nitride film which is formed by thermal nitriding in a nitrogen atmosphere or chemical deposition, a nitride oxide film, or a SiC film or a SiGe film which is formed of crystalline growth.

The etching protection film 5602 may be formed of any other material and by any other method so long as the film provides protection against an etchant. For example, the etching protection film 5602 may be formed of a nitride film or a chrome film.

The etchant for crystalline anisotropic etching may be a mixture liquid of hydrazine, isopropyl alcohol and pure water or an aqueous solution of potassium hydroxide.

Example 20

Figure 36A:
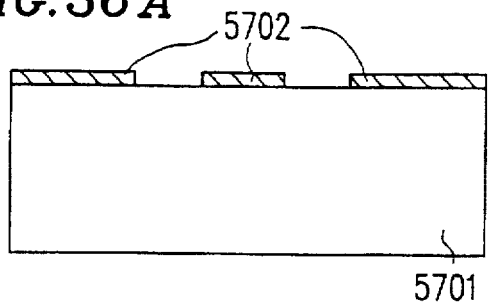
FIGS. 36A through 36H are cross sectional views illustrating the steps of producing a resonance tunneling transistor in a twentieth example according to the present invention.
Figure 36B:
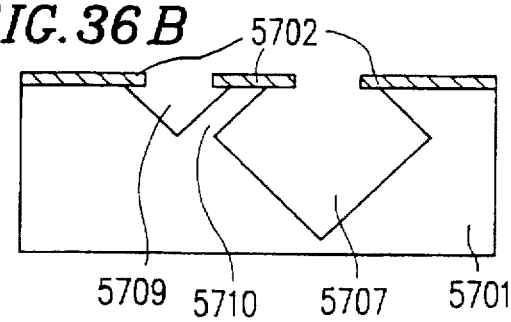
Figure 36C:
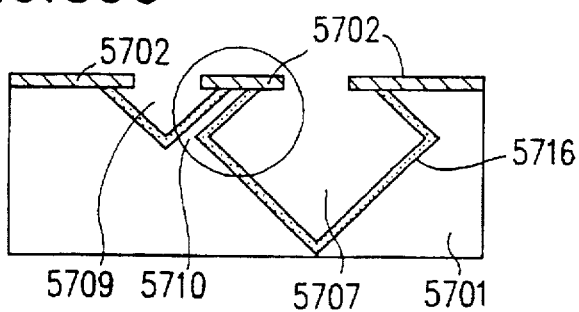
Figure 36D:
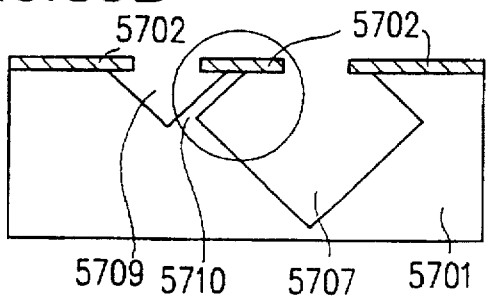
Figure 36E:
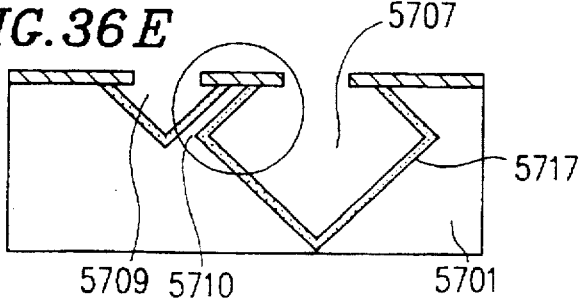
Figure 36F:
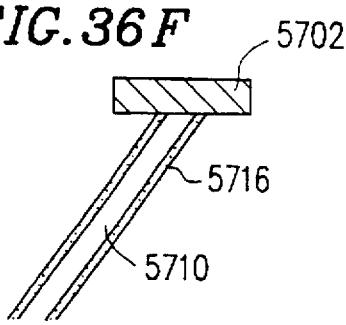
Figure 36G:
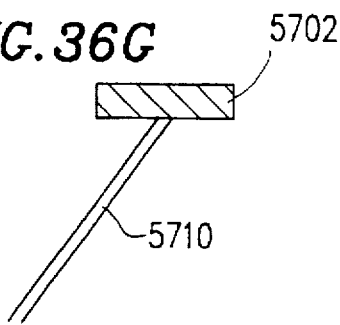
Figure 36H:
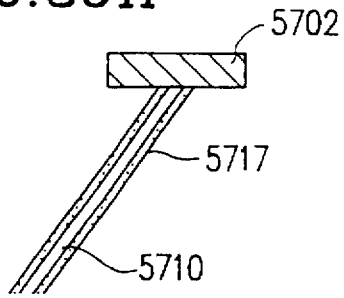

With reference to FIGS. 36A through 36H, a resonance tunneling transistor in a twentieth example according to the present invention will be described. FIGS. 36A through 36E are cross sectional views illustrating the steps of producing a resonance tunneling transistor in accordance with this example. FIGS. 36F, 36G and 36H are enlarged cross sectional views of the silicon thin plate 5710 and the vicinity thereof, respectively corresponding to the steps shown in FIGS. 36C, 36D and 36E (the circled parts in the respective figures). The resonance tunneling transistor in the twentieth example has basically the same configuration with that of the resonance tunneling transistor 5010 in accordance with the fourteenth example. Elements identical with those in the fourteenth example bear the similar reference numerals, and the explanations thereof will be omitted.

The main difference between the resonance tunneling transistor in this example and the resonance tunneling transistor 5010 is that the silicon thin plate has a thickness of 10 nm, which is less than the value of 20 to 50 nm obtained in the case of the resonance tunneling transistor 5010.

With reference to FIGS. 36A through 36H, a production method of the resonance tunneling transistor in this example, by which the thickness of the silicon thin plate 5710 can be accurately controlled to be small, will be described.

As shown in FIG. 36A and 36B, the silicon thin plate 5710, having a thickness of 30 nm sandwiched between the first and the second grooves 5707 and 5709, is formed in the (001) silicon substrate 5701 in the same manner as described in the fourteenth example.

Then, by the following manner, the thickness of the silicon thin plate 5710 is decreased to an extent which is impossible to realize by crystalline anisotropic etching.

Thermal oxidation is performed at a temperature of 90° C. for 20 minutes to form first silicon oxide films 5716 each having a thickness of 10 nm on the surfaces of the first and the second grooves 5707 and 5709 including the areas acting as the two surfaces of the silicon thin plate 5710 as illustrated in FIGS. 36C and 36F. Next, as illustrated in FIG. 36D and 36G, the first silicon oxide films 5716 are removed by etching using hydrogen fluoride. Thermal oxidation is again performed under the same conditions as mentioned above to form second silicon oxide films 5717, each having a thickness of 3 nm on the surfaces of the first and the second grooves 5707 and 5709 including the areas acting as the two surfaces of the silicon thin plate 5710, as illustrated in FIGS. 36E and 36H. By such repetition of oxidation and removal of the oxide films, the thickness of the silicon thin plate 5710 is decreased down to as thin as 10 nm.

Although not shown in the drawings, after the above-described process, the first and the second electrodes 5714 and 5715 formed of polysilicon including an n-type impurity diffused therein are formed in the (001) silicon substrate 5701 in the same manner as described in the fourteenth example. Further, the third electrode 5741 is also provided.

In this manner, the resonance tunneling transistor in the twentieth example according to the present invention having the double barrier structure 5712 including the silicon oxide film 5717 (acting as the tunneling barrier), the silicon thin plate 5710 (acting as the quantum well) and the silicon oxide film 5717 (acting as the tunneling barrier), and also including three terminals, namely, the first through the third electrodes 5714, 5715 and 5741, is produced.

Since the thin silicon plate 5710 acting as the quantum well in this example is thinner than those in the resonance tunneling transistors in the previous examples, the pitch between resonance levels is larger than those in the previous examples. Therefore, the resonance tunneling transistor in this example exhibits the negative resistance characteristic more explicitly, and thus is operated more stably than the transistors in the previous examples.

A p-type substrate may be used as the (001) silicon substrate 5701, in which case, the first and the second electrodes 5714 and 5715 are formed of polysilicon including a p-type impurity diffused therein.

The etching protection film 5702 may be formed of any other material and by any other method so long as the film provides protection against an etchant. For example, the etching protection film 5702 may be formed of a nitride film or a chrome film.

The etchant for crystalline anisotropic etching may be a mixture liquid of hydrazine, isopropyl alcohol and pure water or an aqueous solution of potassium hydroxide.

The resonance tunneling transistors 5020 through 5060 in accordance with the fifteenth through nineteenth examples may have such a silicon thin plate 5710 with a reduced width as mentioned in the seventh example.

Example 21

With reference to FIGS. 37A through 37J, a resonance tunneling transistor in a twenty-first example according to the present invention will be described. FIGS. 37A through 37J are cross sectional views illustrating the steps of producing a resonance tunneling transistor 5080 in accordance with this example. The resonance tunneling transistor 5080 has basically the same configuration with that of the resonance tunneling transistor 5010 in accordance with the fourteenth example. Elements identical with those in the fourteenth example bear the similar reference numerals and the explanations thereof will be omitted.

The main difference between the resonance tunneling transistor 5080 and the resonance tunneling transistor 5010 is that the third electrode in this example is formed to have a wide width reaching over the first and the second electrodes, in contrast with the third electrode in the resonance tunneling transistor 5010 having a narrow width which corresponds only to the width of the thin silicon plate. According to the wider width of the third electrode, electrons which are injected from the third electrode, by the voltage application thereto, into the double tunneling barrier are concentrated in a channel region below the third electrode. Thus, the electrons are efficiently introduced into the double tunneling barrier from the third electrode, resulting in enhanced current amplifying ratio as well as improved P/V ratio.

With reference to FIGS. 37A through 37J, a production method of the resonance tunneling transistor in this example will be described.

According to the steps shown in FIGS. 37A through 37G, the double barrier structure 5812 including the silicon oxide film 5811 (acting as the tunneling barrier), the silicon thin plate 5810 (acting as the quantum well) and the silicon oxide film 5811 (acting as the tunneling barrier) is provided. Then, the polysilicon film 5813 is deposited and then doped with impurities at a high concentration. The polysilicon film 5813 is then patterned by photolithography so as to form the first and the second electrodes 5814 and 5815, as shown in FIG. 37H. The interval between the first electrode 5814 and the second electrode 5815 is set wider as compared with the previous example, for example, at about 800 nm.

Then, an insulating film 5840 is deposited by HTO so as to cover the first and the second electrodes 5814 and 5815 at a thickness of, for example, about 100 nm.

An AlSiCu film is then deposited on the insulating film 5840 and patterned so as to form the third electrode 5841 extending from above the thin silicon plate 5810 to above the first and the second electrodes 5814 and 5815.

In this manner, the resonance tunneling transistor in the twenty-first example according to the present invention having the double barrier structure 5812 including the silicon oxide film 5811 (acting as the tunneling barrier), the silicon thin plate 5810 (acting as the quantum well) and the silicon oxide film 5811 (acting as the tunneling barrier), and also including three terminals, namely, the first through the third electrodes 5814, 5815 and 5841, is produced.

Example 22

With reference to FIGS. 38A through 38J, a resonance tunneling transistor in a twenty-second example according to the present invention will be described. FIGS. 38A through 38J are cross sectional views illustrating the steps of producing a resonance tunneling transistor 5090 in accordance with this example. The resonance tunneling transistor 5090 has basically the same configuration with that of the resonance tunneling transistor 5010 in accordance with the fourteenth example. Elements identical with those in the fourteenth example bear the similar reference numerals and the explanations thereof will be omitted.

The main difference between the resonance tunneling transistor 5090 and the resonance tunneling transistor 5010 is that a fourth electrode and a fifth electrode are further formed, respectively, over the first and the second electrode in addition to the third electrode. According to this configuration, electrons which are injected from the third electrode, by the voltage application thereto, into the double tunneling barrier are concentrated in a channel region below the third electrode. Thus, the electrons are efficiently introduced into the double tunneling barrier from the third electrode, resulting in enhanced current amplifying ration as well as improved P/V ratio.

With reference to FIGS. 38A through 38J, a production method of the resonance tunneling transistor in this example will be described.

Figure 38A:
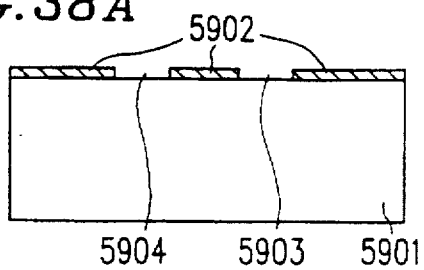
FIGS. 38A through 38J are cross sectional views illustrating the steps of producing a resonance tunneling transistor in a twenty-second example according to the present invention.
Figure 38B:
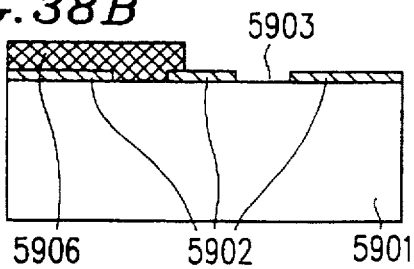
Figure 38C:
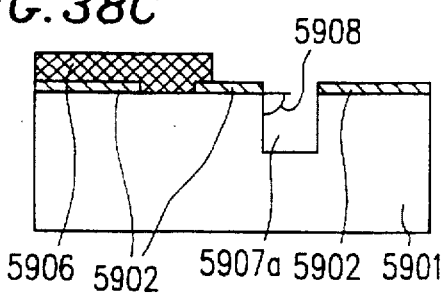
Figure 38D:
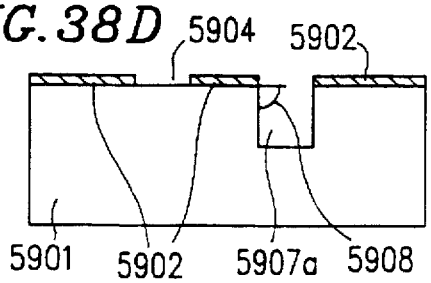
Figure 38E:
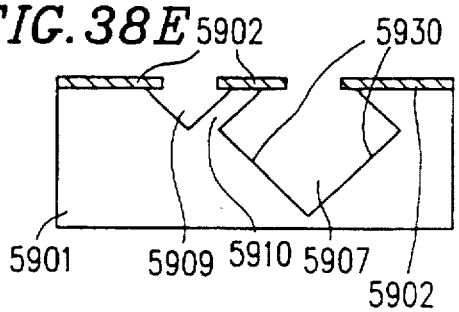
Figure 38F:
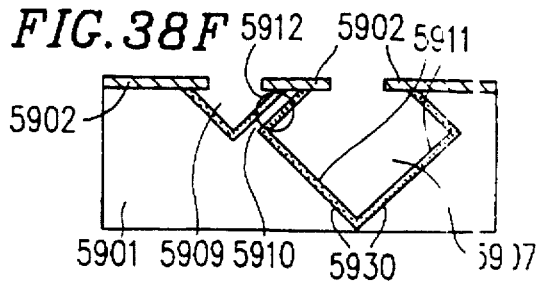
Figure 38G:
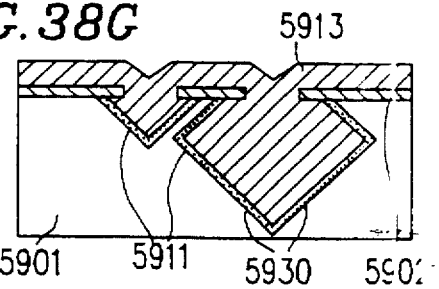
Figure 38H:
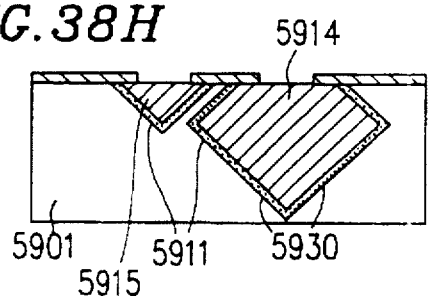

According to the steps shown in FIGS. 38A through 38F, the double barrier structure 5912 including the silicon oxide film 5911 (acting as the tunneling barrier), the silicon thin plate 5910 (acting as the quantum well) and the silicon oxide film 5911 (acting as the tunneling barrier) is provided. Then, the polysilicon film 5913 is deposited and doped with impurities at a high concentration. Then, the polysilicon film 5913 is patterned by photolithography so as to form the first and the second electrodes 5914 and 5915. Thereafter, the polysilicon film 5913 is etched back by dry etching at portions corresponding to the first and second openings 5903 and 5904 to place the surface of the polysilicon film 5913 in these portions at the same level as the surface of the etching protection film 5902, as shown in FIG. 38H.

Figure 38I:
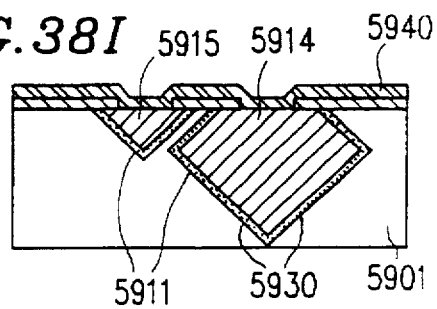

Then, as shown in FIG. 38I, an insulating film 5940 is deposited by HTO so as to cover the first and the second electrodes 5914 and 5915 at a thickness of, for example, about 100 nm.

Figure 38J:
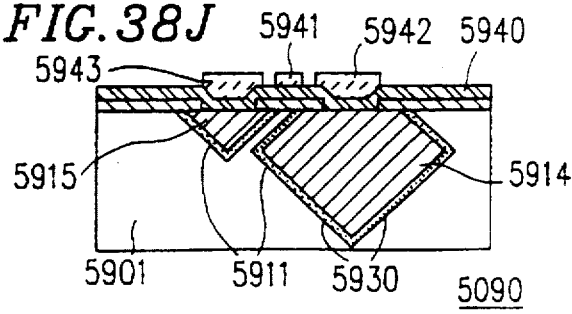

An AlSiCu film is then deposited on the insulating film 5940 and patterned so as to form the third electrode 5941 over the thin silicon plate 5910, the fourth electrode 5942 over the first electrode 5914 and the fifth electrode 5943 over the second electrodes 5915, as shown in FIG. 38J.

In this manner, the resonance tunneling transistor in the twenty-second example according to the present invention having the double barrier structure 5912 including the silicon oxide film 5911 (acting as the tunneling barrier), the silicon thin plate 5910 (acting as the quantum well) and the silicon oxide film 5911 (acting as the tunneling barrier), and also including five terminals, namely, the first through the fifth electrodes 5914, 5915 and 5941 to 5943, is produced.

Example 23

Figure 39A:
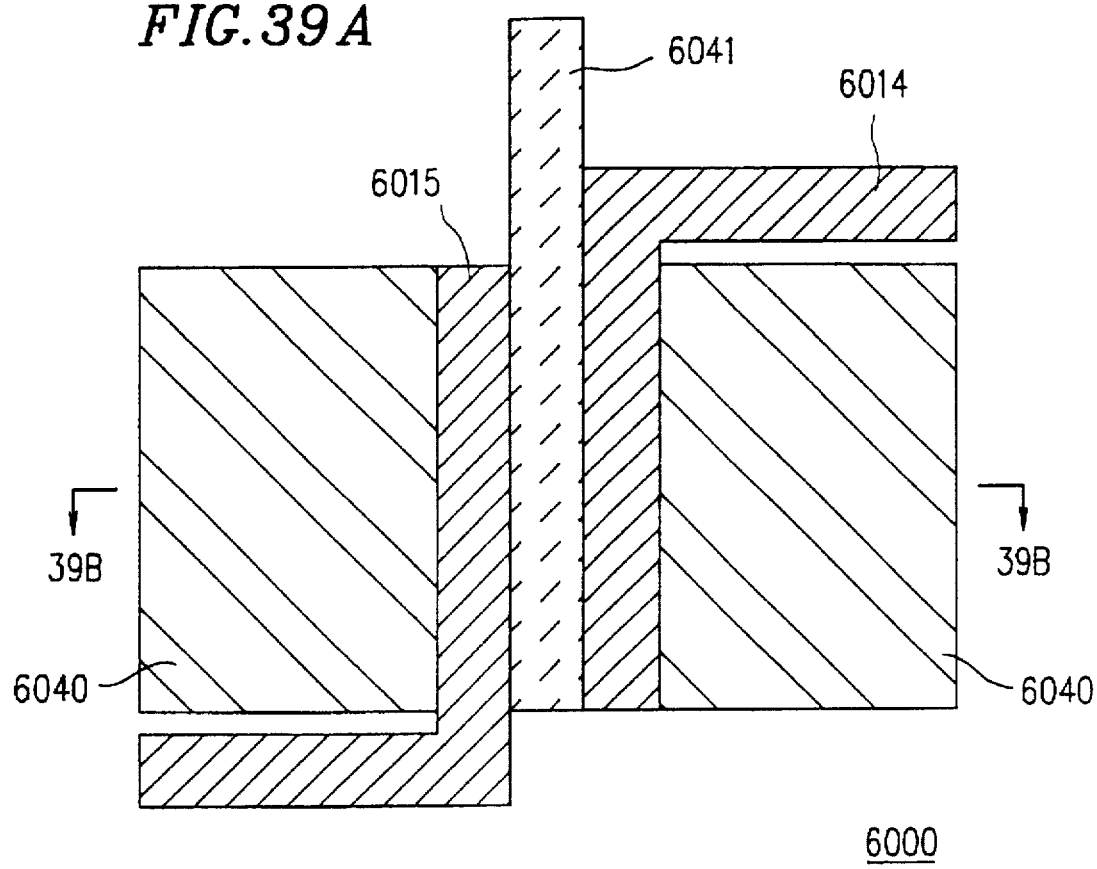
FIG. 39A is a top plan view of a resonance tunneling transistor in a twenty-third example according to the present invention.
Figure 39B:
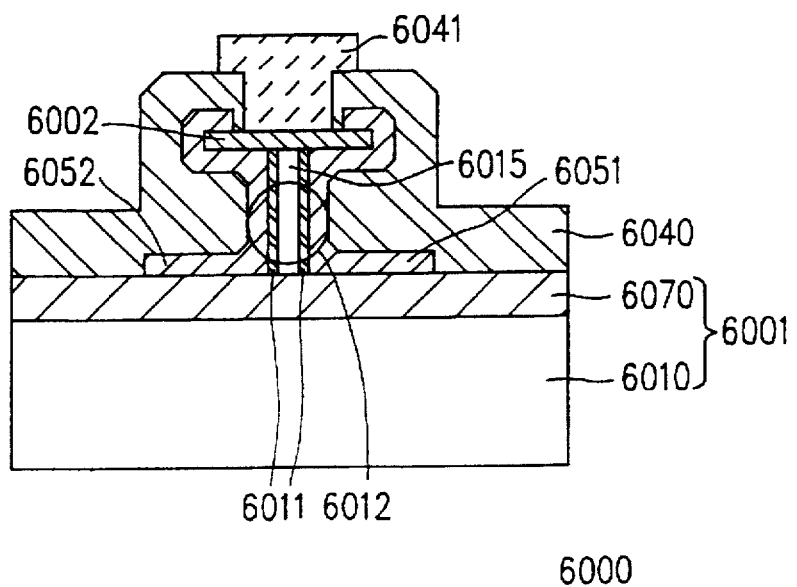
FIG. 39B is a cross sectional view taken along line 39B–39B in FIG. 39A.

With reference to FIGS. 39A, 39B and 40A through 40E, a resonance tunneling transistor in a twenty-third example according to the present invention will be described. FIG. 39A is a top plan view schematically illustrating a resonance tunneling transistor 6000, and FIG. 39B is a cross sectional view taken along line 39B—39B in FIG. 39A. FIGS. 40A through 40E are cross sectional views illustrating the steps of producing the resonance tunneling transistor 6000.

As illustrated in FIGS. 39B, the resonance tunneling transistor 6000 includes a double barrier structure 6012 including a silicon thin plate 6015, which acts as the quantum well, having a rectangular cross section and tunneling oxide films 6011, which act as the tunneling barriers, provided on opposing two side surfaces of the silicon thin plate 6015. The silicon thin plate 6015 is formed by etching a top silicon substrate 6080 (FIG. 40A), which forms a silicon-on-insulator substrate (hereinafter, referred to as the "SOI" substrate) 6001 together with a buried oxide film 6070 and a bottom silicon layer 6010. The SOI substrate 6001 is of an n-type and has a surface orientation of (110).

As shown in FIG. 39B, the silicon thin plate 6015 is provided on at least a part of the buried oxide film 6070. The buried oxide film 6070 is provided on the bottom silicon layer 6010. The silicon thin plate 6015 has a rectangular cross section as mentioned above and located parallel or perpendicular to the <112> crystal orientation of the SOI substrate 6001. The side walls of the silicon thin plate 6015 both have a surface orientation of (111). The side walls are parallel to each other, and perpendicular to the buried oxide film 6070 and the bottom silicon layer 6010. The width of the silicon thin plate 6015, namely, the distance between the side walls (opposing (111) planes) is 100 nm or less, preferably 20 nm, which is sufficiently small to generate a resonance tunneling effect. The height of the silicon thin plate 6015 is preferably approximately 300 nm.

The silicon thin plate 6015 provided with the tunneling oxide films 6011, having a thickness of 2 nm to 4 nm, preferably 3 nm, is sandwiched between a pair of electrodes 6051 and 6052 formed of polysilicon including an n-type impurity diffused therein. An etching protection film 6002 is provided on the silicon thin plate 6015. On the etching protection film 6002 provided is a third electrode 6041 which is formed of polysilicon including an n-type impurity diffused therein.

With reference to FIGS. 40A through 40E, a production method of the resonance tunneling transistor 6000 in this example will be described.

Figure 40A:
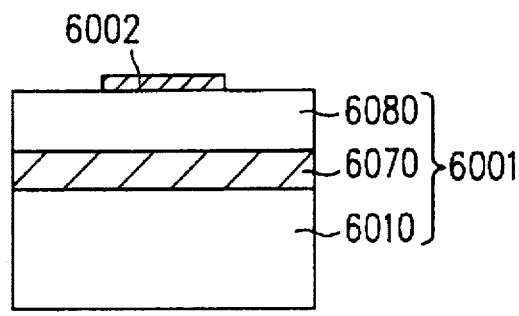
FIGS. 40A through 40E are cross sectional views illustrating the steps of producing the resonance tunneling transistor in accordance with the twenty-third example.

As shown in FIG. 40A, the SOI substrate 6001 having a surface orientation of (001) and including the top silicon layer 6080, the buried oxide film 6070 and the bottom silicon layer 6010 is prepared. On the SOI substrate 6001, the etching protection film 6002 is formed as a silicon oxide film of a thickness of, for example, about 100 nm, by pyrogenic oxidation. The etching protection film 6002 is then patterned so as to form a rectangular portion, with a width of about 800 nm and a length of about 10 μm, which is parallel or perpendicular to the <110> crystal orientation of the SOI substrate 6001, as shown in FIG. 40A.

Figure 40D:
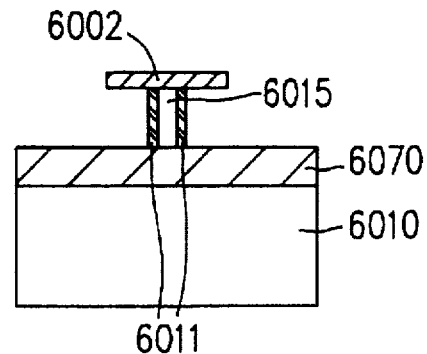
Figure 40B:
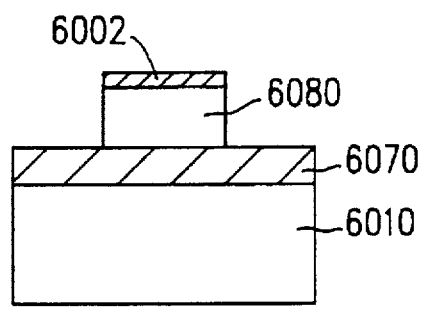
Figure 40E:
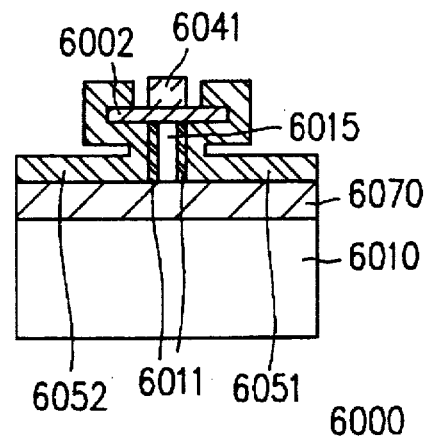

Then, as shown in FIG. 40B, the surface of the SOI substrate 6001 exposed on both sides of the patterned etching protection film 6002, specifically, the top silicon layer 6080 is etched away to reach the buried oxide layer 6070.

Figure 40C:
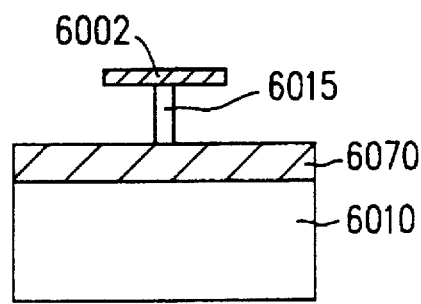

Further, crystalline anisotropic etching is conducted using the patterned etching protection film 6002 as a mask. By controlling an etching time period, the exposed portion of the remaining top silicon layer 6080 of the SOI substrate 6001 is further etched away. Accordingly, the silicon thin plate 6015 having a rectangular cross section with the side walls of the (111) plane as illustrated in FIG. 40C is formed with thickness of about 10 nm.

Next, thermal oxidation is performed to form a pair of oxide films 6011 functioning as the tunneling oxide films, each having a thickness of about 2 nm, on the side walls of the silicon thin plate 6015, as shown in FIG. 40D.

Then, a polysilicon layer is deposited over the entire surface of the SOI substrate 6001 including the silicon thin plate 6015 with a thickness of, for example, about 330 nm. The polysilicon layer is then doped with phosphorus at a concentration of as high as about $1\times10^{18}$ cm$^{-3}$ by processes such as diffusion or ion-implantation. The polysilicon layer is then patterned using a lithography process to form the first and the second electrodes 6051 and 6052 which sandwich the silicon thin plate 6015 and the tunneling oxide films 6011, and further the third electrode 6041 located on the etching protection film 6002 over the silicon thin plate 6015. Thickness of the third electrode 6041 is, for example, set at about 30 nm.

Functions of the resonance tunneling transistor 6000 having the above-described configuration will be further described.

Since the width of the silicon thin plate 6015 is as small as 100 nm or less, the energy levels in the silicon thin plate 6015 are discrete by a quantum effect. The electrodes 6051 and 6052 are supplied with a voltage while changing the level of the voltage. Only when the Fermi level of the electrons in the electrode having a higher level of energy equals the discrete quantization level in the silicon thin plate 6015, the electrons pass through the tunneling oxide films 6011 by a resonance tunneling effect. Therefore, a curve representing the V-I characteristic of the resonance tunneling transistor 6000 has a part which shows the negative resistance characteristic, which is determined by the current vs. voltage relationship. By applying voltage of an appropriate level to the third electrode 6041, current flowing through the silicon thin plate 6015 is concentrated in the upper portion thereof, resulting in enhanced effect of the resonance tunneling effect. Further, by applying voltage of an appropriate level to the third electrode 6041 to control potential in the silicon thin plate 6015, the discrete energy level is controlled. Thus, current amplification is realized in which the application of a very small voltage to the third electrode 6041 can control a passing current. Generally, functions of a resonance tunneling transistor can be utilized better when the negative resistance is larger. In order to increase the negative resistance, the range of voltages for generating a resonance tunneling effect should be narrowed by enhancing, for example, the crystallinity of the substrate, the smoothness of the interface between the silicon thin plate and the tunneling oxide film, and the height of the potential barrier.

In the resonance tunneling transistor 6000 in this example, the crystallinity of the silicon thin plate 6015 is as high as that of the bottom silicon layer 6010 of the SOI substrate 6001. The height of the potential barrier is high because of the high quality tunneling oxide films 6011. The interface between the silicon thin plate 6015 and each tunneling oxide film 6011 is formed of a (111) plane which is smooth in the atomic order. Furthermore, by applying voltage of an appropriate level to the third electrode 6041, the passing current is concentrated in the upper portion of the silicon thin plate 6015. For these reasons, a resonance tunneling effect is generated by a narrow range of voltages in the silicon thin plate 6015, and thus a satisfactory P/V ratio is obtained. Further, since the SOI substrate 6001 is used, an area of the silicon thin plate 6015 which is not covered with the tunneling oxide films 6011 is covered with a thick oxide film (i.e., the buried oxide layer 6070). As a result, the current leakage through the SOI substrate 6001 is significantly reduced. Moreover, since the resonance tunneling transistor 6000 is formed of silicon materials which are suitable for mass production and are inexpensive, the production cost is low and the production efficiency is high.

The silicon thin plate 6015 is located parallel or perpendicular to the <112> crystal orientation of the SOI substrate 6001 having a surface orientation of (110). Because of such relationship of the orientations, the silicon thin plate 6015 is provided perpendicular to the SOI substrate 6001. The silicon thin plate 6015 provided in such a direction is strong against an external force, and also supports the etching protection film 6002 strongly.

In addition, the third electrode 6041 over the double barrier structure is provided over the silicon thin plate 6015 only with the etching protection film 6002 interposed therebetween, but without the insulating film.

When the third electrode is formed over the double barrier structure with the insulating film interposed therebetween, only a small portion of the electric line of force reach the double barrier structure from the third electrode. Thus, sufficient control of the potential in the double barrier structure may not be conducted by controlling the applied voltage to the third electrode. On the contrary, in the resonance tunneling transistor 6000 of this example, sufficient control of potential in the double barrier structure is realized even with an application of a small voltage to the third electrode, such as about 1.0 V, since the third electrode is provided closely to the double barrier structure.

By controlling the applied voltage to the third electrode, an inverted layer is formed at a lower portion of the etching protection film. According to this aspect, electrons are confined in a vertical direction in addition to the lateral confinement realized by the double barrier structure, resulting in the three-dimensional confinement. As a result, a sharper characteristic of the negative resistance is obtained.

The etching protection film 6002 may be formed of a nitride film or a chrome film instead of a thermal oxide film. The etchant for crystalline anisotropic etching may be a mixture liquid of hydrazine, isopropyl alcohol and pure water or an aqueous solution of potassium hydroxide. The tunneling oxide films 6011 may be formed of a nitride oxide film, a nitride film, a SiC film, or a SiGe film.

A p-type substrate may be used for the SOI substrate 6001, in which case, the electrodes 6051, 6052 and 6041 are formed of polysilicon including a p-type impurity diffused therein.

In the fourteenth through twentieth examples, the (001) silicon substrate having a surface orientation of (001) includes the silicon thin layer provided parallel or perpendicular to the <110> crystal orientation of the (001) silicon substrate. Because of such relationship of orientations, the silicon thin layer is formed to be slanted relative to the surface of the (001) silicon substrate as a result of the crystalline anisotropic etching. Alternatively, in the previous examples, by using a silicon substrate having a surface orientation of (110) and forming the silicon thin layer parallel or perpendicular to the <112> crystal orientation of such a silicon substrate, the first and the second grooves can have a rectangular cross section and the silicon thin layer can be provided perpendicular to the silicon substrate. In such a case, since the etching rate relative to the (110) plane is very high, it is desirable to provide an etching stop layer at an appropriate depth of the silicon substrate so that the first and the second grooves have a desirable depth in order to facilitate the production of the resonance tunneling diode.

Example 24

Figure 41:
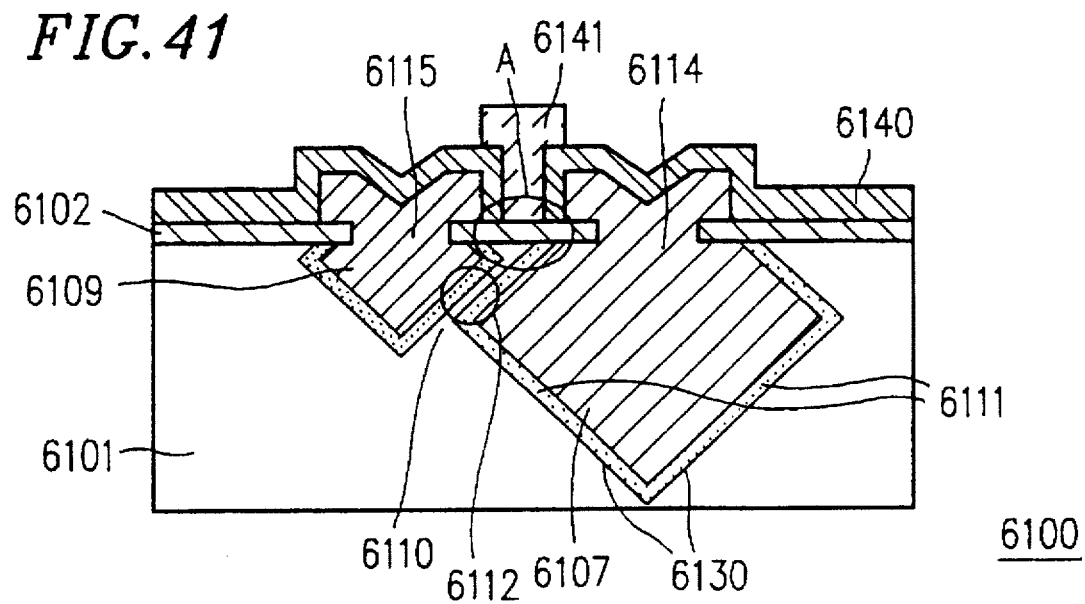
FIG. 41 is a cross sectional view of a resonance tunneling transistor in a twenty-fourth example according to the present invention.

With reference to FIGS. 41 and 42A through 42E, a resonance tunneling transistor in a twenty-fourth example according to the present invention will be described. FIG. 41 is a cross sectional view of the resonance tunneling transistor 6100 of this example. FIGS. 42A through 42E are cross sectional views illustrating the steps of producing a resonance tunneling transistor 6100 in accordance with this example. The resonance tunneling transistor 6100 has basically the same configuration with that of the resonance tunneling transistor 5010 in accordance with the fourteenth example. Elements identical with those in the fourteenth example bear the similar reference numerals and the explanations thereof will be omitted.

The main difference between the resonance tunneling transistor 6100 and the resonance tunneling transistor 5010 is that a third electrode is provided closely to the double barrier structure with only the etching protection film interposed therebetween. This is realized by removing the insulating film in a portion circled as "A" in FIG. 41, prior to the formation of the third electrode.

When the third electrode is formed over the double barrier structure with the insulating film interposed therebetween, only a small portion of the electric line of force reaches the double barrier structure from the third electrode. Thus, sufficient control of the potential in the double barrier structure may not be conducted by controlling the applied voltage to the third electrode. On the contrary, in the resonance tunneling transistor 6100 of this example, sufficient control of potential in the double barrier structure is realized even with an application of a small voltage to the third electrode, such as about 1.0 V, since the third electrode is provided closely to the double barrier structure.

The etching protection film between the third electrode 6141 and the double barrier structure 6112 typically has a width of about 0.8 μm, while the third electrode 6141 typically has a width of about 0.4 μm.

With reference to FIGS. 42A through 42F, a production method of the resonance tunneling transistor 6100 in this example will be described.

Figure 42A:
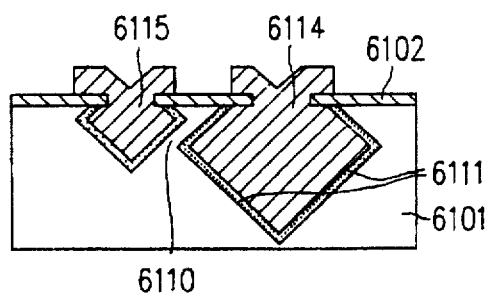
FIGS. 42A through 42E are cross sectional views illustrating the steps of producing the resonance tunneling transistor in accordance with the twenty-fourth example.

According to the previously explained steps, as shown in FIG. 42A, the double barrier structure 6112 including the silicon oxide film 6111 (acting as the tunneling barrier), the silicon thin plate 6110 (acting as the quantum well) and the silicon oxide film 6111 (acting as the tunneling barrier) is provided. Then, the polysilicon film is deposited and then doped with impurities at a high concentration. Then, the polysilicon film is patterned by photolithography so as to form the first and the second electrodes 6114 and 6115, as shown in FIG. 42A.

Figure 42D:
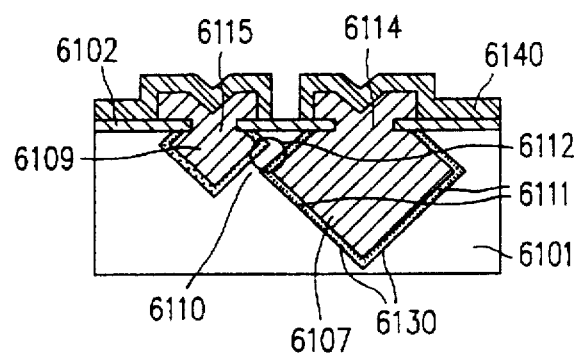
Figure 42B:
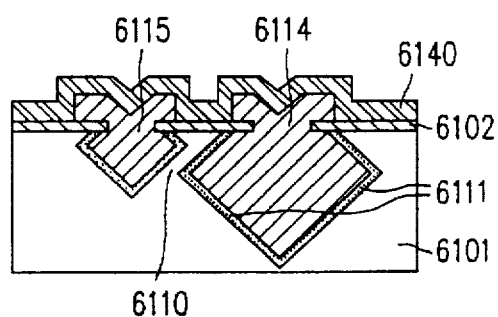

Then, as shown in FIG. 42B, an insulating film 6140 is deposited so as to cover the first and the second electrodes 6114 and 6115 to a thickness of, for example, about 200 nm.

Figure 42E:
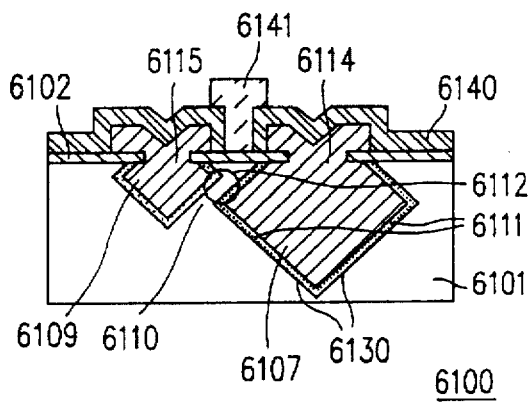
Figure 42C:
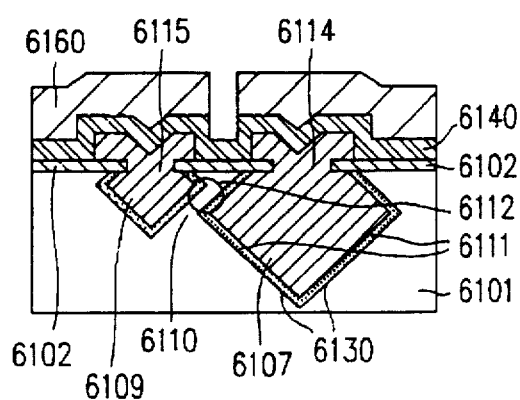

Then, using a photolithography process, a resist mask 6160 having a predetermined pattern is formed on the insulating layer 6140 as shown in FIG. 42C. Specifically, the resist mask 6160 has such a pattern that allows a portion of the insulating film 6140 over the double barrier structure 6112 to be etched away.

Then, by a dry etching process, the insulating layer 6140 over the double barrier structure 6112 is etched away to reach the etching protection film 6102. Specifically, $O_2$ and $CF_4$ are used as an etching gas, and reactive ion etching (RIE) is conducted by using the resist mask 6160 as a mask. Then, the resist mask 6160 is removed to obtain the configuration as shown in FIG. 42D.

Then, the third electrode 6141 as shown in FIG. 42E is formed in accordance with the previously explained steps.

In this manner, the resonance tunneling transistor 6100 in the twenty-fourth example according to the present invention having the double barrier structure 6112 including the silicon oxide film 6111 (acting as the tunneling barrier), the silicon thin plate 6110 (acting as the quantum well) and the silicon oxide film 6111 (acting as the tunneling barrier), and also including three terminals, namely, the first through the third electrodes 6114, 6115 and 6141, is produced.

In each of the above explained examples, the insulating film formed on the substrate surface function as a protection film for the produced quantization functional device, as well as an isolation film for electrically insulating one device from another device formed on the same substrate. By using this isolation function, an integrate circuit including a plurality of the quantization functional devices formed on the same substrate can be obtained.

The resonance tunneling transistor can be fabricated by adding a third electrode to the configuration of the resonance tunneling diodes in the other embodiments previously explained in this application.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A quantization functional device, comprising:

a silicon thin plate having a plurality of side walls each having a surface orientation of (111), a distance between the plurality of side walls being sufficiently thin so as to allow the silicon thin plate to act as a quantum well;

a pair of tunneling barriers respectively provided on surfaces of the side walls of the silicon thin plate;

a first electrode and a second electrode sandwiching the pair of tunneling barriers; and a third electrode provided in the vicinity of the silicon thin plate and configured for applying a voltage to the silicon thin plate.

2. A quantization functional device according to claim 1, further comprising at least one of a fourth electrode and a fifth electrode, wherein the fourth electrode is configured for controlling a carrier concentration at a surface of the first electrode and the fifth electrode is configured for controlling a carrier concentration at a surface of the second electrode.

3. A quantization functional device according to claim 1, wherein the first through third electrodes are made of one of polysilicon and a metal.

4. A quantization functional device according to claim 2, wherein the first through fifth electrodes are made of one of polysilicon and a metal.

5. A quantization functional device according to any one of claims 1 through 4, wherein the silicon thin plate is formed in a silicon substrate which has a surface orientation of one of (001) and (110).

6. A quantization functional device according to any one of claims 1 through 4, wherein the silicon thin plate is formed in a silicon-on-insulator substrate which has a surface orientation of one of (001) and (110).

7. A quantization functional device according to claim 1, wherein the pair of tunneling barriers are formed of a material selected from the group consisting of silicon oxide, silicon nitride, silicon nitride oxide, SiC and SiGe.

8. A quantization functional device according to claim 1, wherein the pair of tunneling barriers have different thicknesses from each other.

9. A quantization functional device according to claim 1, further comprising an impurity layer provided at least at a lowermost position of the silicon thin plate, the impurity layer having a different conductivity type from the conductivity type of the silicon thin plate.

10. A quantization functional device according to claim 1, wherein at least the silicon thin plate includes an impurity doped therein, the impurity having a different conductivity type from the conductivity type of a substrate in which the silicon thin plate is formed.

11. A quantization functional device according to claim 1, wherein the third electrode is provided over the thin silicon plate with an etching protection film interposed therebetween.

12. A quantization functional device according to claim 1, wherein the third electrode is provided over the thin silicon plate with an etching protection film and an insulating film interposed therebetween.

13. An integrated circuit, comprising:
at least one quantization functional device according to claim 1 formed on a substrate; and
an insulation layer insulating the at least one quantization functional device from at least one other device to be formed in the substrate.

14. A quantization functional device according to claim 2, wherein the fourth electrode is provided over the first electrode with an insulating film interposed therebetween.

15. A quantization functional device according to claim 2, wherein the fifth electrode is provided over the second electrode with an insulating film interposed therebetween.

16. A quantization functional device according to claim 1, wherein the third electrode is disposed above said pair of tunneling barriers with an insulating layer and an etching protection layer interposed therebetween.

17. A quantization functional device according to claim 2, wherein said fourth and fifth electrodes control a carrier concentration below said third electrode.

18. A quantization functional device according to claim 2, wherein said fourth and fifth electrodes control a carrier introduction from said third electrode into said pair of tunneling barriers.

* * * * *

UNITED STATES PATENT AND TRADEMARK OFFICE
CERTIFICATE OF CORRECTION

PATENT NO. : 5,739,544
DATED : April 14, 1998
INVENTOR(S) : Yuki et al.

It is certified that error appears in the above-identified patent and that said Letters Patent is hereby corrected as shown below:

Column 6, line 50, "FIG. 11*b*" should read --FIG. 11B--.

Column 18, line 13, "film. 102" should read --film 102--.

Column 20, line 18, "views: of" should read --views of--.

Column 24, line 9, "-tunneling" should read --tunneling--.

Column 26, line 67, "crystal-line" should read --crystalline--.

Column 28, line 14, "base.," should read --base.--.

Column 31, line 6, "$0I" should read --SOI--.

Column 31, line 43, "electrodes: 714" should read --electrodes 714--.

Column 32, line 10, "the=first" should read --the first--.

Column 35, line 53, "crystal-line" should read --crystalline--.

UNITED STATES PATENT AND TRADE MARK OFFICE
CERTIFICATE OF CORRECTION

PATENT NO. : 5,739,544
DATED : April 14, 1998
INVENTOR(S) : Yuki et al.

It is certified that error appears in the above-identified patent and that said Letters Patent is hereby corrected as shown below:

Column 38, line 25, "crystal-line" should read --crystalline--.

Column 39, line 57, "opening ! 5303" should read --opening 5303--.

Column 52, claim 1, line 42 "a third electrode pro-" should begin a new line at the margin.

Column 52, lines 49 and 51, the word "carder" should be --carrier--.

Signed and Sealed this

Twenty-second Day of December, 1998

Attest:

BRUCE LEHMAN

*Attesting Officer*    Commissioner of Patents and Trademarks